(12) United States Patent
Tani et al.

(10) Patent No.: US 12,075,692 B2
(45) Date of Patent: Aug. 27, 2024

(54) IRIDIUM COMPLEX-CONTAINING COMPOSITION, ORGANIC LIGHT EMITTING DEVICE HAVING THE SAME, DISPLAY APPARATUS, IMAGING APPARATUS, ELECTRONIC EQUIPMENT, LIGHTING APPARATUS, AND MOVING BODY

(71) Applicant: CANON KABUSHIKI KAISHA, Tokyo (JP)

(72) Inventors: Yutaka Tani, Kanagawa (JP); Katsuyuki Hotta, Kanagawa (JP); Kentaro Ito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 585 days.

(21) Appl. No.: 17/224,565

(22) Filed: Apr. 7, 2021

(65) Prior Publication Data

US 2021/0359225 A1 Nov. 18, 2021

(30) Foreign Application Priority Data

May 15, 2020 (JP) .................... 2020-085564

(51) Int. Cl.
*H10K 85/30* (2023.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC .................................................. H10K 85/342
See application file for complete search history.

(56) References Cited

U.S. PATENT DOCUMENTS

2002/0034656 A1    3/2002  Thompson
2003/0222558 A1*  12/2003  Cok .................... H01R 12/7076
                                                                313/238
(Continued)

FOREIGN PATENT DOCUMENTS

CN    101147272 A    3/2008
CN    101147272 A    3/2008
(Continued)

OTHER PUBLICATIONS

Meng, H; Herron, N, Organic Light-Emitting Materials and Devices, Chapter 3 Organic small molecule materials for organic light-emitting diodes, 2006, p. 295-395. (Year: 2006).*

(Continued)

*Primary Examiner* — Sean M DeGuire
(74) *Attorney, Agent, or Firm* — Canon U.S.A., Inc. I.P. Division

(57) ABSTRACT

A composition that includes: a homo-N-trans (HNT) iridium complex having an iridium atom, and a first ligand, a second ligand, and a third ligand that are bonded to the iridium atom, the second ligand having the same structure as the first ligand, the third ligand having a different structure from the first and second ligands; and an isomer of the iridium complex, the isomer having an iridium atom, a fourth ligand, a fifth ligand, and the third ligand, the fourth ligand being a ligand represented by the same rational formula as that of the first ligand, and the fifth ligand being a ligand represented by the same rational formula as that of the second ligand. The composition ratio of the isomer relative to a total of the iridium complex and the isomer is 1.5% or more.

20 Claims, 5 Drawing Sheets

(51) Int. Cl.
*C09K 11/06* (2006.01)
*H10K 50/11* (2023.01)
*H10K 101/10* (2023.01)

(52) U.S. Cl.
CPC .............. *C09K 2211/1007* (2013.01); *C09K 2211/1011* (2013.01); *C09K 2211/1029* (2013.01); *C09K 2211/185* (2013.01); *H10K 50/11* (2023.02); *H10K 2101/10* (2023.02)

(56) References Cited

U.S. PATENT DOCUMENTS

| | | | | |
|---|---|---|---|---|
| 2006/0002110 | A1* | 1/2006 | Dowling | F21V 23/005 |
| | | | | 362/249.05 |
| 2008/0203028 | A1* | 8/2008 | Boerner | H10K 85/342 |
| | | | | 546/4 |
| 2012/0309971 | A1 | 12/2012 | Cai | |
| 2013/0203997 | A1 | 8/2013 | Konno | |
| 2015/0295188 | A1* | 10/2015 | Kosuge | C09K 11/06 |
| | | | | 345/173 |
| 2016/0254461 | A1 | 9/2016 | Inoue | |
| 2017/0092882 | A1 | 3/2017 | Kamatani | |
| 2018/0005065 | A1* | 1/2018 | Yoshimura | G06F 16/00 |
| 2018/0066001 | A1 | 3/2018 | Konno | |
| 2020/0235141 | A1* | 7/2020 | Natori | G03B 17/12 |

FOREIGN PATENT DOCUMENTS

| | | |
|---|---|---|
| CN | 102648203 A | 8/2012 |
| CN | 104871334 A | 8/2015 |
| CN | 108424424 A | 8/2018 |
| CN | 113517408 A | 10/2021 |
| EP | 3892705 A1 | 10/2021 |
| JP | 2006120905 A | 5/2006 |
| JP | 2006351837 A | 12/2006 |
| JP | 2008531495 A | 8/2008 |
| JP | 2009114137 A | 5/2009 |
| JP | 2014127687 A | 7/2014 |
| JP | 2014196258 A | 10/2014 |
| WO | 2006/090301 A1 | 8/2006 |
| WO | 2009/060995 A1 | 5/2009 |
| WO | 2014/104386 A1 | 7/2014 |
| WO | 2014/104387 A1 | 7/2014 |
| WO | 2014/104395 A1 | 7/2014 |
| WO | 2014/112657 A1 | 7/2014 |
| WO | 2014/112658 A1 | 7/2014 |
| WO | 2014/115528 A1 | 7/2014 |

OTHER PUBLICATIONS

Liao Zhangjin, et a;. "Molecular Iridium (III) Complexes and Their Corresponding Electrophosphorescent Devices;" Progress in Chemistry; vol. 23, No. 8, Aug. 2011; pp. 1627-1643.

* cited by examiner

IRIDIUM COMPLEX-CONTAINING COMPOSITION, ORGANIC LIGHT EMITTING DEVICE HAVING THE SAME, DISPLAY APPARATUS, IMAGING APPARATUS, ELECTRONIC EQUIPMENT, LIGHTING APPARATUS, AND MOVING BODY

BACKGROUND OF THE INVENTION

Field of the Invention

The present disclosure relates to a composition that contains an iridium complex with an increased amount of isomers, an organic light emitting device having the same, a display apparatus, an imaging apparatus, electronic equipment, a lighting apparatus, and a moving body.

Description of the Related Art

An organic light emitting device (may be referred to as an organic electroluminescence (EL) device or an organic light emitting device) is an electronic device that has a first electrode, a second electrode, and an organic compound layer disposed between these electrodes. Injecting electrons and holes from this pair of electrodes generates excitons of a light emitting organic compound in the organic compound layer, and the organic light emitting device emits light as the excitons return to the ground state.

Remarkable progress in, for example, low drive voltage, a wide variety of emission wavelengths, high-speed response, and thickness and weight reduction of light emitting devices, has been recently made in organic light emitting devices.

Improving the performance of light emitting devices require development of light emitting organic compounds having higher performance, and aggressive developments have been made in this field. Light-emitting organic compounds are categorized into fluorescent light emitting materials and phosphorescent light emitting materials, and, theoretically, phosphorescent light emitting materials are known to exhibit higher light emission efficiency than fluorescent light emitting materials.

Japanese Patent Laid-Open No. 2009-114137 (hereinafter, PTL 1) describes a compound A below as a phosphorescent light emitting material having high light emission efficiency.

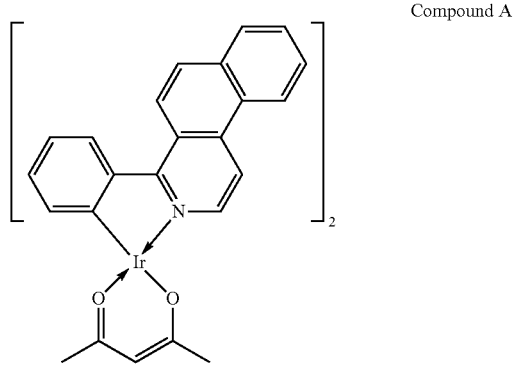

Compound A

PTL 1 describes the compound A and a synthetic method therefor. Although an organic light emitting device having the compound A is described as a device having high efficiency and long lifetime, the organic light emitting device containing the compound A still has some room for improvement regarding the light emission efficiency. When the compound A is synthesized by the synthetic method described in PTL 1, the compound A contains about 1.4% of an isomer of the compound A. However, PTL 1 does not describe that the performance of the composition and the performance of the organic light emitting device are improved by focusing on this isomer.

SUMMARY OF THE INVENTION

The present disclosure addresses the aforementioned issues, and provides a composition having a high light emission efficiency and containing an iridium complex and an isomer thereof.

An aspect of the present disclosure provides a composition that includes: a homo-N-trans (HNT) iridium complex having an iridium atom, and a first ligand, a second ligand, and a third ligand that are bonded to the iridium atom, the second ligand having the same structure as the first ligand, the third ligand having a different structure from the first and second ligands; and an isomer of the iridium complex, the isomer having an iridium atom, a fourth ligand, a fifth ligand, and the third ligand, the fourth ligand being a ligand represented by the same rational formula as that of the first ligand, and the fifth ligand being a ligand represented by the same rational formula as that of the second ligand, in which a composition ratio of the isomer relative to a total of the iridium complex and the isomer is 1.5% or more.

Further features of the present disclosure will become apparent from the following description of exemplary embodiments with reference to the attached drawings.

DESCRIPTION OF THE EMBODIMENTS

Figure 1A:
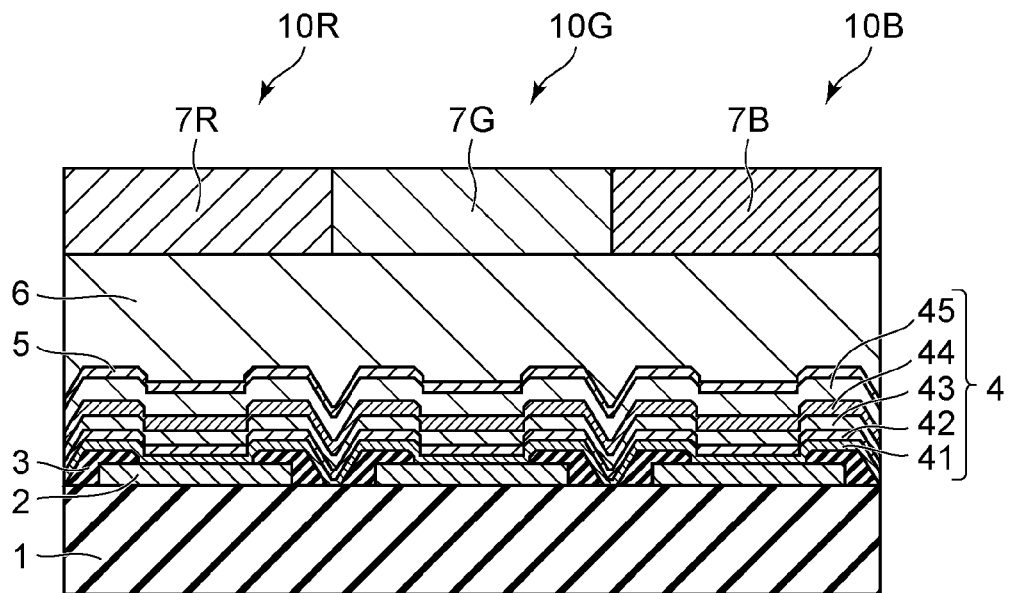
FIG. 1A is a schematic cross sectional view of one example of a pixel of a display apparatus according to one embodiment of the present disclosure.

Embodiments of the present disclosure will now be described. The present disclosure is not limited by the description below, and a person skilled in the art could easily appreciate that various modifications on the forms and details are possible without departing from the gist and the scope of the present disclosure. In other words, the interpretation of the present disclosure is in no way limited by the following disclosure.

A composition according to one embodiment of the present disclosure contains an iridium complex and an isomer of this iridium complex, and the composition ratio of the isomer relative to the total of the iridium complex and the isomer is 1.5% or more. The composition ratio of the isomer is more preferably 2.0% or more. The composition ratio of the isomer is yet more preferably 2.9% or more.

The iridium complex has an iridium atom, and a first ligand, a second ligand, and a third ligand that are bonded to the iridium atom. In this iridium complex, the second ligand has the same structure as the first ligand, and the third ligand has a different structure from the first ligand and the second ligand.

The isomer of the iridium complex has an iridium atom, a fourth ligand, a fifth ligand, and the third ligand. In this isomer of the iridium complex, the fourth ligand is a ligand represented by the same rational formula as that of the first ligand, and the fifth ligand is a ligand represented by the same rational formula as that of the second ligand. The iridium complex according to one embodiment of the present disclosure has an iridium atom, a first ligand, a second ligand, and a third ligand. The first to third ligands are bonded to the iridium atom. The bond may be referred to as a covalent bond or a coordinate bond. The first and second ligands have the same structure, and the third ligand has a different structure from the first and second ligands.

The isomer of the iridium complex according to one embodiment of the present disclosure is a complex that has a fourth ligand, a fifth ligand, and a third ligand. The fourth ligand is represented by the same rational formula as that of the first ligand, and the fifth ligand is represented by the same rational formula as that of the second ligand. Since the first and fourth ligands are represented by the same rational formula and the second and fifth ligands are represented by the same rational formula, there may be cases where the only differences are the substitution position of substituents and the steric configuration with respect to Ir. Although properties of the ligands are not notably different, the performance of the iridium complex as a whole may be different in some cases. In other words, it has been found that characterizing the isomer of the iridium complex as an additive that improves the light emission efficiency and increasing the amount of the isomer can improve the light emission efficiency of the organic light emitting device. When the composition according to one embodiment of the present disclosure is formed into an organic light emitting device, the light emission efficiency is improved due to the increased isomer ratio in the composition.

Composition Ratio

In this description, the composition ratio of the isomer is the ratio of the isomer relative to the total of the iridium complex and the isomer of this iridium complex. The composition ratio can be measured by, for example, high performance liquid chromatography (HPLC). More specifically, a spectrum with a horizontal axis indicating an absorption wavelength and a vertical axis indicating an absorbance is acquired. The excitation wavelength is not particularly limited as long as the iridium complex and the isomer thereof can absorb that wavelength, and may be 254 nm, for example. The compound content can be estimated from the area defined by the spectrum and the horizontal axis. Then the composition ratio can be calculated from the area ratio between the iridium complex and the isomer thereof. The measurement by HPLC is one example, and the method for measuring the composition ratio of the composition according to the present disclosure is not limited to HPLC.

Isomer

The isomer as described in this description will now be described. A structural isomer and a stereoisomer are known to exist as an isomer.

1. Structural Isomer

The iridium complex has, for example, an iridium atom, a first ligand having a substituent, a second ligand having the same structure as the first ligand, and a third ligand. The definition of the "same structure" is that the molecular formula and the rational formula are the same, and the same substituent occupies the same substitution position. A structural isomer has, for example, an iridium atom, a fourth ligand represented by the same rational formula as that of the first ligand, a fifth ligand represented by the same rational formula as that of the second ligand, and the third ligand. In other words, a structural isomer satisfies at least one of (1) and (2) below:

(1) The first ligand has a structure different from the fourth ligand.

(2) The second ligand has a structure different from the fifth ligand.

The first and second ligand may each have a structure having a substituent, and the fourth or fifth ligand may have a structure in which the substitution position of the substituent is different from that in the first or second ligand. The structural isomer may satisfy both (1) and (2).

More specifically, the structural isomer has an iridium atom, a fourth ligand having the same structure as the first ligand, a fifth ligand having a substituent at a position different from that in the second ligand, and the third ligand. Alternatively, the structural isomer has an iridium atom, a fourth ligand having a substituent at a position different from that in the first ligand, a fifth ligand having a substituent at a position different from that in the second ligand, and the third ligand. Here, since the first and fourth ligands are represented by the same rational formula, the ligands do not notably differ in terms of the performance of the ligand itself. However, since the ligands form a structural isomer, the performance of the iridium complex may notably differ. The same applies to the second and fifth ligands.

Examples of the iridium complex and the structural isomer of the iridium complex are those represented by the following structural formulae.

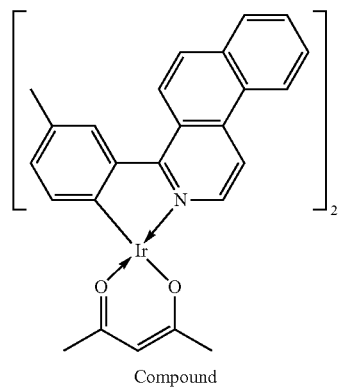

Compound

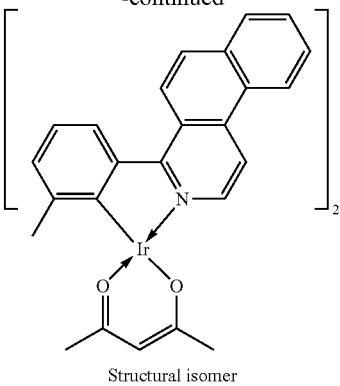

Structural isomer

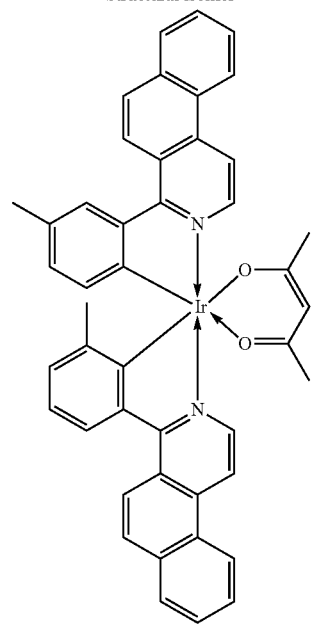

Structural isomer

2. Stereoisomer

An optical isomer and a geometric isomer are known as a stereoisomer. The iridium complex has, for example, an iridium atom, a first ligand, a second ligand having the same structure as the first ligand, and a third ligand different from the first and second ligands. A stereoisomer has an iridium atom, a fourth ligand having the same structure as the first ligand, a fifth ligand having the same structure as the second ligand, and a third ligand. The fourth and fifth ligands are different from the first ligands and the second ligands in steric configurations with respect to the iridium atom. In other words, the stereoisomer satisfies at least one of (3) and (4) below:

(3) The steric configuration of the first ligand with respect to the iridium atom is different from that of the fourth ligand.
(4) The steric configuration of the second ligand with respect to the iridium atom is different from that of the fifth ligand.

The stereoisomer may satisfy both (3) and (4).

Specifically, the iridium complex has an iridium atom, a first ligand, a second ligand, and a third ligand. The stereoisomer has an iridium atom, a fourth ligand, a fifth ligand, and a third ligand. The first, second, fourth, and fifth ligands have the same structure. The first, second, fourth, and fifth ligands may have different steric configurations from one another with respect to iridium. The third ligand has a different structure from the first, second, fourth, and fifth ligands. The stereoisomer has the same structure, but may have notably different performance as an iridium complex.

Examples of the iridium complex and the stereoisomer of the iridium complex are those represented by the following structural formulae. Here, notation of the ligands is simplified. A ligand having carbon atoms and nitrogen atoms may have a ring structure, and a ligand having oxygen atoms may have a structure similar to an acetylacetone structure. These examples of the ligands are not exhaustive, and other structures are not excluded.

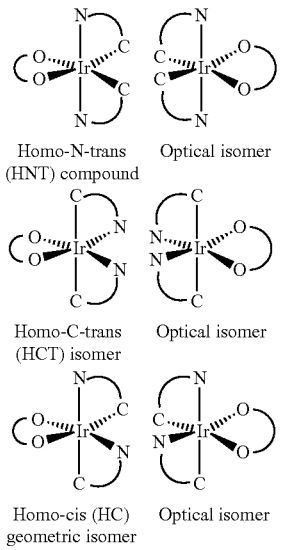

Homo-N-trans (HNT) compound    Optical isomer

Homo-C-trans (HCT) isomer    Optical isomer

Homo-cis (HC) geometric isomer    Optical isomer

In this embodiment, the iridium complex is of a homo-N-trans (HNT) type, and the isomer may be a stereoisomer other than the HNT type.

The inventors have conducted extensive studies and found that the light emission efficiency of the organic light emitting device having the aforementioned composition can be improved by increasing the ratio of these isomers.

Iridium Complex

Next, an iridium complex according to one embodiment of the present disclosure is described. The iridium complex of this embodiment is represented by general formula [1] or [2] below.

General formula [1]

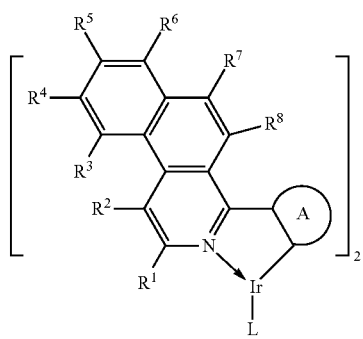

General formula [2]

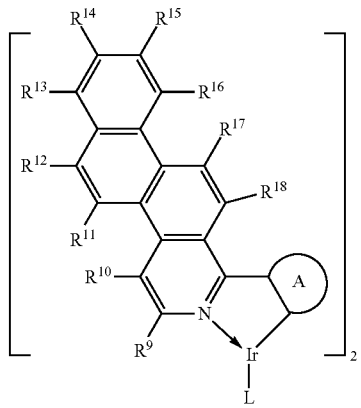

General formula [6]

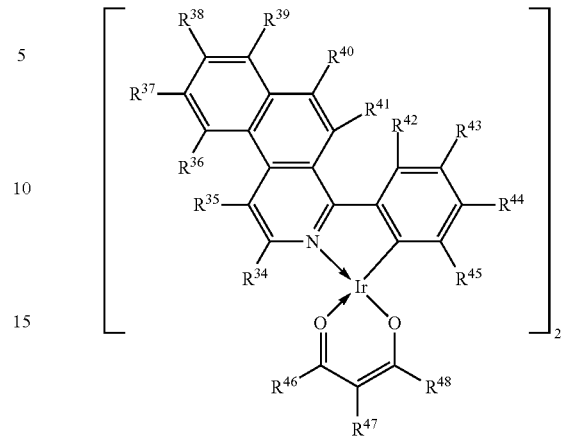

In general formula [1] and general formula [2], $R^1$ to $R^{18}$ are each independently selected from a hydrogen atom, a halogen atom, a substituted or unsubstituted alkyl group, a substituted or unsubstituted alkoxy group, a cyano group, a substituted or unsubstituted aromatic hydrocarbon group, and a substituted or unsubstituted heteroaromatic group.

The ring A represents a ring structure selected from a benzene ring, a naphthalene ring, a fluorene ring, a phenanthrene ring, a 9,9-spirobifluorene ring, a chrysene ring, and a substituted or unsubstituted heteroaromatic group. This ring structure may further have a substituent. L represents a bidentate ligand.

IrL is represented by one of general formulae [3] to [5] below.

General formula [3]

General formula [4]

General formula [5]

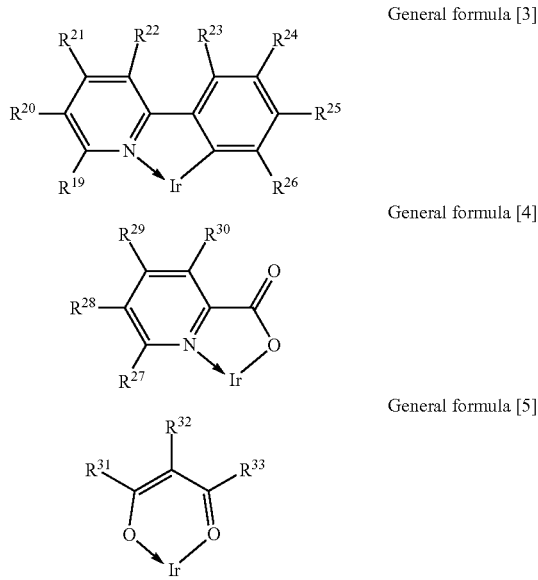

In general formulae [3] to [5], $R^{19}$ to $R^{33}$ are each independently selected from a hydrogen atom, an alkyl group, a substituted or unsubstituted aromatic hydrocarbon group, and a substituted or unsubstituted heteroaromatic group.

The iridium complex of this embodiment can be an iridium complex represented by general formula [6].

In general formula [6], $R^{34}$ to $R^{48}$ are each independently selected from a hydrogen atom and a substituted or unsubstituted alkyl group.

The iridium complex contained in the composition of this embodiment may have $R^{45}$ representing an alkyl group and $R^{43}$ representing a hydrogen atom in general formula [6] described above. The isomer of the iridium complex contained in the composition may have $R^{45}$ representing a hydrogen atom and $R^{43}$ representing an alkyl group in general formula [6]. The alkyl group represented by $R^{43}$ or $R^{45}$ may be a methyl group. In general formula [6], $R^{37}$ may represent a cyano group.

The halogen atom in this embodiment is one of fluorine, chlorine, iodine, and bromine. Among these, fluorine is preferable.

The alkyl group in this embodiment may be a $C_{1-20}$ alkyl group. The alkyl group may have a halogen atom as a substituent. The halogen atom can be fluorine. The alkyl group may be $C_{1-8}$ alkyl group or $C_{1-4}$ alkyl group. When a halogen atom is a substituent, any of the hydrogen atoms in the alkyl group may be substituted, but a trifluoromethyl group may be formed. More specifically, examples of the alkyl group include, but are not limited to, a methyl group, an ethyl group, a normal propyl group, an isopropyl group, a normal butyl group, a tertiary butyl group, a secondary butyl group, an octyl group, a cyclohexyl group, a 1-adamantyl group, and a 2-adamantyl group.

The alkoxy group in this embodiment may be a $C_{1-20}$ alkoxy group. The alkoxy group may be a $C_{1-6}$ alkoxy group. More specifically, examples of the alkoxy group include, but are not limited to, a methoxy group, an ethoxy group, a propoxy group, a 2-ethyl-octyloxy group, and a benzyloxy group.

The aromatic hydrocarbon group in this embodiment may be a $C_{6-18}$ aromatic hydrocarbon group. More specifically, examples of the aromatic hydrocarbon group include, but are not limited to, a phenyl group, a naphthyl group, an indenyl group, a biphenyl group, a terphenyl group, a fluorenyl group, a phenanthryl group, and a triphenylenyl group.

The heteroaromatic group in this embodiment may be a $C_{3-15}$ heteroaromatic group. The heteroaromatic group may have, as hetero atoms, nitrogen atoms, oxygen atoms, sulfur atoms, and any combination of these. More specifically, examples of the heteroaromatic group include, but are not limited to, a pyridyl group, a pyrimidyl group, a pyrazyl group, a triazyl group, a benzofuranyl group, a benzothiophenyl group, a dibenzofuranyl group, a dibenzothiophenyl group, an oxazolyl group, an oxadiazolyl group, a thiazolyl group, a thiadiazolyl group, a carbazolyl group, an acridinyl group, and a phenanthrolyl group.

The aforementioned alkyl group, alkoxy group, aromatic hydrocarbon group, and heteroaromatic group may each have an additional substituent. Examples of the additional substituent include, but are not limited to, $C_{1-4}$ alkyl groups such as a methyl group, an ethyl group, a normal propyl group, an isopropyl group, a normal butyl group, and a tertiary butyl group, aralkyl groups such as a benzyl group, aromatic hydrocarbon groups such as a phenyl group and a biphenyl group, heterocyclic groups such as a pyridyl group and a pyrrolyl group, amino groups such as a dimethylamino group, a diethylamino group, a dibenzylamino group, a diphenylamino group, and a ditolylamino group, alkoxy groups such as a methoxy group, an ethoxy group, and a propoxy group, aryloxy groups such as a phenoxy group, halogen atoms such as fluorine, chlorine, bromine, and iodine, and a cyano group.

Examples of the specific structural formula of the iridium complex of the present disclosure are described below.

Compound (1)

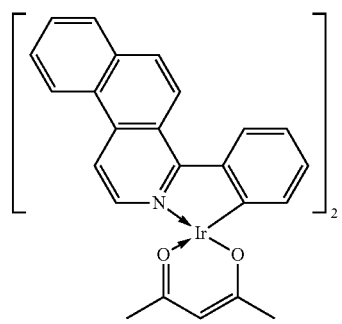

Compound (2)

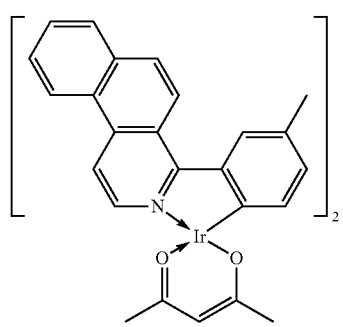

Compound (3)

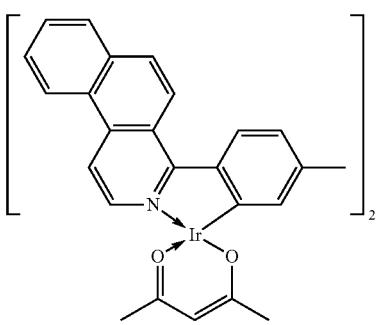

Compound (4)

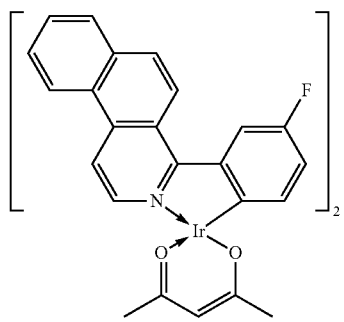

Compound (5)

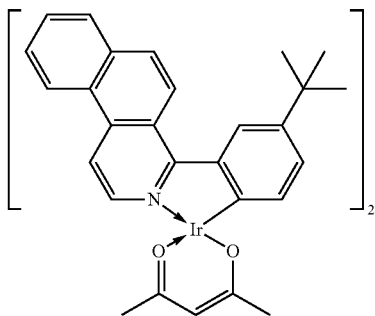

Compound (6)

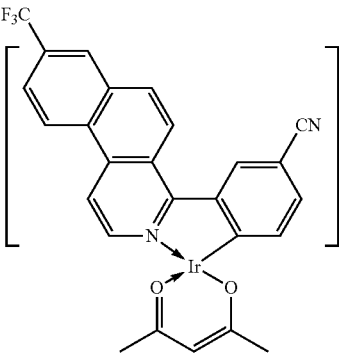

Compound (7)

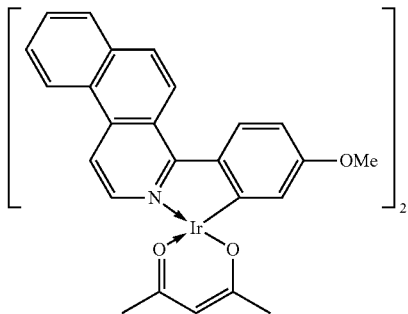

Compound (8)

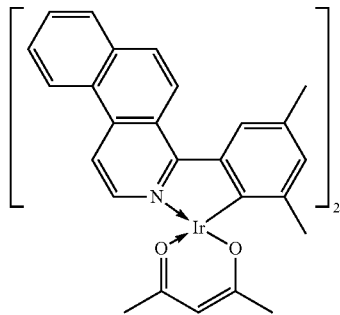

Compound (9)
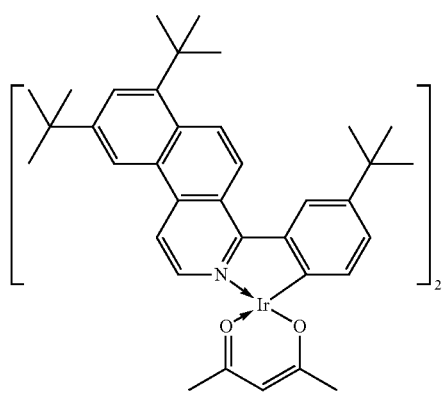
Compound (10)
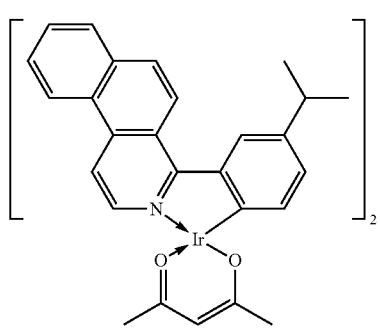
Compound (11)
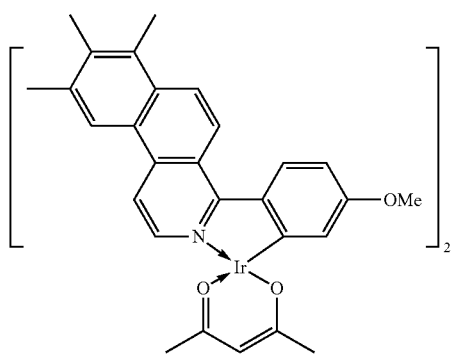
Compound (12)
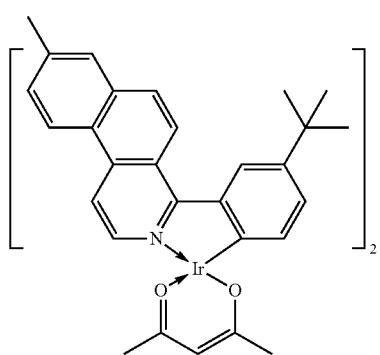
Compound (13)
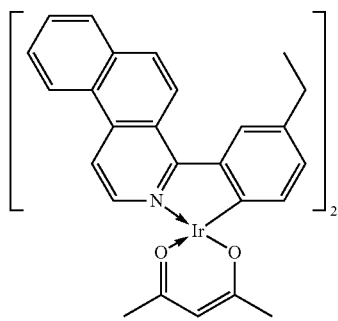
Compound (14)
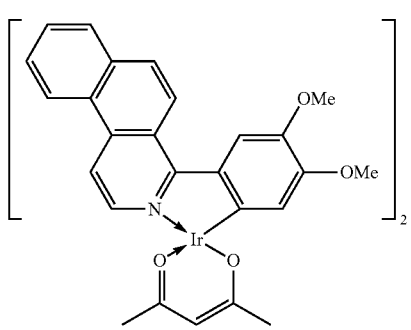
Compound (15)
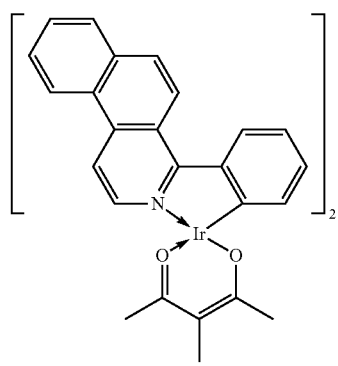
Compound (16)
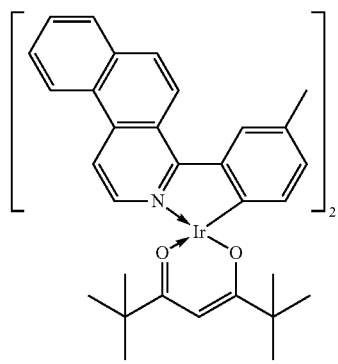

-continued
Compound (17)
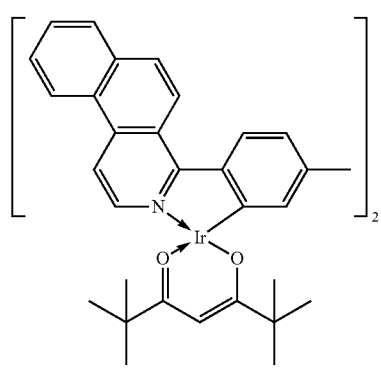
Compound (18)
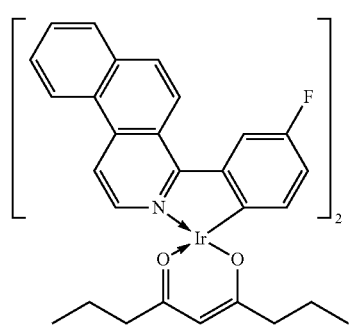
Compound (19)
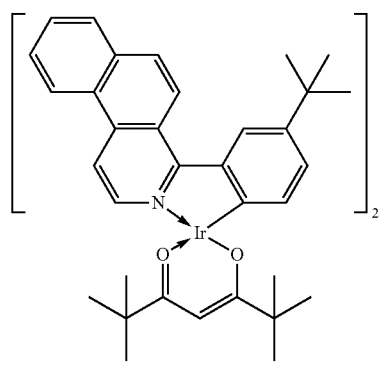
Compound (20)
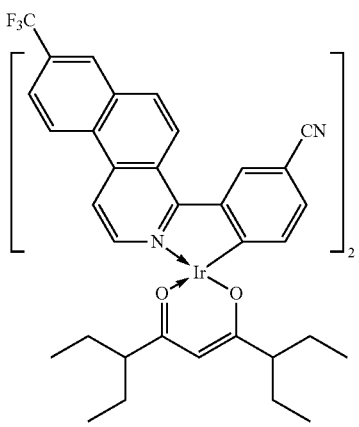
Compound (21)
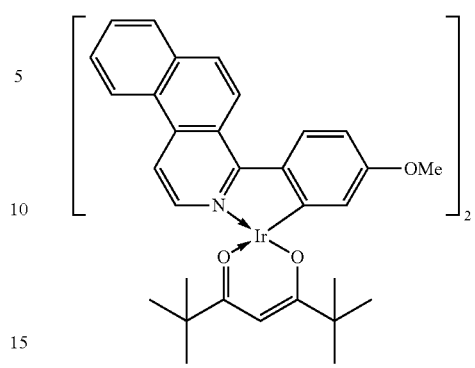
Compound (22)
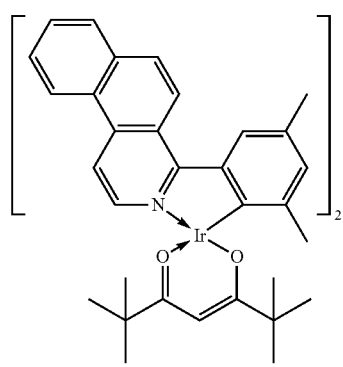
Compound (23)
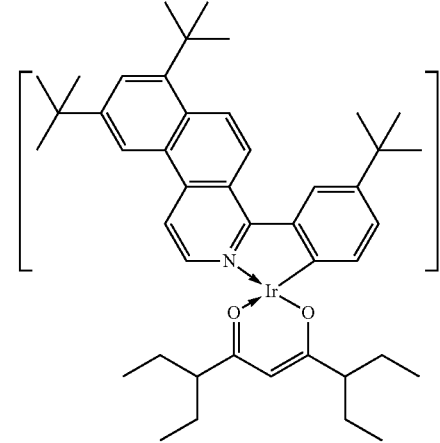
Compound (24)
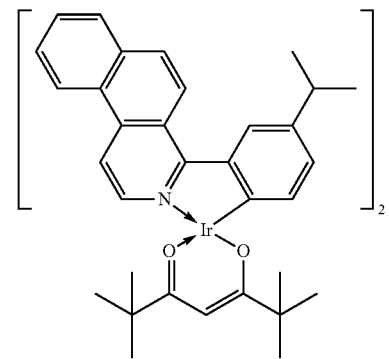

Compound (25)
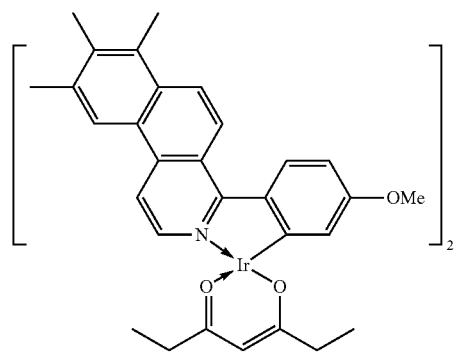
Compound (26)
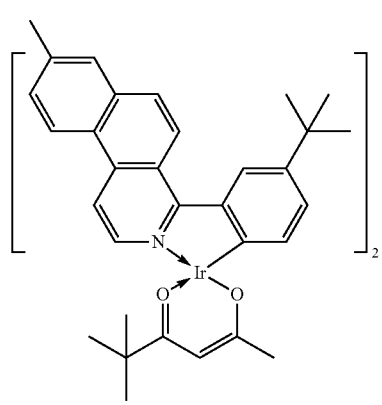
Compound (27)
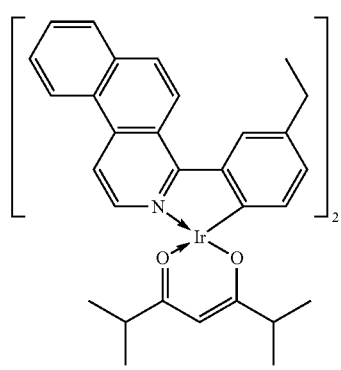
Compound (28)
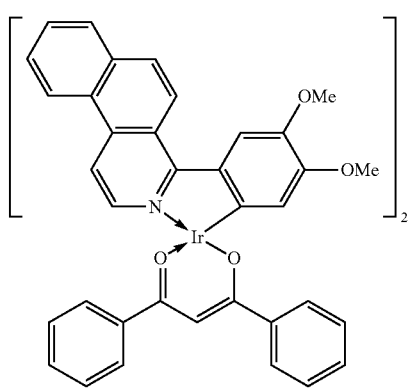
Compound (29)
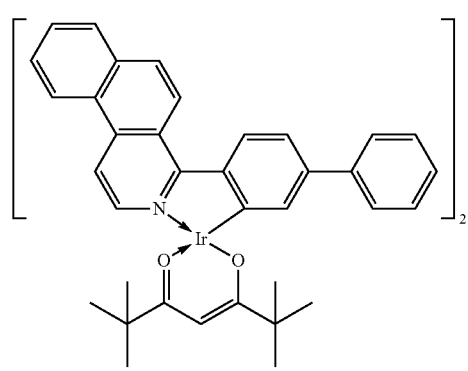
Compound (30)
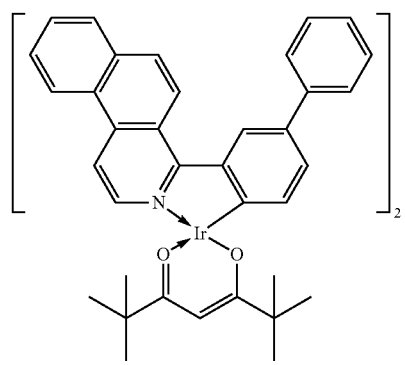
Compound (31)
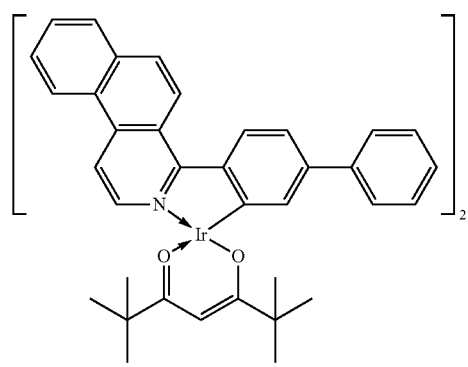
Compound (32)
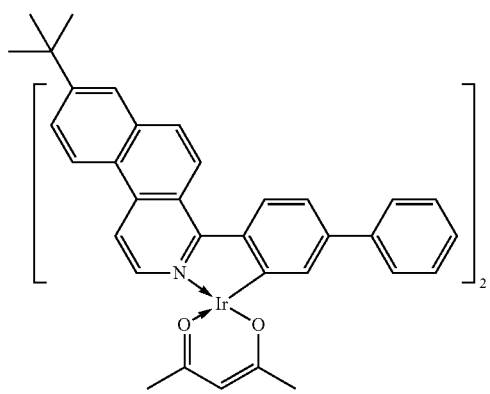

Compound (33)
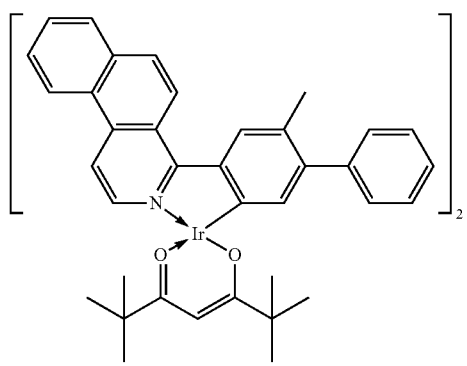
Compound (34)
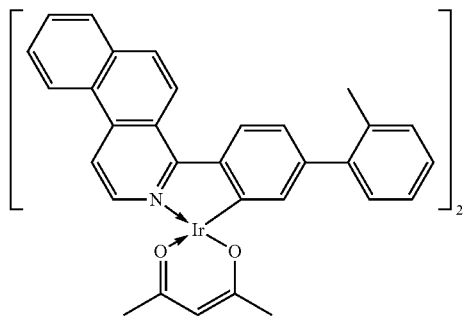
Compound (35)
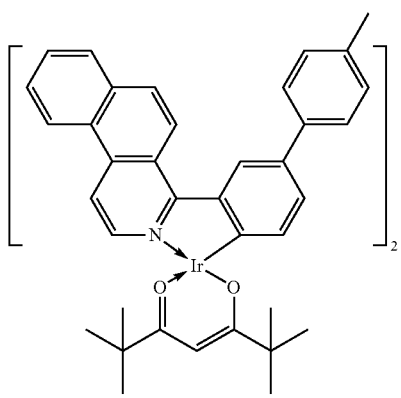
Compound (36)
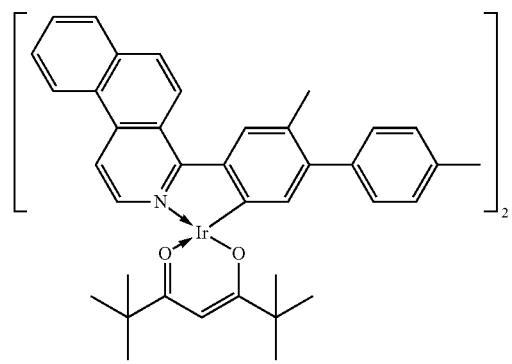
Compound (37)
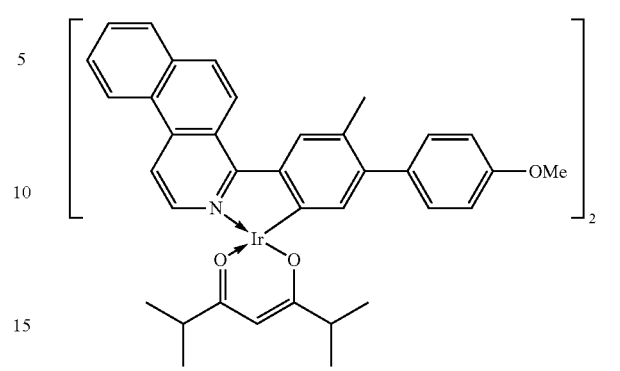
Compound (38)
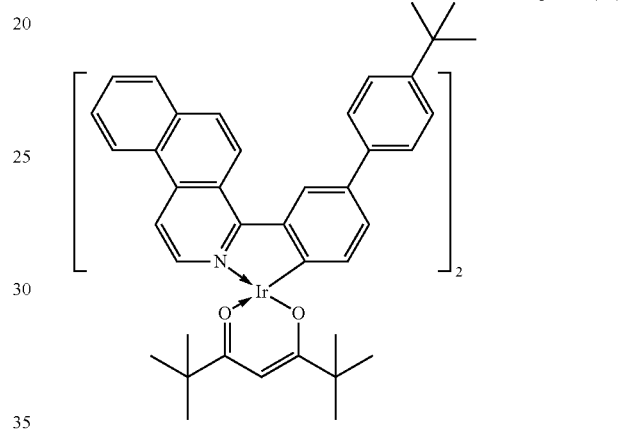
Compound (39)
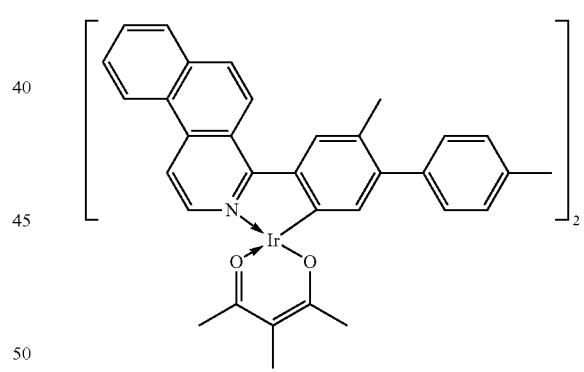
Compound (40)
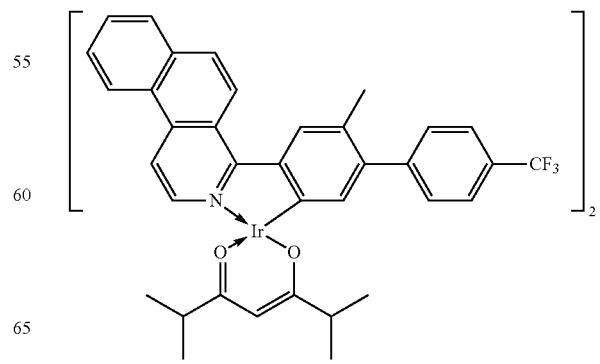

Compound (41)
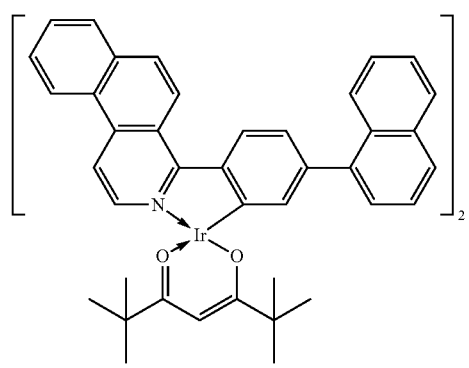
Compound (45)
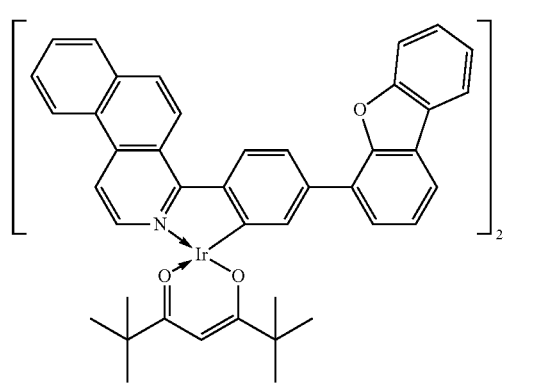
Compound (42)
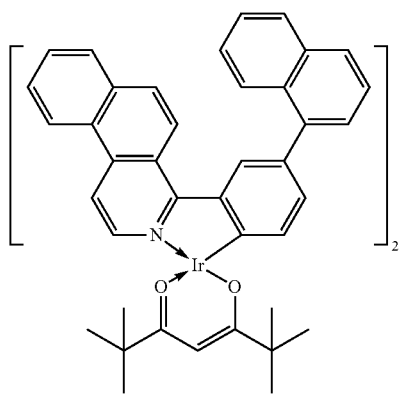
Compound (46)
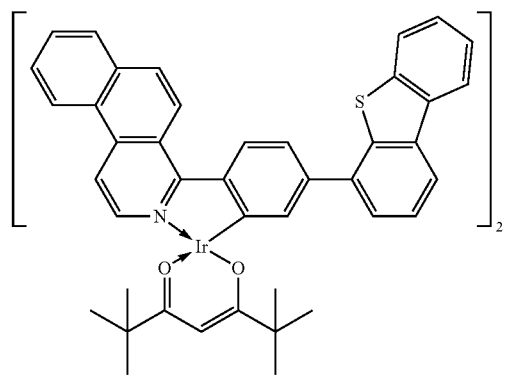
Compound (43)
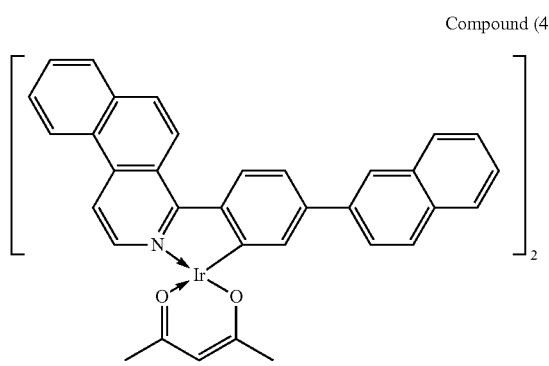
Compound (47)
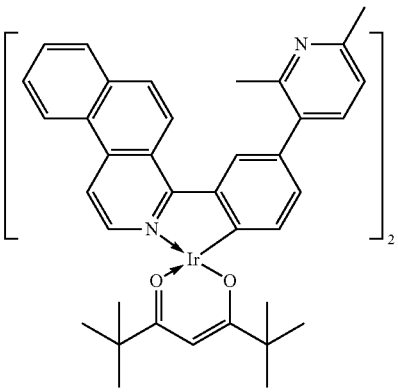
Compound (44)
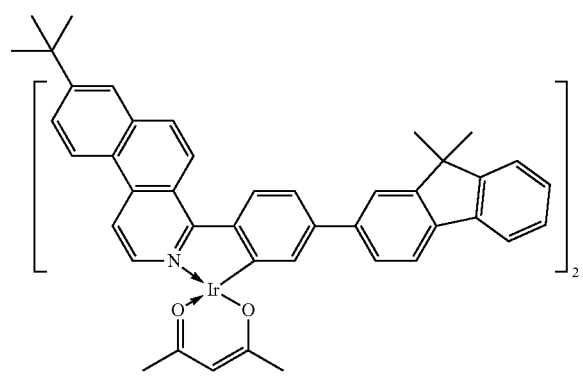
Compound (48)
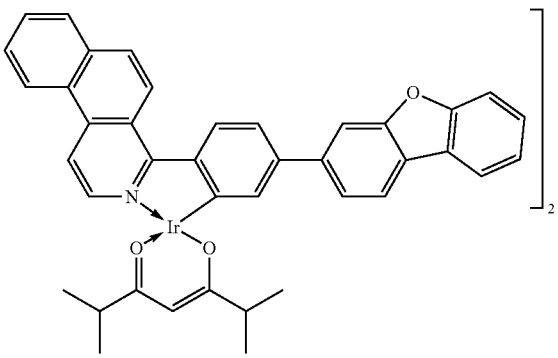

-continued
Compound (49)
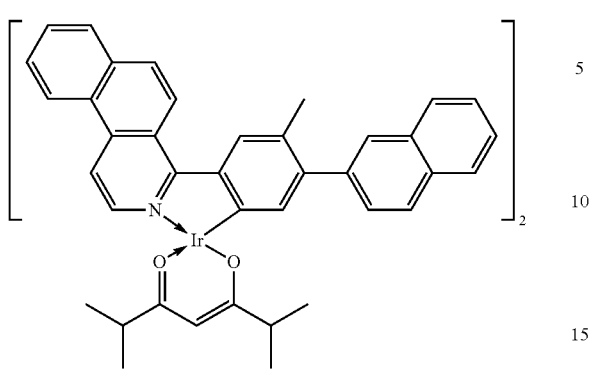
Compound (50)
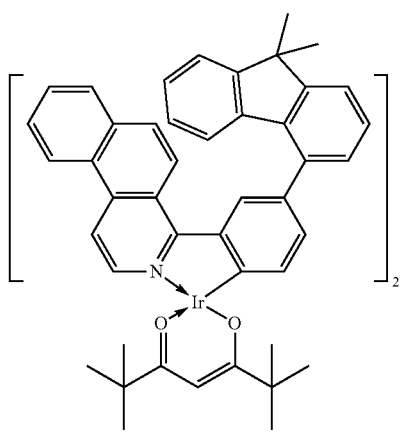
Compound (51)
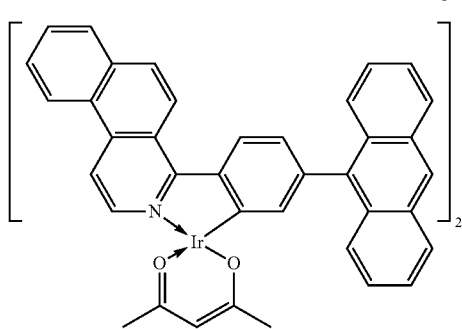
Compound (52)
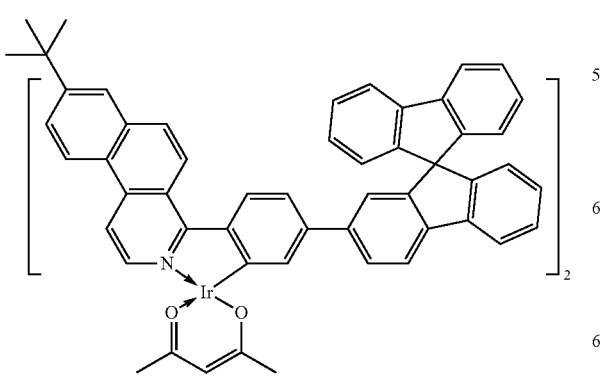
-continued
Compound (53)
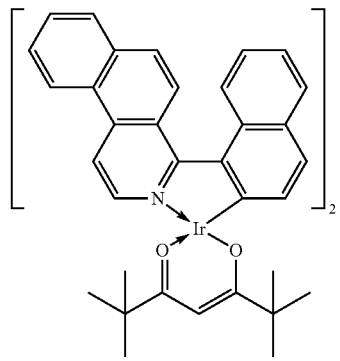
Compound (54)
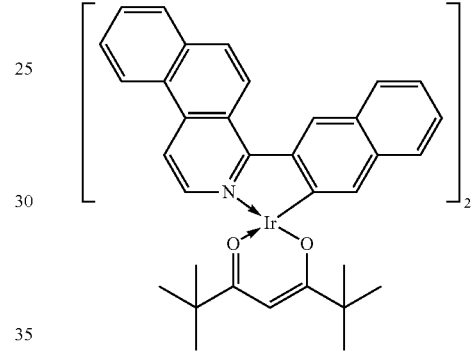
Compound (55)
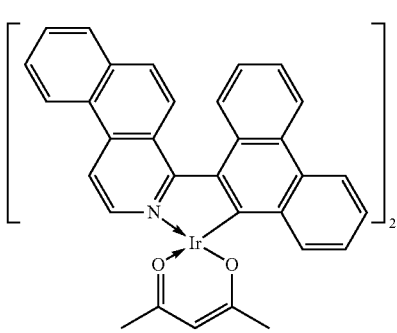
Compound (56)
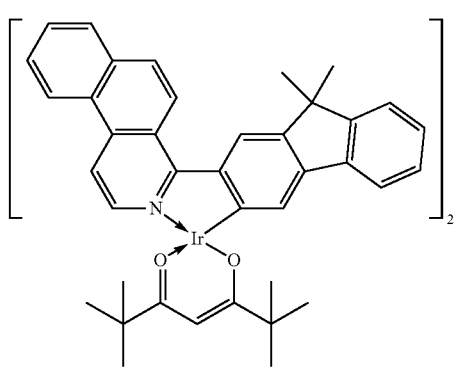

Compound (57)
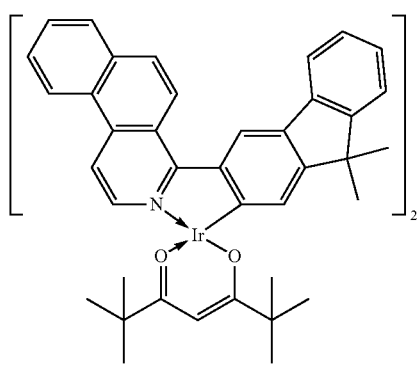
Compound (58)
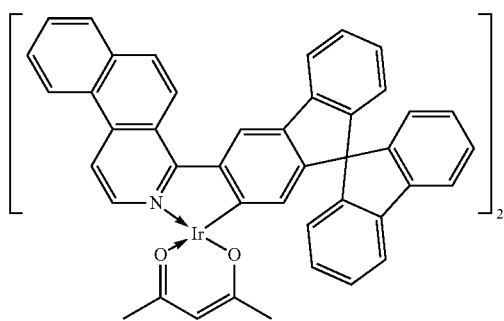
Compound (59)
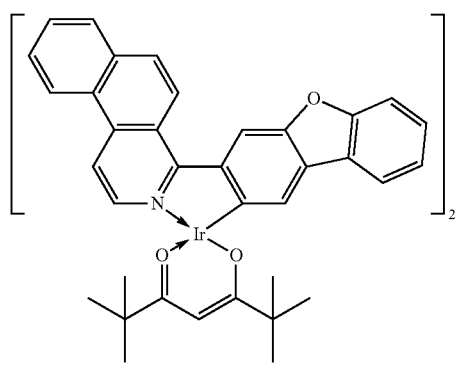
Compound (60)
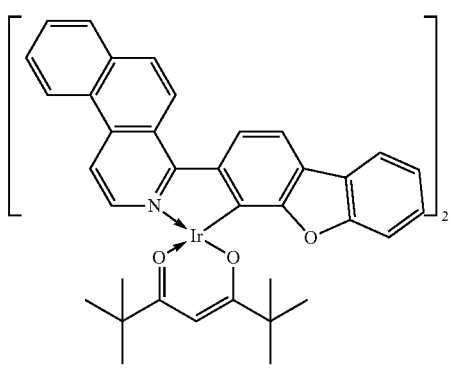
Compound (61)
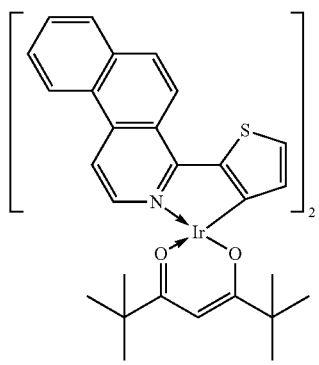
Compound (62)
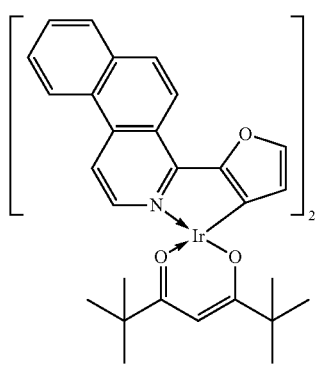
Compound (63)
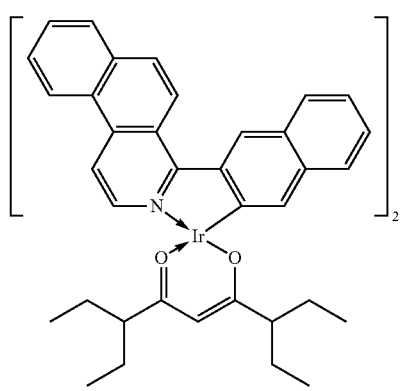
Compound (64)
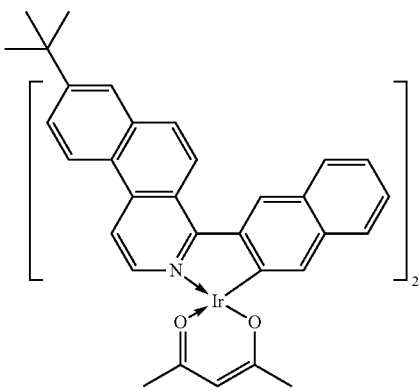

Compound (65)
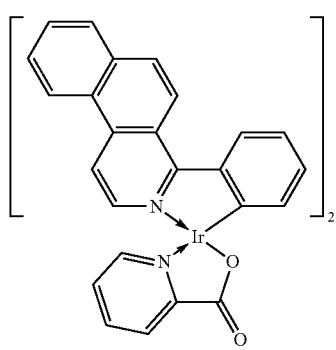
Compound (66)
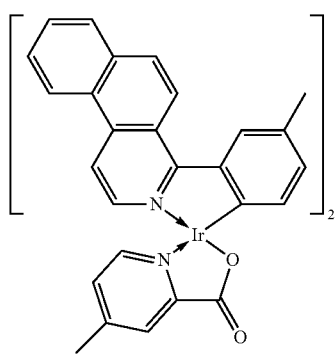
Compound (67)
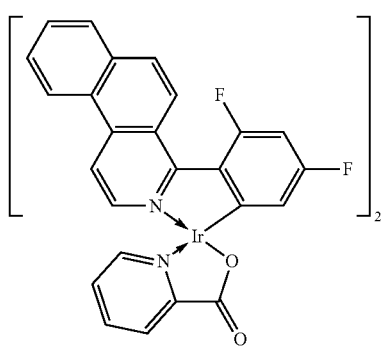
Compound (68)
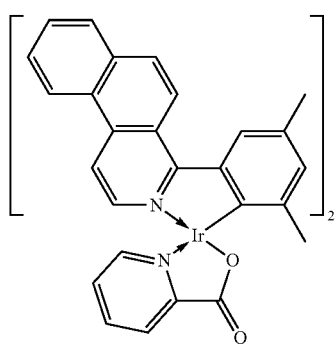
Compound (69)
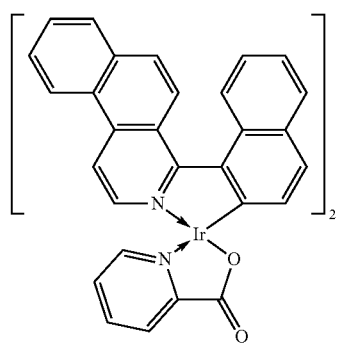
Compound (70)
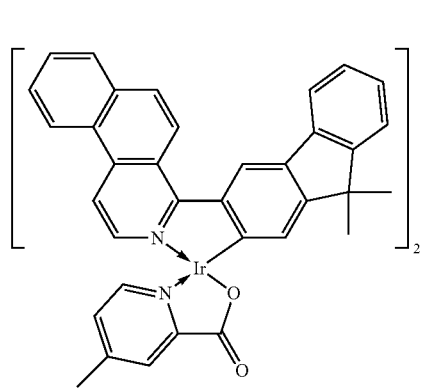
Compound (71)
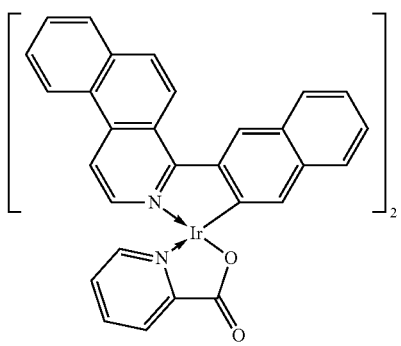
Compound (72)
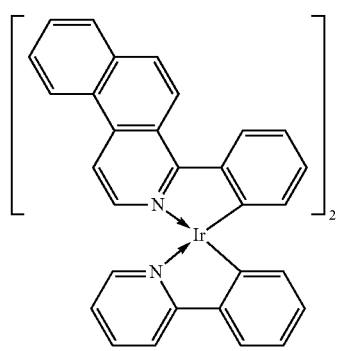

Compound (73)
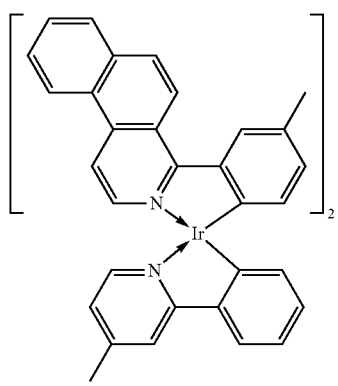
Compound (74)
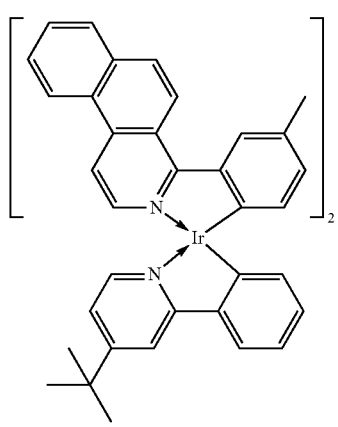
Compound (75)
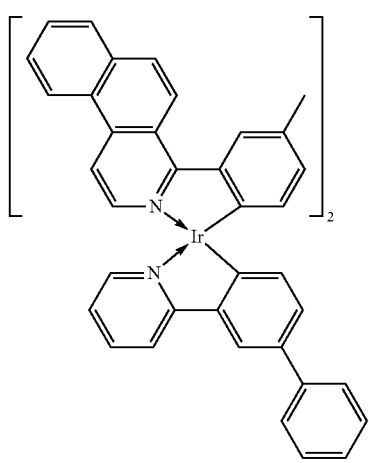
Compound (76)
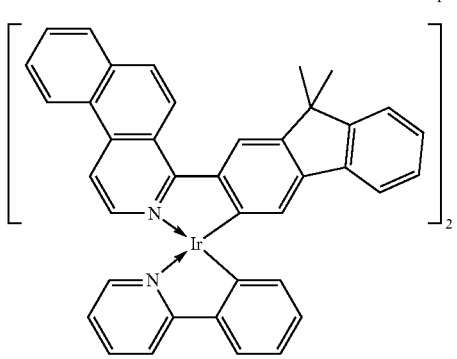
Compound (77)
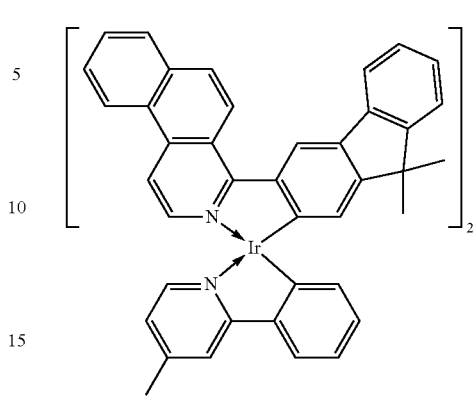
Compound (78)
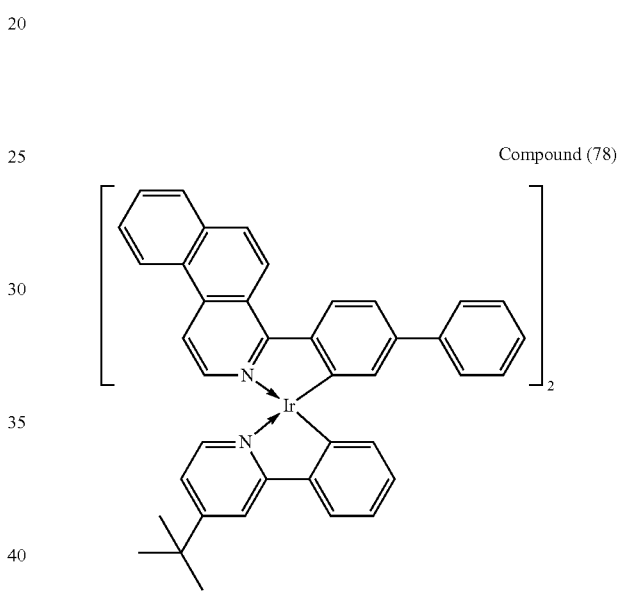
Compound (79)
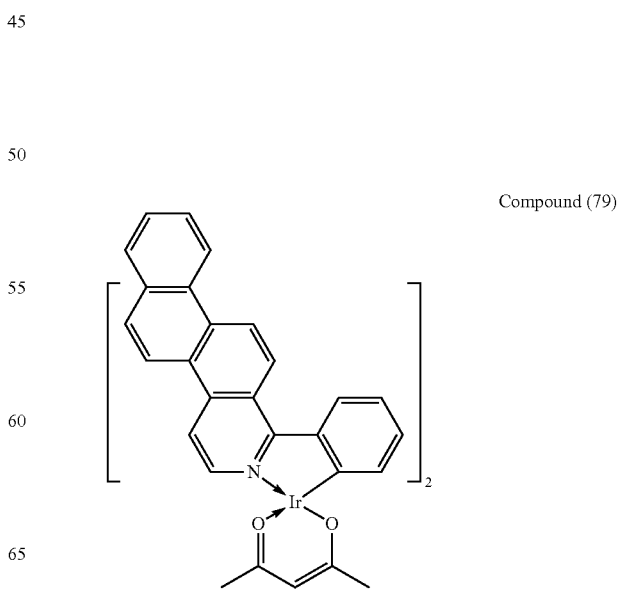

Compound (80)
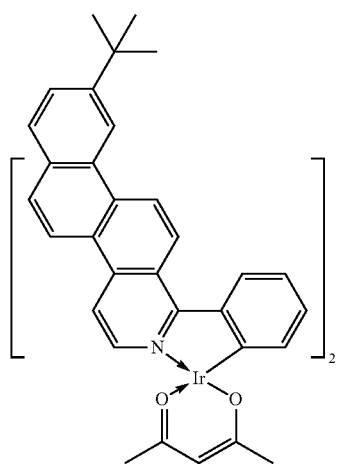
Compound (81)
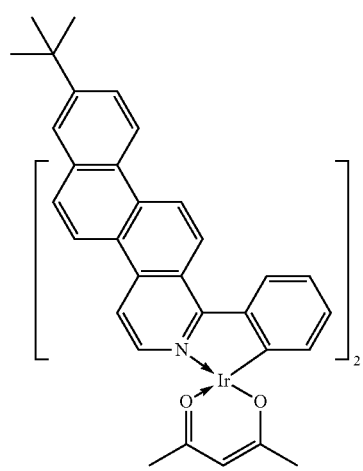
Compound (82)
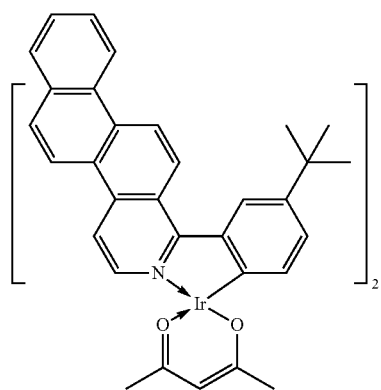
Compound (83)
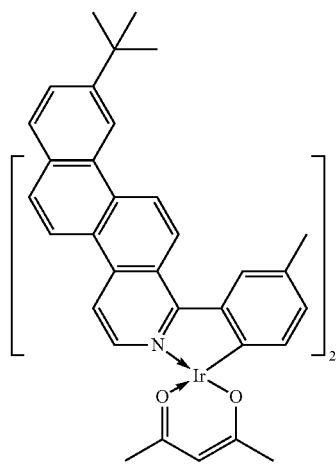
Compound (84)
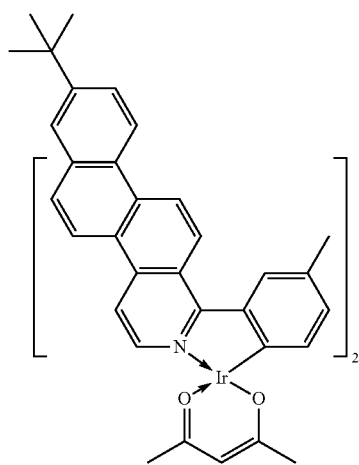
Compound (85)
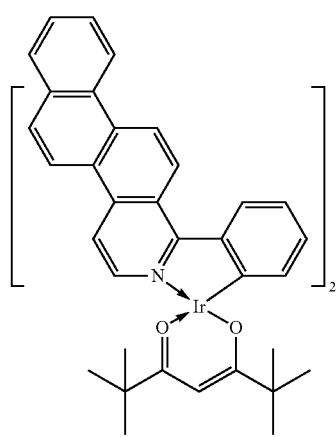

Compound (86)

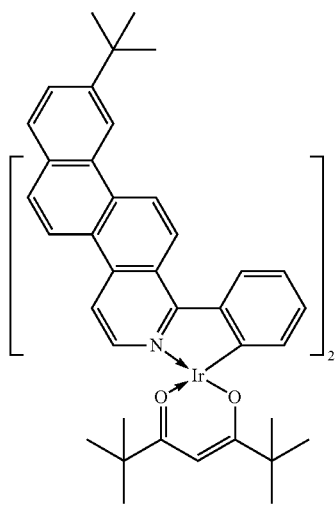

Compound (87)

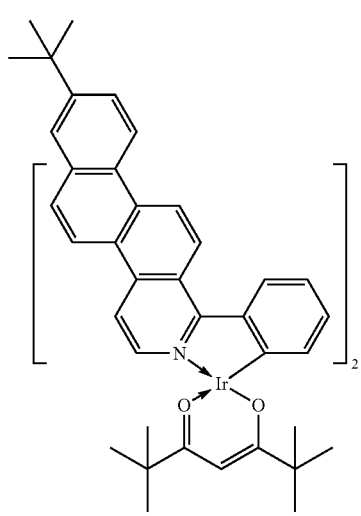

Compound (88)

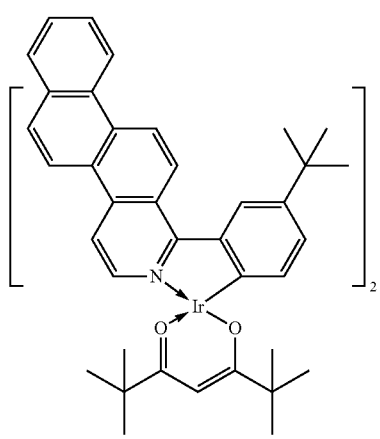

Compound (89)

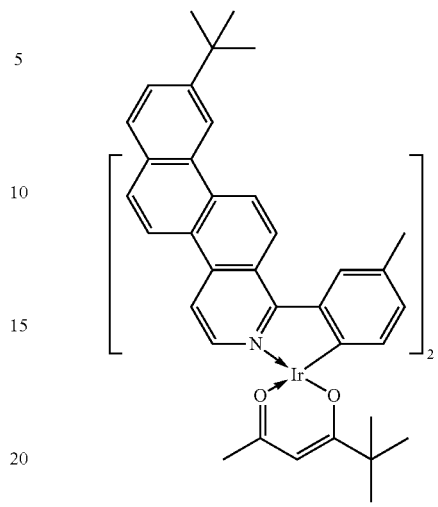

Compound (90)

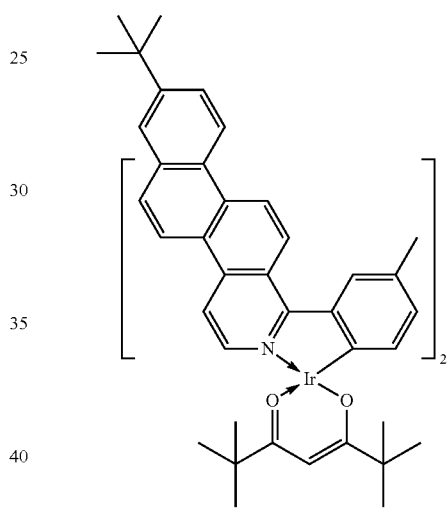

Among the aforementioned example compounds, the compounds (1) to (64) and the compounds (79) to (90) are the iridium complexes that have ligands represented by general formula [5]. These iridium complexes each contain one acac ligand (diketone bidentate ligand) having a small molecular weight. Since the molecular weight of the complex itself is relatively small, purification by sublimation is easy. Furthermore, in general formula [5], $R^{31}$ to $R^{33}$ each preferably represent a hydrogen atom or an alkyl group, and $R^{32}$ more preferably represents a hydrogen atom.

Among the example compounds, the compounds (65) to (71) are iridium complexes that have ligands represented by general formula [4]. These iridium complexes each contain one picolinic acid derivative as a ligand in the molecule. Here, when a picolinic acid derivative is introduced as a ligand, the light emission peak wavelength of the complex itself can be shifted toward the short wavelength compared to when an acac ligand is introduced.

Among the example compounds, the compounds (72) to (78) are iridium complexes that have ligands represented by general formula [3]. These iridium complexes each contain one phenylpyridine (ppy) derivative in the molecule. The ligand ppy is a non-light emitting ligand in this iridium complex; thus, red light emission derived from an arylbenzo[f]isoquinoline ligand can be obtained from the iridium complex. Having a ppy ligand sometimes results in high quantum yield.

Method for Improving Isomer Composition Ratio

The isomer of the iridium complex according to this embodiment is obtained as a mixture with the iridium complex during the synthesis of the iridium complex. The isomer can be isolated or the concentration of the isomer can be increased by performing sublimation purification, recrystallization, dispersion washing, GPC cleanup, and column cleanup multiple times on this mixture. Regarding the aforementioned purification processes, one type of the process may be performed multiple times, or two or more types of processes may be combined. Alternatively, the composition ratio of the isomer can be increased by extraction using the difference between the solubility of the iridium complex and the solubility of the isomer thereof during synthesis of the iridium complex.

Organic Compound Layer in Organic Light Emitting Device According to One Embodiment of the Present Disclosure Next, an organic compound layer in an organic light emitting device according to one embodiment of the present disclosure is described.

The organic light emitting device according to this embodiment has at least a first electrode and a second electrode that form an electrode pair, and an organic compound layer disposed between these electrodes. The electrode pair may be constituted by a positive electrode and a negative electrode. In the organic light emitting device of this embodiment, the organic compound layer may be a single layer or a layered structure formed of multiple layers as long as a light emitting layer is included. The organic compound layer is also referred to as an organic EL layer.

Here, when the organic compound layer is a layered structure formed of multiple layers, the organic compound layer may include a light emitting layer. The organic compound layer may include, in addition to the light emitting layer, a hole injection layer, a hole transport layer, an electron blocking layer, a hole-exciton blocking layer, an electron transport layer, an electron injection layer, etc. The light emitting layer may be a single layer or a layered structure formed of multiple layers. The hole transport layer and the electron transport layer are also referred to as charge transport layers.

In the organic light emitting device of this embodiment, at least one layer in the organic compound layer contains the composition according to this embodiment. Specifically, the composition according to the embodiment is contained in one of the hole injection layer, the hole transport layer, the electron blocking layer, the light emitting layer, the hole-exciton blocking layer, the electron transport layer, and the electron injection layer described above, and may be contained in the light emitting layer.

When the composition according to the embodiment is contained in the light emitting layer in the organic light emitting device of the embodiment, the light emitting layer may be a layer solely composed of the composition of the embodiment, or may be a layer that contains, in addition to the composition of the embodiment, a first organic compound and a second organic compound different from the first organic compound. The first organic compound may have a lowest excited triplet energy larger than the lowest excited triplet energy of the iridium complex contained in the composition. The second organic compound may have a lowest excited triplet energy larger than or equal to the lowest excited triplet energy of the iridium complex contained in the composition but lower than or equal to the lowest excited triplet energy of the first organic compound. Here, when the light emitting layer contains the first organic compound and the second organic compound, the first organic compound may be a host of the light emitting layer. The second organic compound may be an assist material. The iridium complex contained in the composition may be a guest or dopant.

Here, the host is a compound, the weight ratio of which is the largest among the compounds constituting the light emitting layer. Moreover, the guest or dopant is a compound, the weight ratio of which is smaller than the host among the compounds constituting the light emitting layer, and is a compound responsible for the main light emission. The assist material is a compound, the weight ratio of which is smaller than the host among the compounds constituting the light emitting layer, and is a compound that assists light emission of the guest. The assist material is also called a second host.

Here, when the iridium complex of the embodiment is used as the guest in the light emitting layer, the guest concentration relative to the entirety of the light emitting layer is preferably 0.01 wt % or more and 20 wt % or less and more preferably 0.1 wt % or more and 5.0 wt % or less. The entirety of the light emitting layer refers to the total weight of the compounds constituting the light emitting layer.

The inventors of the present disclosure have conducted various studies and found that, when the composition according to this embodiment is used as a guest in the light emitting layer, high-luminance optical output is achieved at high efficiency. The light emitting layer may be a single layer or a multilayer layer, and red light, which is the emission color of this embodiment, may be mixed with other colors by adding a light emitting material that emits light of another color. The multilayer layer indicates the state in which a light emitting layer and another light emitting layer are on top of each other. In this case, the emission color of the organic light emitting device is not limited to red. More specifically, the emission color may be white or an intermediate color. When the emission color is white, other light emitting layers emit light of colors other than red, for example, blue and green. The film is formed by vapor deposition or coating.

The organic compound of this embodiment can be used as a constituent material of an organic compound layer other than the light emitting layer constituting the organic light emitting device of this embodiment. Specifically, the organic compound may be used as a constituent material of an electron transport layer, an electron injection layer, a hole transport layer, a hole injection layer, a hole blocking layer, or the like. In this case, the emission color of the organic light emitting device is not limited to red. More specifically, the emission color may be white or an intermediate color.

When producing the organic light emitting device of this embodiment, known low-molecular-weight and high-molecular-weight hole injecting compounds or hole transporting compounds, compounds that serve as the host, light-emitting compounds, electron injecting compounds or electron transporting compounds, etc., can be used in combination as necessary.

Examples of these compounds are described below.

A material having high hole mobility capable of facilitating hole injection from the positive electrode and transporting the injected holes to the light emitting layer can be used as the hole injecting/transporting material. A material having a high glass transition point can be used to reduce deterioration of the film quality, such as crystallization, in the organic light emitting device. Examples of the low-molecular-weight and high-molecular weight materials having a hole injecting/transporting property include triarylamine derivatives, arylcarbazole derivatives, phenylenediamine derivatives, stilbene derivatives, phthalocyanine derivatives, porphyrin derivatives, poly(vinylcarbazole), poly(thiophene), and other conductive polymers. The aforementioned hole injecting/transporting materials are also suitable for use in an electron blocking layer.

Although specific examples of the compounds used as hole injecting/transporting materials are described below, these examples are not limiting.

HT1

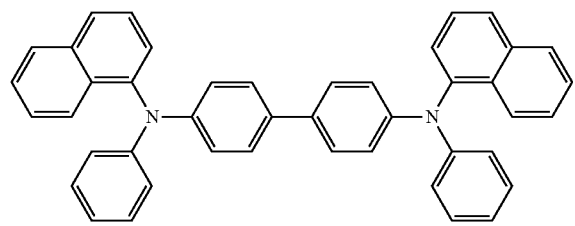

HT2

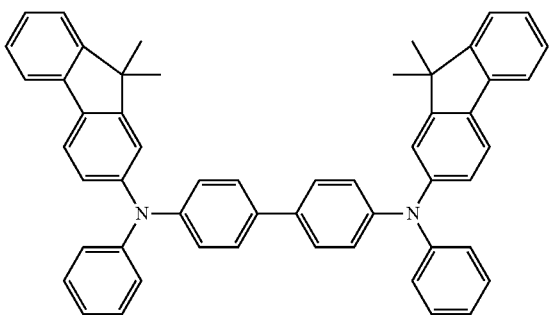

HT3

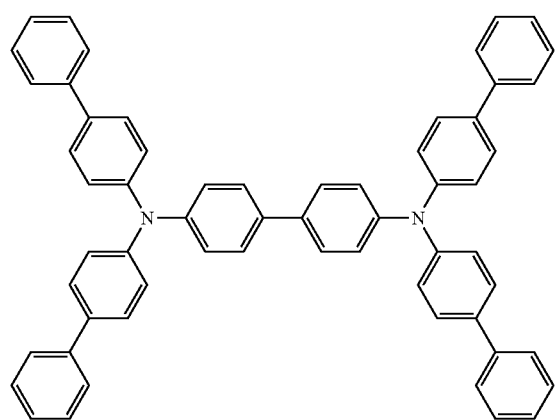

HT4

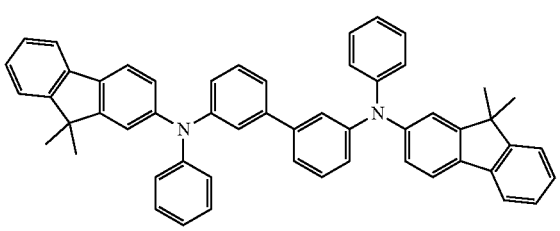

HT5

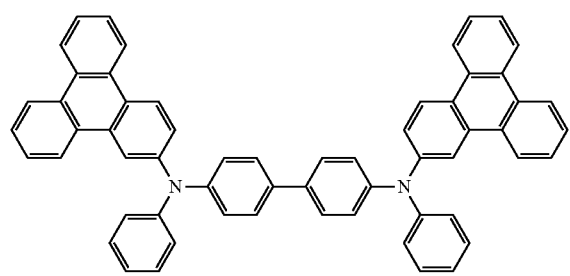

HT6

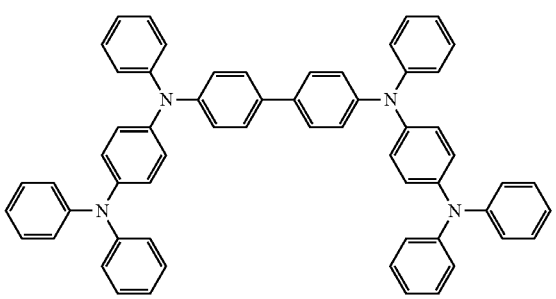

-continued
HT7
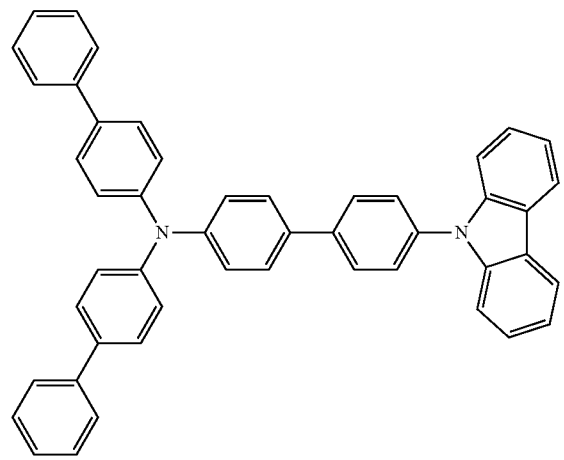
HT8
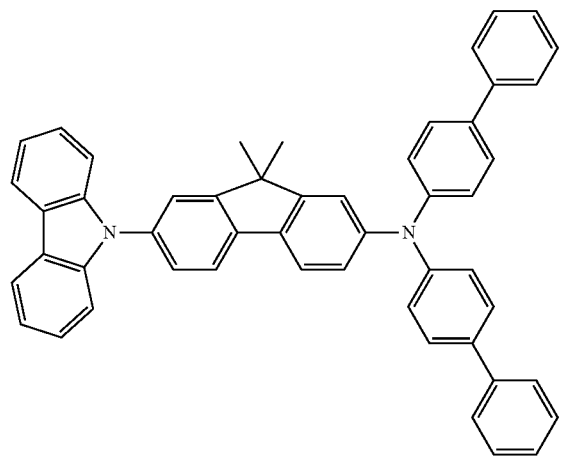
HT9
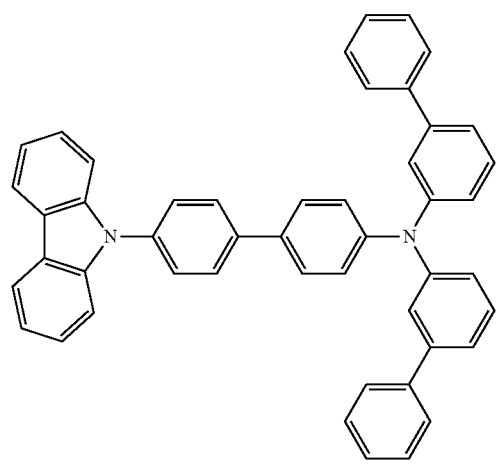
HT10
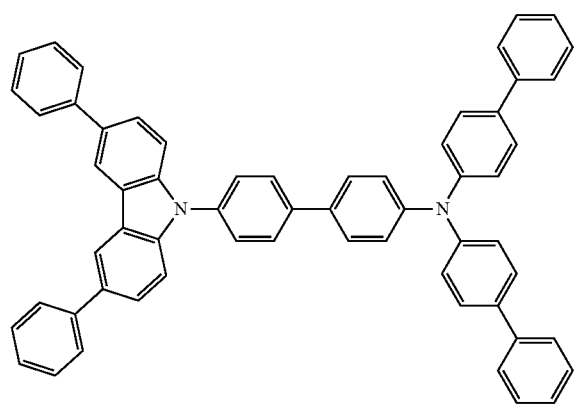
HT11
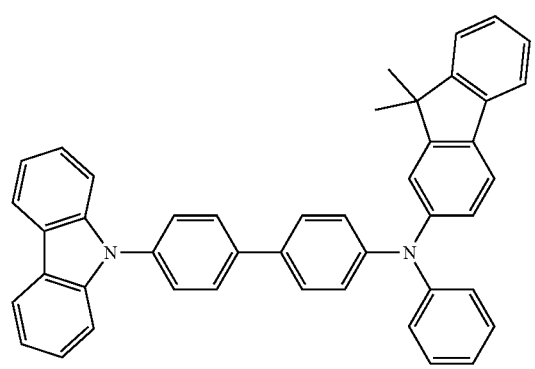
HT12
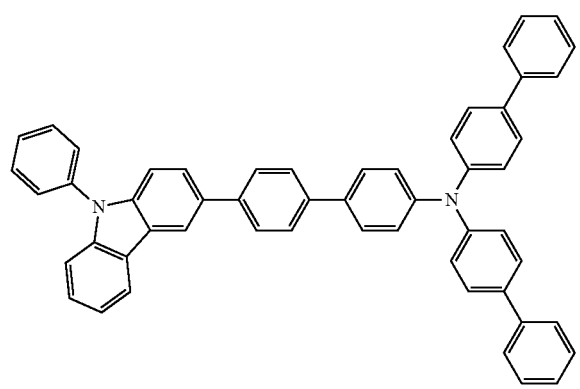

-continued
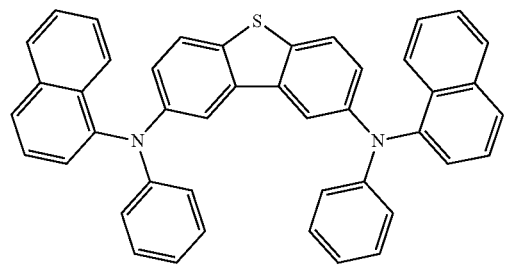
HT13
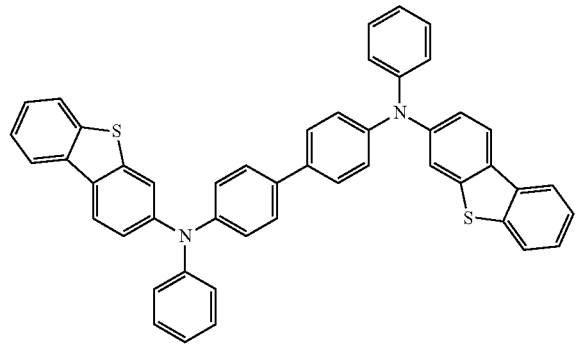
HT14
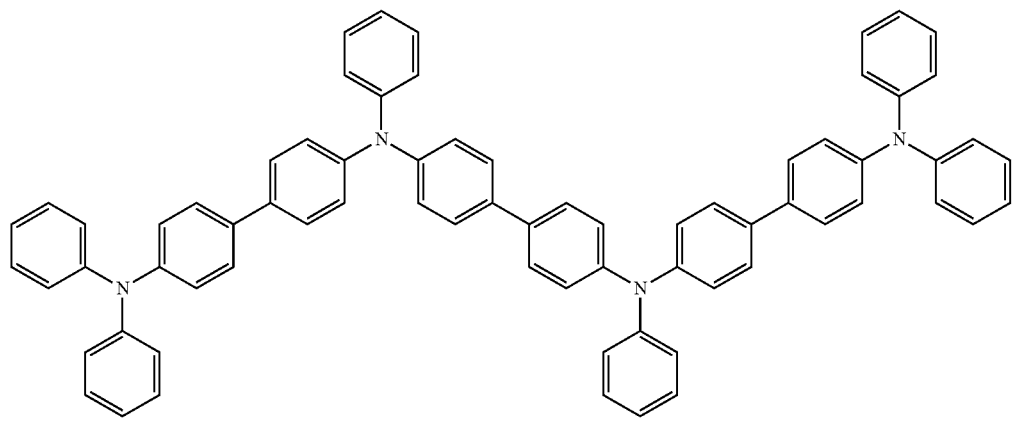
HT15
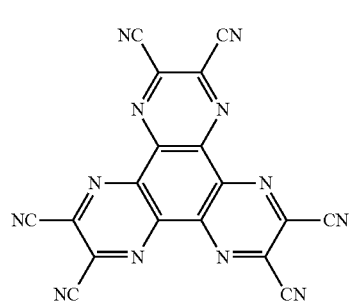
HT16
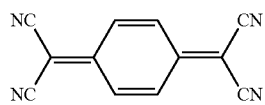
HT17
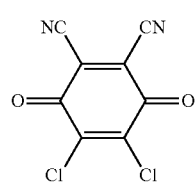
HT18
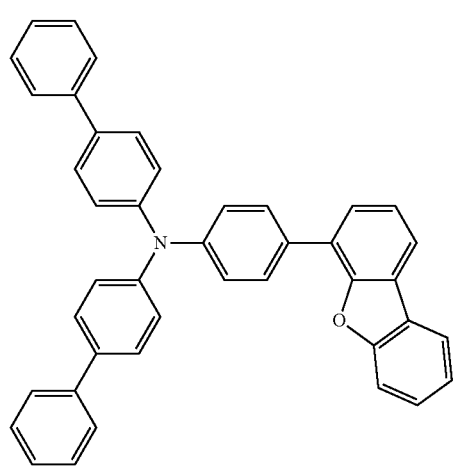
HT19

Among the hole transport materials listed above, HT16 to HT18 can decrease the drive voltage when used in a layer in contact with the positive electrode. HT16 is widely used in organic light emitting devices. HT2, HT3, HT10, and HT12 may be used in an organic compound layer adjacent to HT16. Two or more materials may be used in one organic compound layer. For example, a combination of HT2 and HT4, a combination of HT3 and HT10, and a combination of HT8 and HT9 may be used.

Examples of the light emitting materials mainly related to light emitting functions other than the iridium complex of one embodiment of the present disclosure include fused ring compounds (for example, fluorene derivatives, naphthalene derivatives, pyrene derivatives, perylene derivatives, tetracene derivatives, anthracene derivatives, and rubrene), quinacridone derivatives, coumarin derivatives, stilbene derivatives, organoaluminum complexes such as tris(8-quinolinolato)aluminum, iridium complexes, platinum complexes, rhenium complexes, copper complexes, europium complexes, ruthenium complexes, and polymer derivatives such as poly(phenylenevinylene) derivatives, poly(fluorene) derivatives, and poly(phenylene) derivatives.

Although specific examples of the compounds used as light emitting materials are described below, these examples are not limiting.

BD1

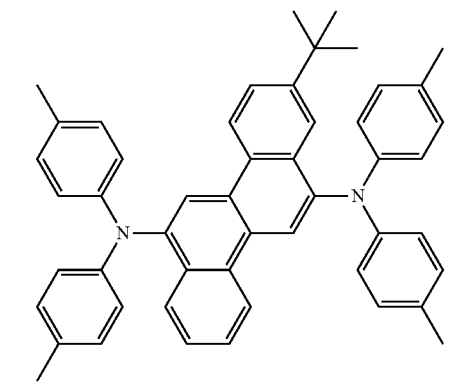

BD2

BD3

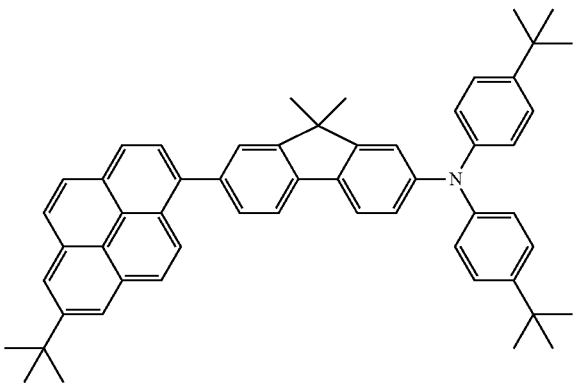

BD4

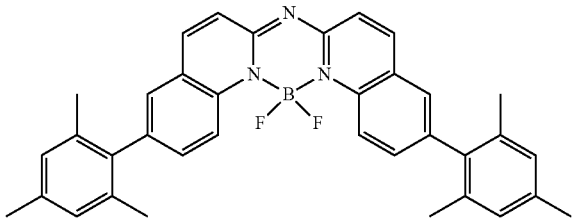

BD5

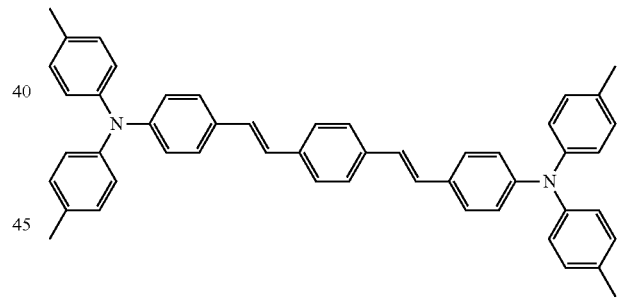

BD6

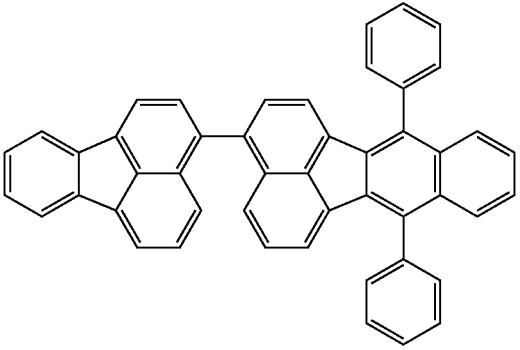

BD7
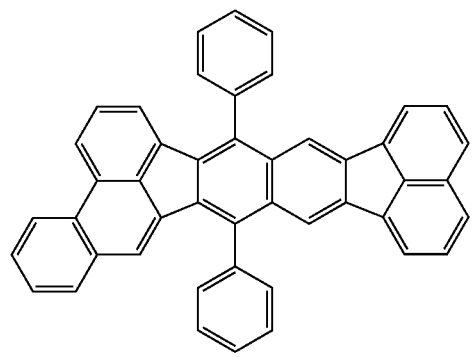
BD8
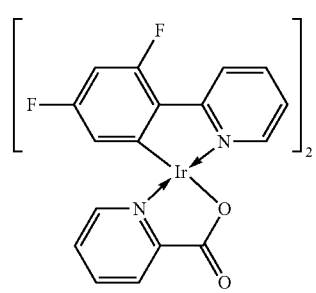
GD1
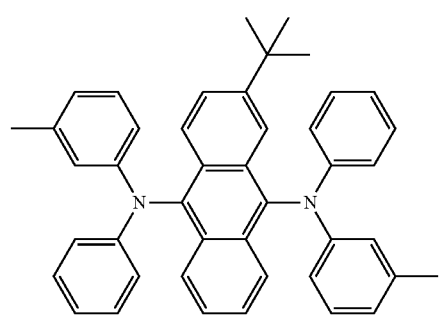
GD2
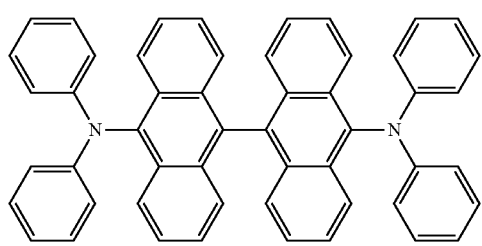
GD3
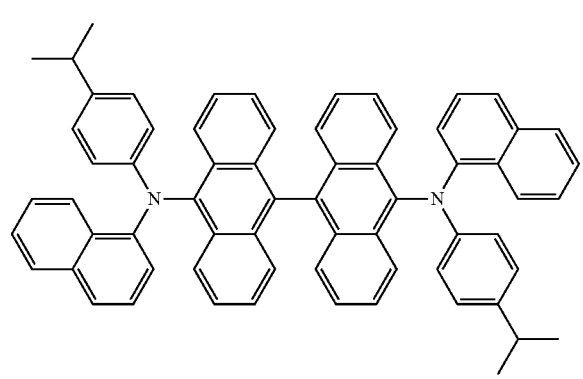
GD4
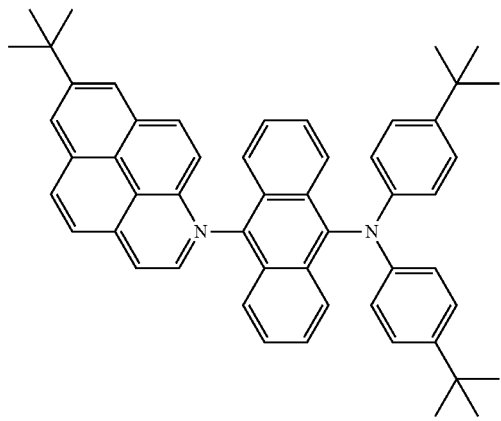
GD5
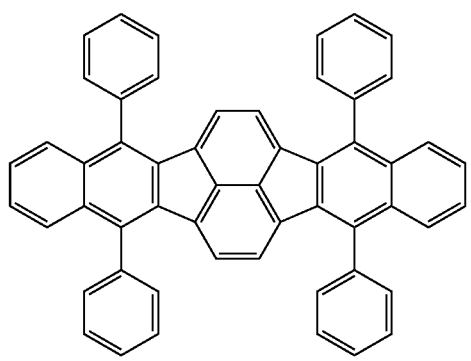
GD6
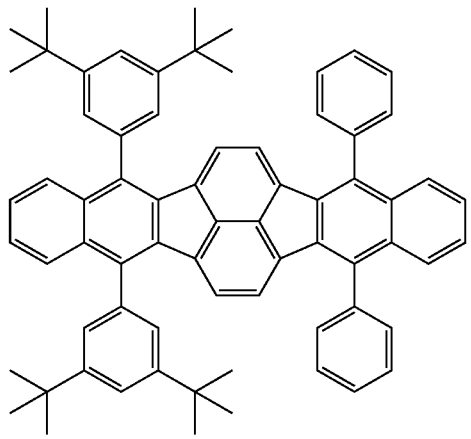
GD7
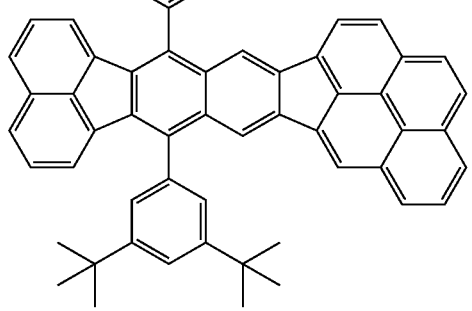

-continued
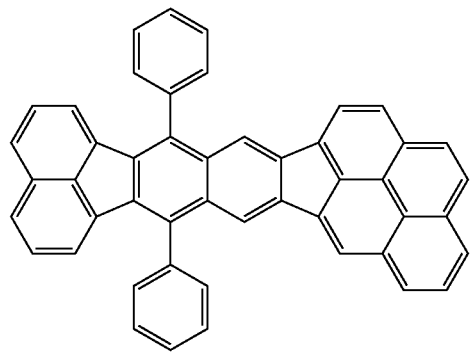
GD8
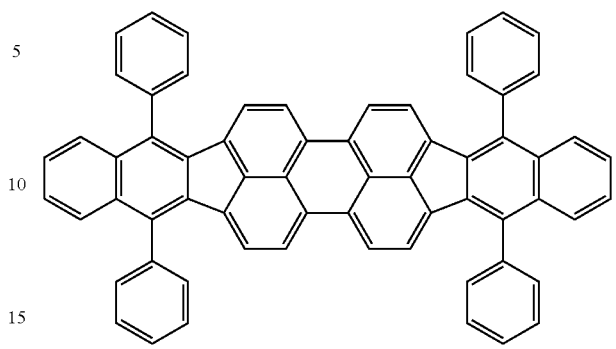
RD1
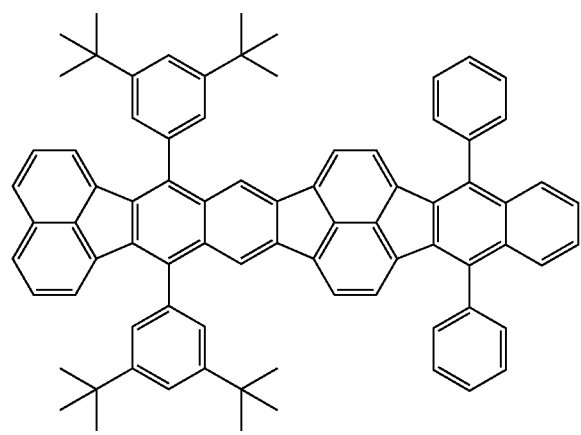
GD9
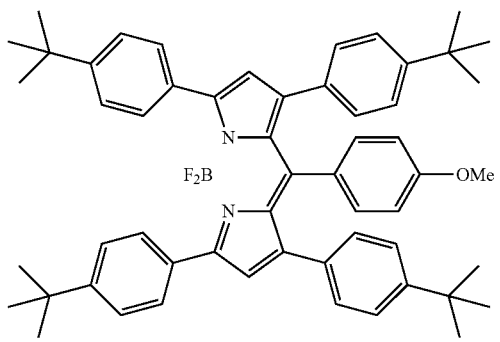
RD2
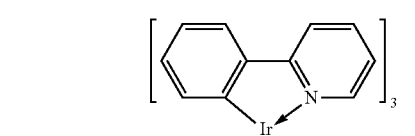
GD10
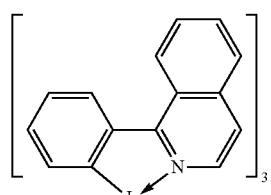
RD3
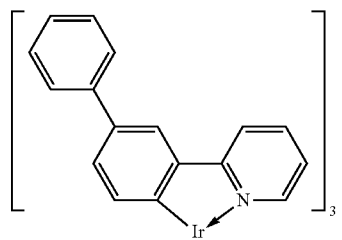
GD11
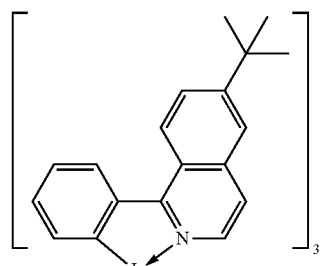
RD4
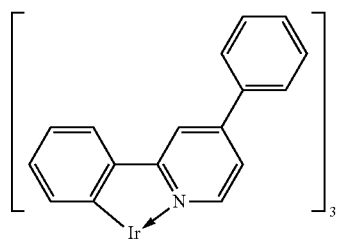
GD12
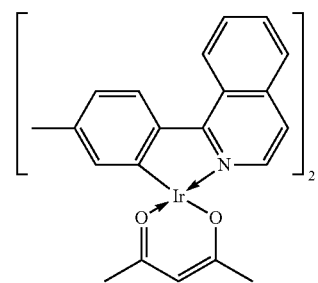
RD5

-continued

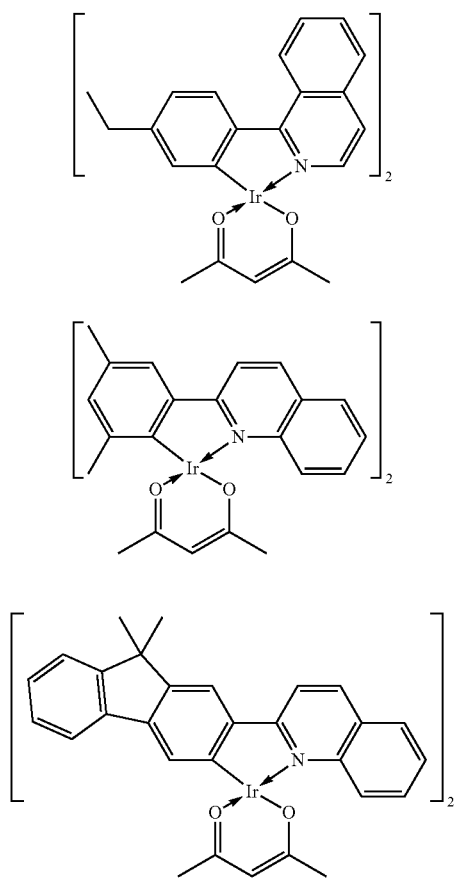

RD6

RD7

RD8

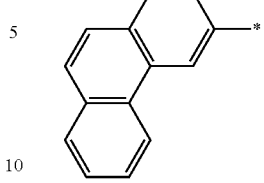

Substituent group α

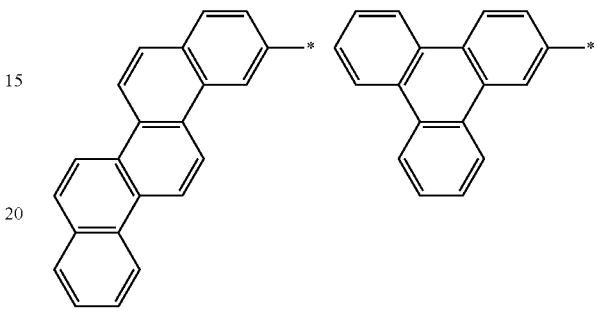

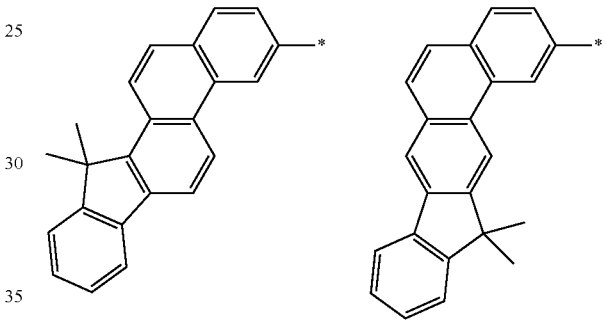

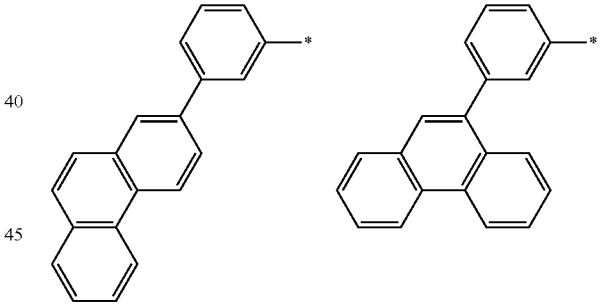

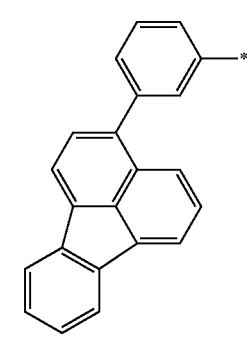

Examples of the light emitting layer host or light emitting assist material contained in the light emitting layer include, in addition to aromatic hydrocarbon compounds and derivatives thereof, carbazole derivatives, dibenzofuran derivatives, dibenzothiophene derivatives, organoaluminum complexes such as tris(8-quinolinolato)aluminum, and organoberyllium complexes.

In particular, the host material can have an anthracene, tetracene, perylene, fluorene, or pyrene skeleton in the molecular skeleton. This is because the material is constituted by a hydrocarbon as described above and, in addition, has the lowest excited singlet energy that can cause sufficient energy transfer in the organic compound of the present disclosure.

The host material of the aromatic hydrocarbon compound can be a compound represented by general formula [7] below.

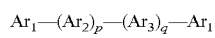

General formula [7]

In general formula [7], p and q each represent 0 or 1, or p+q is 1 or more.

$Ar_1$ is one substituent selected from the following substituent group α.

$Ar_2$ and $Ar_3$ are each one substituent selected from the following substituent group β. $Ar_2$ and $Ar_3$ may be the same or different. Here, * represents the substitution position for each substituent.

Substituent group β

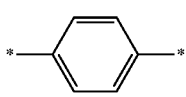 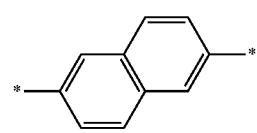

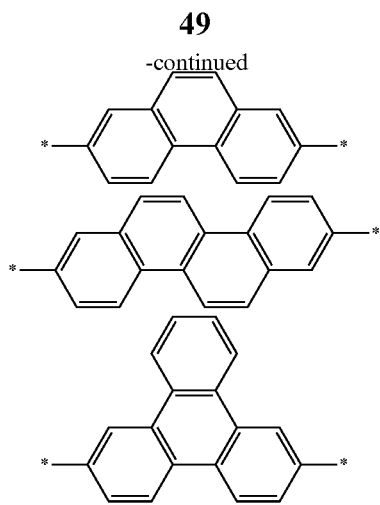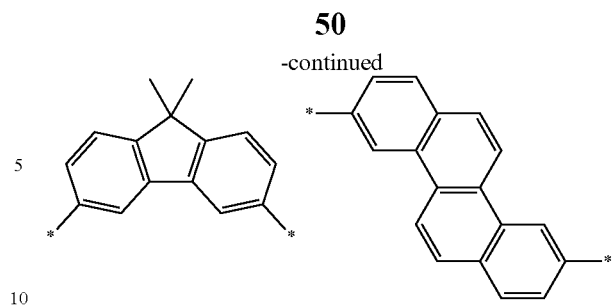
Although specific examples of the compounds used as the light emitting layer host or light emitting assist material contained in the light emitting layer are described below, these examples are not limiting.
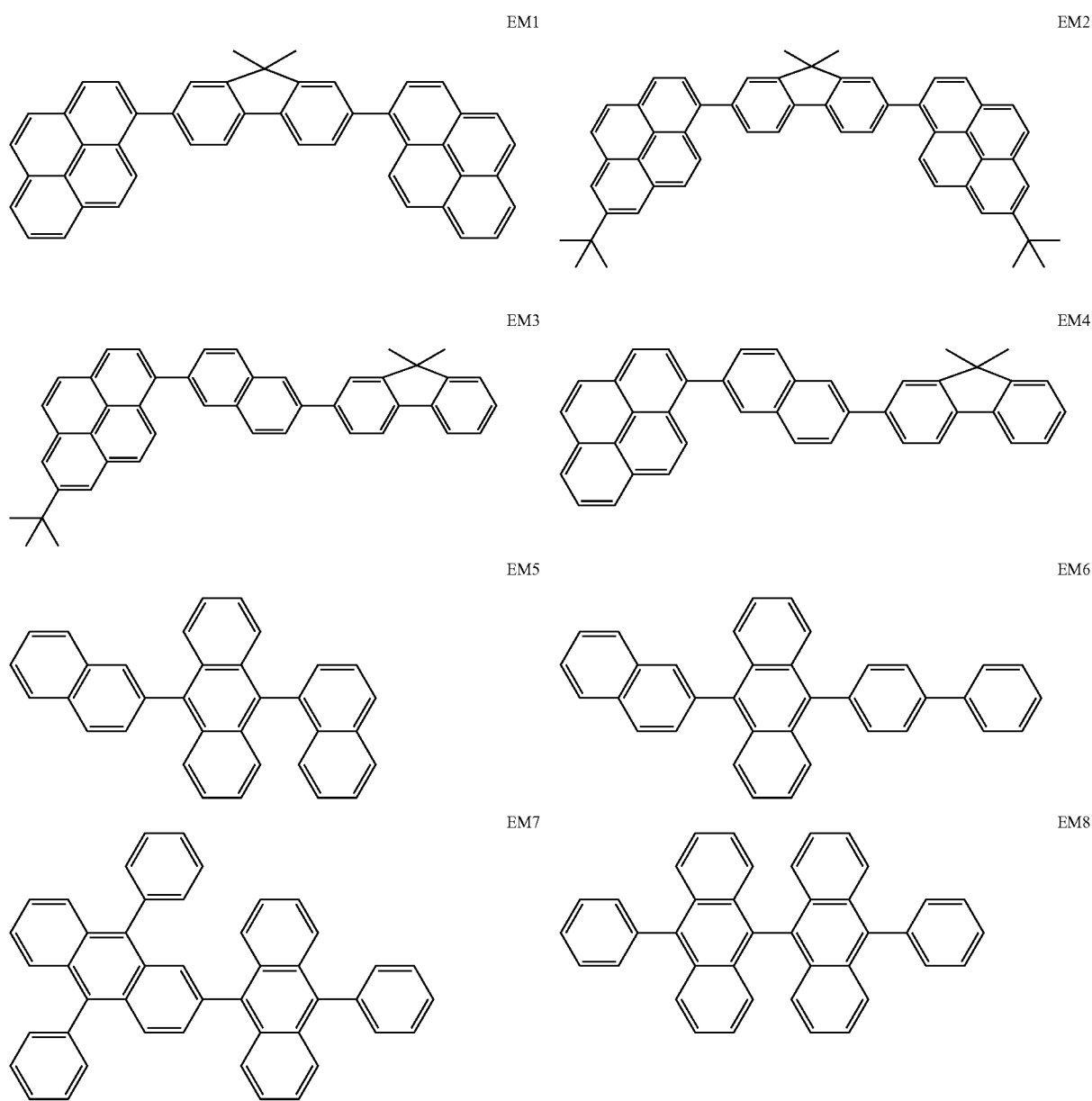

-continued
EM9
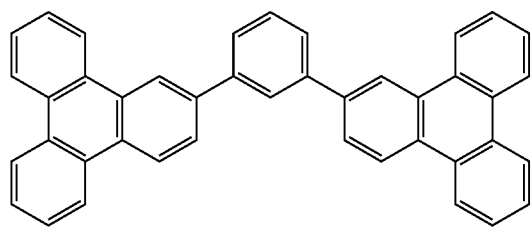
EM10
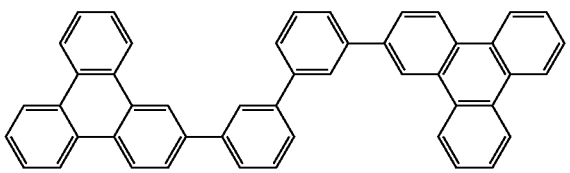
EM11
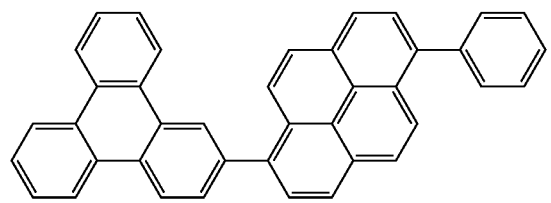
EM12
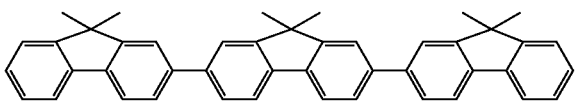
EM13
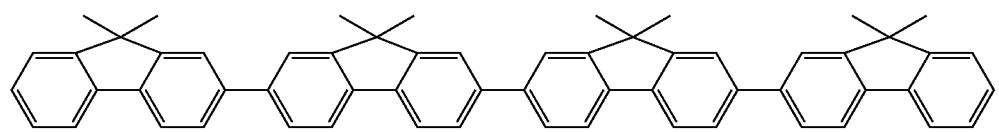
EM14
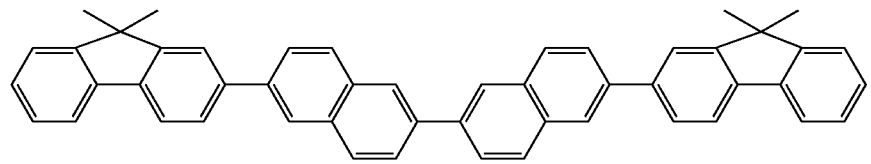
EM15
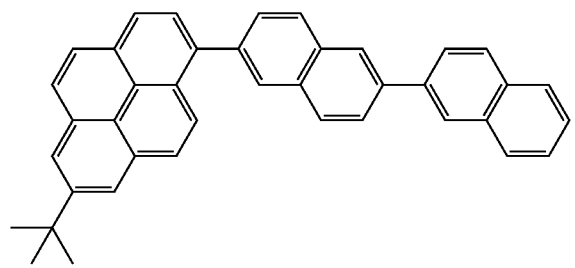
EM16
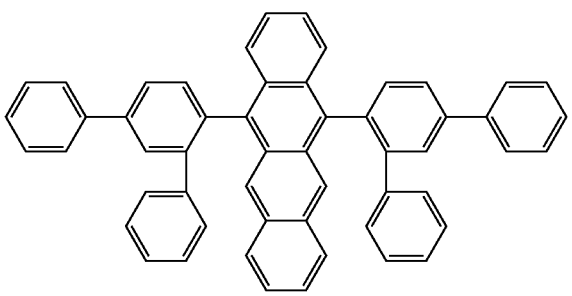
EM17
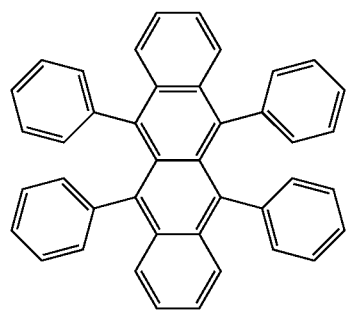
EM18
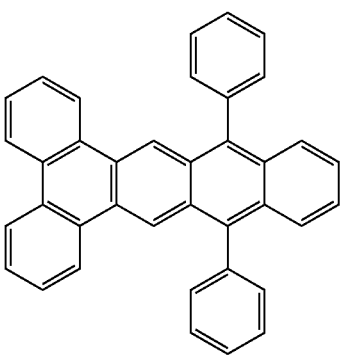

-continued
EM19
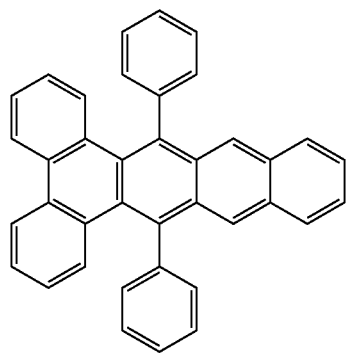
EM20
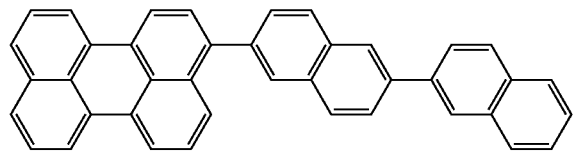
EM21
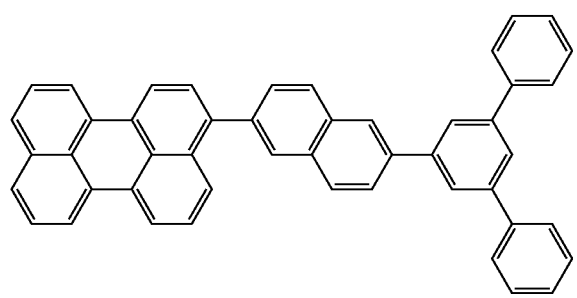
EM22
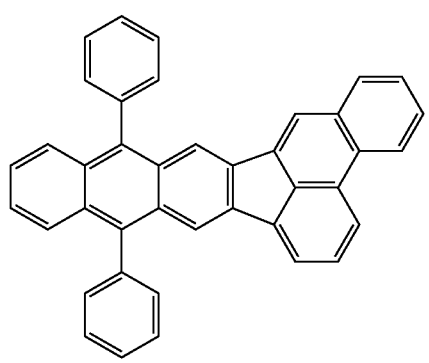
EM23
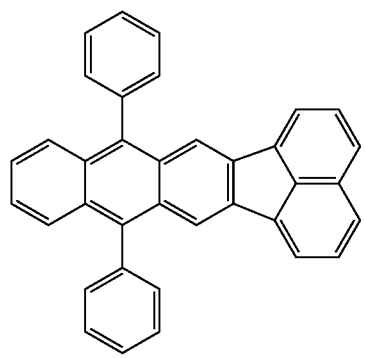
EM24
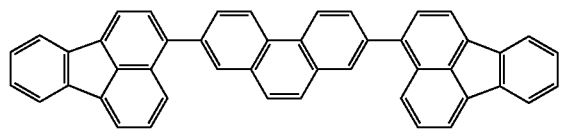
EM25
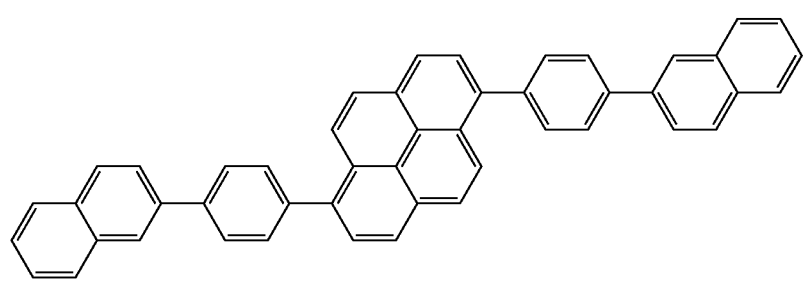
EM26
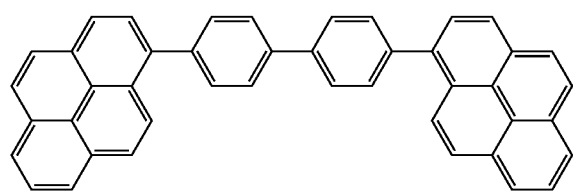
EM27
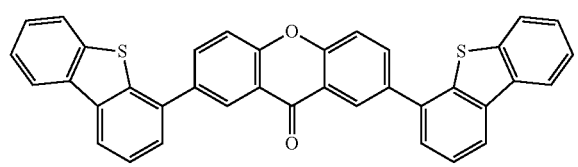

EM28
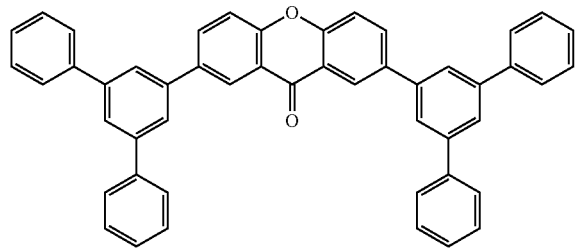

EM29
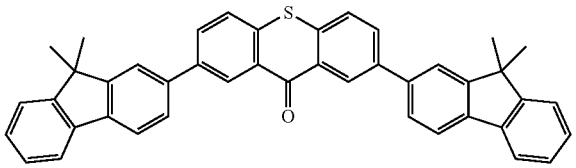

EM30
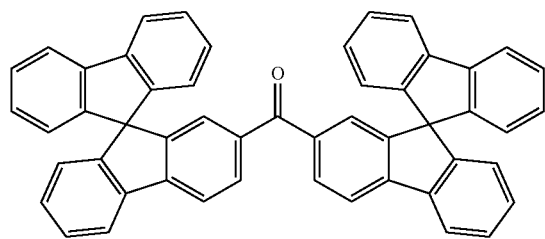

EM31
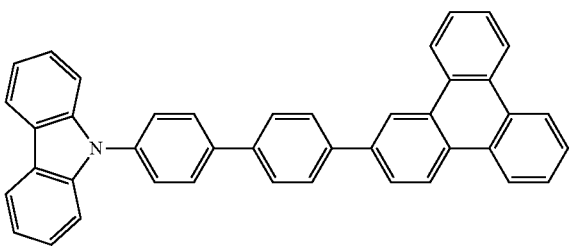

EM32
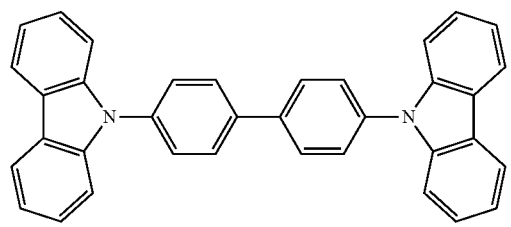

EM33
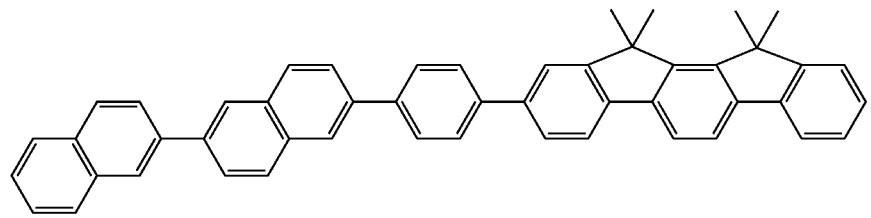

The electron transporting material can be freely selected from those materials which can transport electrons injected from the negative electrode to the light emitting layer, and the selection is made by considering, for example, the balance with the hole mobility of the hole transporting material. Examples of the material that has an electron transporting property include oxadiazole derivatives, oxazole derivatives, pyrazine derivatives, triazole derivatives, triazine derivatives, quinoline derivatives, quinoxaline derivatives, phenanthroline derivatives, organoaluminum complexes, and fused ring compounds (for example, fluorene derivatives, naphthalene derivatives, chrysene derivatives, and anthracene derivatives). The aforementioned electron transporting materials are also suitable for use in a hole blocking layer.

Although specific examples of the compounds used as the electron transporting material are described below, these examples are not limiting.

HT1
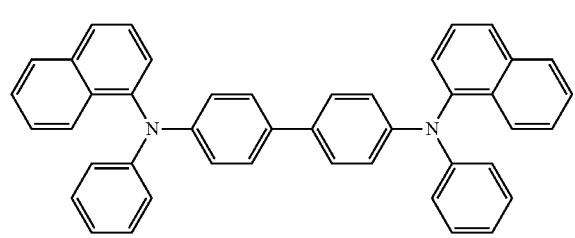
HT2
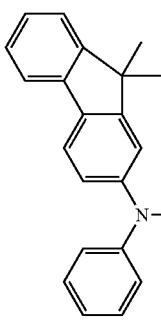
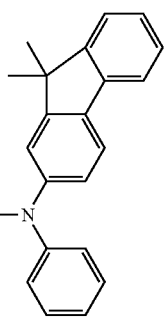
HT3
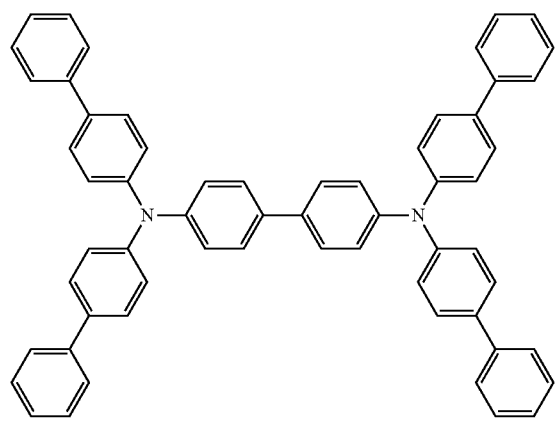
HT4
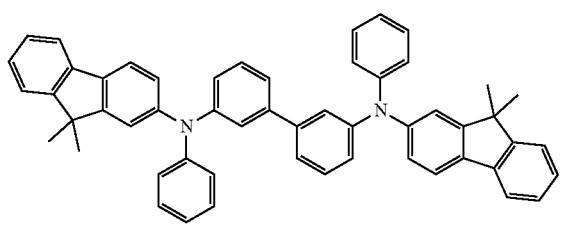
HT5
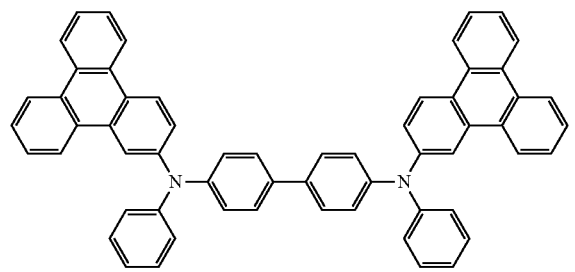
HT6
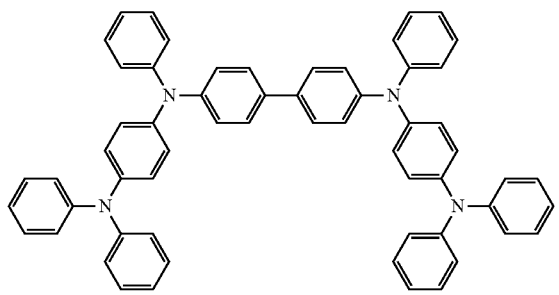
HT7
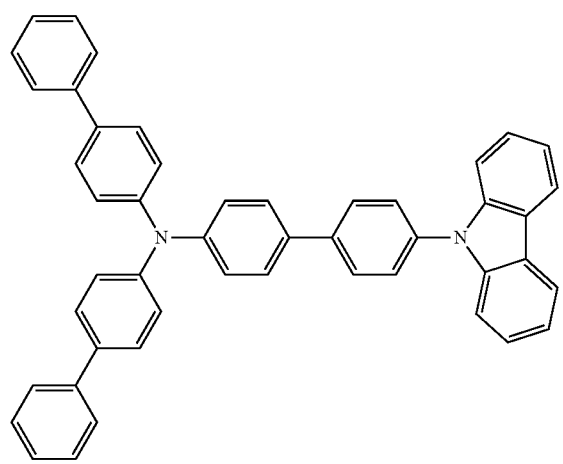
HT8
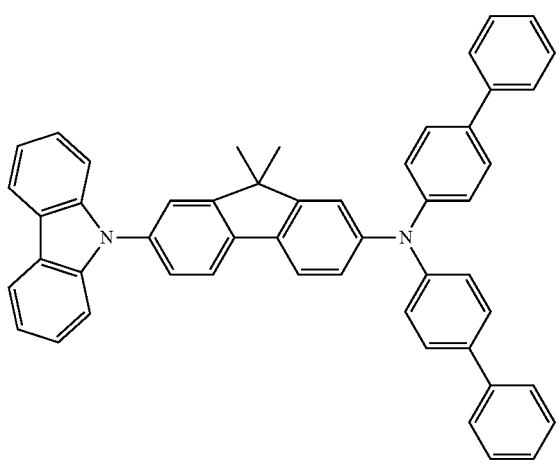

-continued
HT9
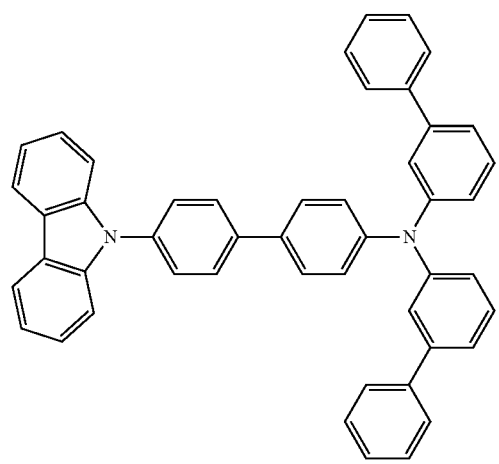
HT10
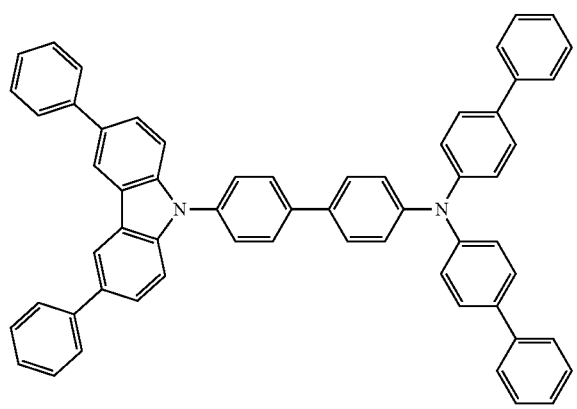
HT11
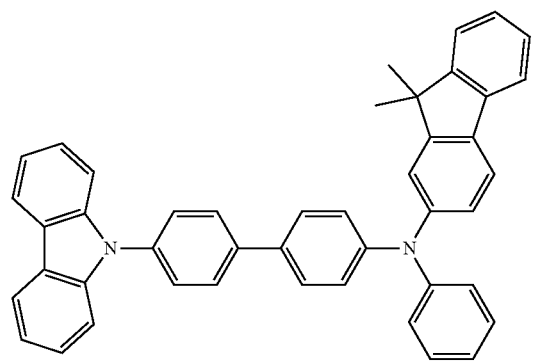
HT12
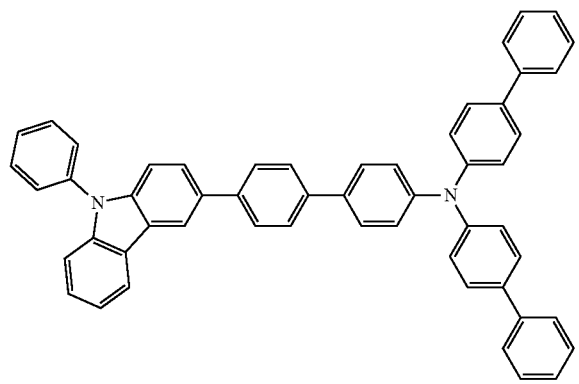
HT13
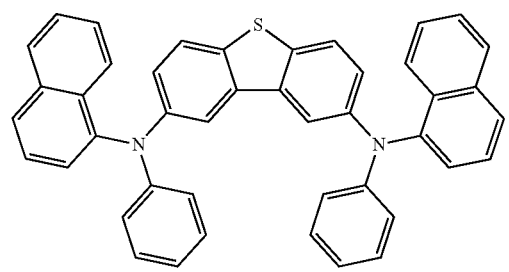
HT14
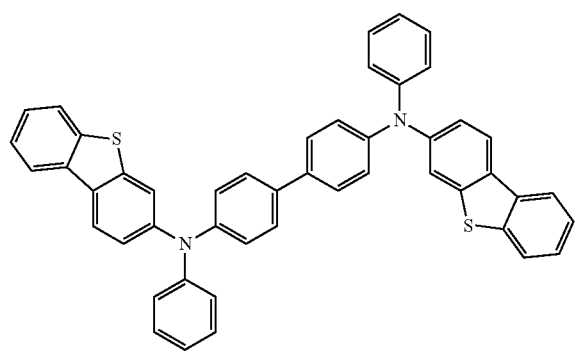

-continued

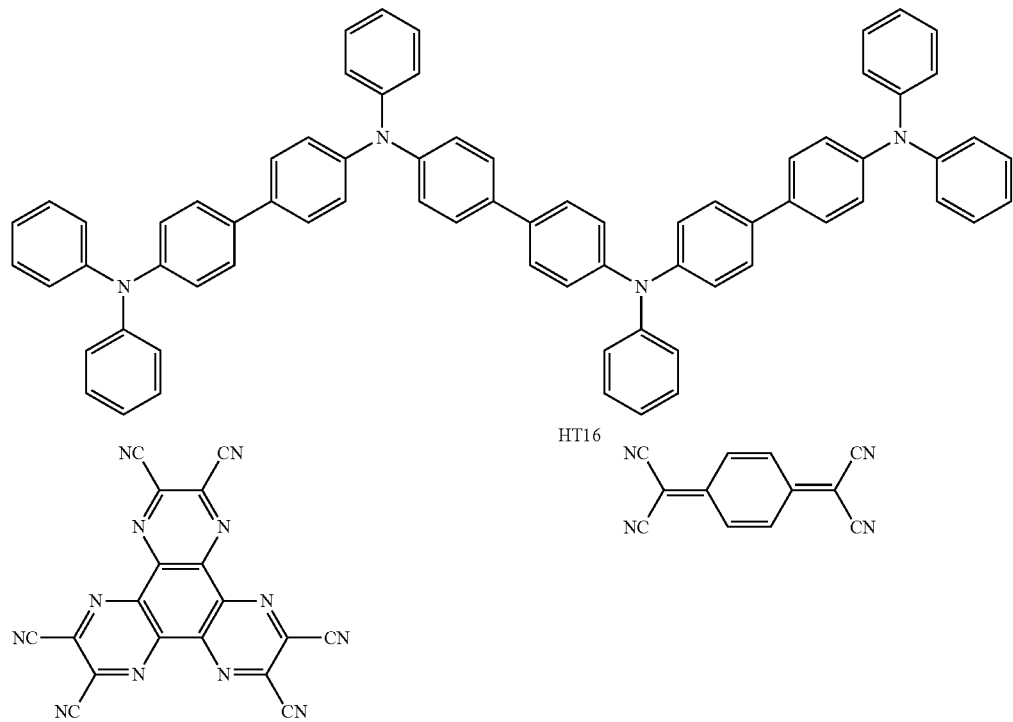

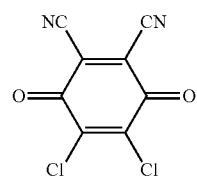

The electron injecting material can be freely selected from those materials which can easily inject electrons from the negative electrode, and the selection is made by considering, for example, the balance with the hole injectability. Other examples of the organic compound include n-type dopants and reducing dopants. Examples thereof include alkali metal-containing compounds such as lithium fluoride, lithium complexes such as lithium quinolinol, benzimidazolidene derivatives, imidazolidene derivatives, fluvalene derivatives, and acridine derivatives.

Structure of Organic Light Emitting Device

The organic light emitting device is produced by forming a first electrode, an organic compound layer, and a second electrode on an insulating layer on a substrate. A protection layer, a color filter, etc., may be disposed on the second electrode. When a color filter is formed, a planarization layer may be formed between the color filter and the protection layer. The planarization layer can be formed of an acrylic resin or the like. One of the first electrode and the second electrode may be a positive electrode while the other may be a negative electrode.

Substrate

Examples of the substrate include those made of quartz, glass, a silicon wafer, a resin, a metal, or the like. Furthermore, switching elements such as transistors and wires may be formed on the substrate, and an insulating layer may be formed thereon. The insulating layer may be formed of any material as long as a contact hole for securing conduction between the positive electrode and the wire can be formed therein and as long as the material can provide isolation from the wires not to be connected. Examples of the material include resins such as polyimide, silicon oxide, and silicon nitride.

Electrodes

A pair of electrodes can be used as the electrodes. The pair of electrodes may be a positive electrode and a negative electrode. When an electric field is applied in a direction in which the organic light emitting device emits light, the electrode with a high potential is the positive electrode, and the other electrode is the negative electrode. To put it differently, the electrode that supplies holes to the light emitting layer is the positive electrode, and the electrode that supplies electrons is the negative electrode.

The material constituting the positive electrode can have a work function as large as possible. Examples of the material include single metal elements such as gold, platinum, silver, copper, nickel, palladium, cobalt, selenium, vanadium, and tungsten, mixtures thereof, and alloys constituted by any combination thereof, and metal oxides such as tin oxide, zinc oxide, indium oxide, indium tin oxide (ITO), and indium zinc oxide. Furthermore, conductive polymers such as polyaniline, polypyrrole, and polythiophene can also be used.

These electrode substances may be used alone or in combination. The positive electrode may be constituted by one layer or two or more layers.

When the electrode is used as a reflective electrode, chromium, aluminum, silver, titanium, tungsten, molybdenum, an alloy thereof, a multilayer structure thereof, etc., can be used. When the electrode is used as a transparent electrode, a transparent oxide conductive layer such as an indium tin oxide (ITO) or indium zinc oxide layer can be used, but this is not limiting. The electrodes can be formed by photolithography.

The material constituting the negative electrode can have a small work function. Examples thereof include alkali metals such as lithium, alkaline earth metals such as calcium, metal single elements such as aluminum, titanium, manganese, silver, lead, and chromium, and mixtures containing these metals. Alloys constituted by any combination of these metal single elements can also be used. Examples of the alloys include magnesium-silver, aluminum-lithium, aluminum-magnesium, silver-copper, and zinc-silver. Metal oxides such as indium tin oxide (ITO) can also be used. These electrode substances may be used alone or in combination. The negative electrode may have a single layer structure or a multilayer structure. In particular, silver can be used, and a silver alloy is yet more preferable since aggregation of silver is suppressed. The alloying ratio may be any as long as aggregation of silver can be suppressed. For example, the ratio may be 1:1.

The negative electrode is not particularly limited. For example, an oxide conductive layer such as ITO may be used as the negative electrode to form a top emission device, or a reflective electrode such as aluminum (Al) may be used to form a bottom emission device. The negative electrode forming method is not particularly limited, but a DC or AC sputtering method or the like offers good film coverage and decreased resistance.

Protection Layer

A protection layer may be disposed on the negative electrode. For example, penetration of water and the like into the organic compound layer can be reduced and occurrence of display failures can be reduced by bonding, on the negative electrode, a glass having a moisture absorbing agent. In another embodiment, a passivation film such as silicon nitride may be formed on the negative electrode to reduce penetration of water and the like into the organic compound layer. For example, after forming the negative electrode, the negative electrode may be transferred to another chamber without breaking the vacuum, and a protection layer may be formed thereon by forming a silicon nitride film having a thickness of 2 µm by a CVD method.

A protection layer may be formed by an atomic layer deposition method (ALD method) after the film deposition by a CVD method.

Color Filter

A color filter may be formed on the protection layer. For example, a color filter that takes into account the size of the organic light emitting device may be disposed on a different substrate, and this substrate may be bonded to a substrate having the organic light emitting device thereon; alternatively, a color filter may be formed on the aforementioned protection layer by photolithographic patterning. The color filter may be formed of a polymer.

Planarization Layer

A planarization layer may be formed between the color filter and the protection layer. The planarization layer may be formed of an organic compound and may have a low molecular weight or high molecular weight. The planarization layer can have a high molecular weight.

The planarization layer may be formed both above and under the color filter, and such two planarization layers may be composed of the same material. Specific examples of the material include polyvinylcarbazole resins, polycarbonate resins, polyester resins, ABS resins, acrylic resins, polyimide resins, phenolic resins, epoxy resins, silicone resins, and urea resins.

Opposite Substrate

An opposite substrate may be disposed on the planarization layer. The opposite substrate is referred to as such since this substrate is located at a position opposite of the aforementioned substrate. The opposite substrate may be composed of the same material as the aforementioned substrate. When the aforementioned substrate is defined as a first substrate, the opposite substrate may be defined as a second substrate.

Formation of Organic Compound Layers

Organic compound layers (hole injection layer, hole transport layer, electron blocking layer, light emitting layer, hole blocking layer, electron transport layer, electron injection layer, etc.) constituting the organic light emitting device according to one embodiment of the present disclosure are formed by the methods described below.

The organic compound layers constituting the organic light emitting device according to one embodiment of the present disclosure can be formed by a dry process, such as a vacuum deposition method, an ionized deposition method, sputtering, or plasma. Instead of the dry process, a wet process involving forming a layer by dissolving materials in an appropriate solvent and performing a known coating method (for example, spin coating, dipping, casting, LB method, an ink jet method, etc.) can be employed.

When a layer is formed by a vacuum deposition method, a solution coating method, or the like, crystallization rarely occurs, and stability over time is excellent. When a film is formed by a coating method, materials can be combined with an appropriate binder resin to form a film.

Specific examples of the binder resin include, but are not limited to, polyvinylcarbazole resins, polycarbonate resins, polyester resins, ABS resins, acrylic resins, polyimide resins, phenolic resins, epoxy resins, silicone resins, and urea resins.

Regarding these binder resins, one resin may be used alone as a homopolymer or a copolymer, or two or more resins may be used as a mixture. If needed, known additives such as plasticizers, oxidation inhibitors, ultraviolet absorbents, and the like can be used in combination.

Usage of Organic Light Emitting Device According to One Embodiment of the Present Disclosure The organic light emitting device according to one embodiment of the present disclosure can be used as a constituent member of a display apparatus or a lighting apparatus. In addition, the organic light emitting device finds usage in an exposure light source of an electrophotographic image forming apparatus, a backlight of a liquid crystal display apparatus, and a light emitting device formed of a white light source and a color filter.

The display apparatus may be an image information processing apparatus that has an image input section to which image information is input from an area CCD, a linear CCD, a memory card, or the like, and an information processing section that processes the input information and that displays the input image in a display section.

The display section of an imaging apparatus or an ink jet printer may have a touch panel function. The drive system of the touch panel function may be an infrared radiation system, an electrostatic capacitance system, a resistance film system, or an electromagnetic induction system, and is not particularly limited. The display apparatus may be used in a display section of a multifunctional printer.

Next, a display apparatus according to this embodiment is described with reference to the drawings.

FIG. 1A is a schematic cross-sectional view of one example of a pixel constituting the display apparatus of this embodiment. A pixel has subpixels 10. The subpixels are categorized into 10R, 10G, and 10B according to their emission. The emission color may be distinguished on the basis of the wavelength emitted from the light emitting layer, or the light emitted from the subpixel may undergo selective transmission or color conversion through a color filter or the like. Each of the subpixels has, on an interlayer insulating layer 1, a reflective electrode 2 serving as a first electrode, an insulating layer 3 covering ends of the reflective electrode 2, an organic compound layer 4 covering the first electrode and the insulating layer, a transparent electrode 5, a protection layer 6, and a color filter 7.

The interlayer insulating layer 1 may have transistors and capacitor elements arranged in a layer thereunder or an interior thereof. A transistor and the first electrode may be electrically connected through a contact hole or the like not illustrated in the drawings.

The insulating layer 3 is also called a bank or a pixel isolation film. The insulating layer 3 covers ends of the first electrode and surrounds the first electrode. The portion where the insulating layer is not disposed is in contact with the organic compound layer 4 and serves as a light emitting region.

The organic compound layer 4 has a hole injection layer 41, a hole transport layer 42, a first light emitting layer 43, a second light emitting layer 44, and an electron transport layer 45.

The second electrode 5 may be a transparent electrode, a reflective electrode, or a semi-transparent electrode.

The protection layer 6 reduces penetration of moisture into the organic compound layer. Although the protection layer 6 is illustrated as a single layer in the drawing, the protection layer 6 may be a multilayer layer. An inorganic compound layer and an organic compound layer may be provided for each layer.

The color filters 7 are categorized into 7R, 7G, and 7B according to their colors. The color filters may be formed on a planarizing film not illustrated in the drawings. Furthermore, a resin protection layer not illustrated in the drawing may be disposed on the color filter. The color filter may be formed on the protection layer 6. Alternatively, the color filter may be formed on an opposite substrate such as a glass substrate, and then bonded.

Figure 1B:
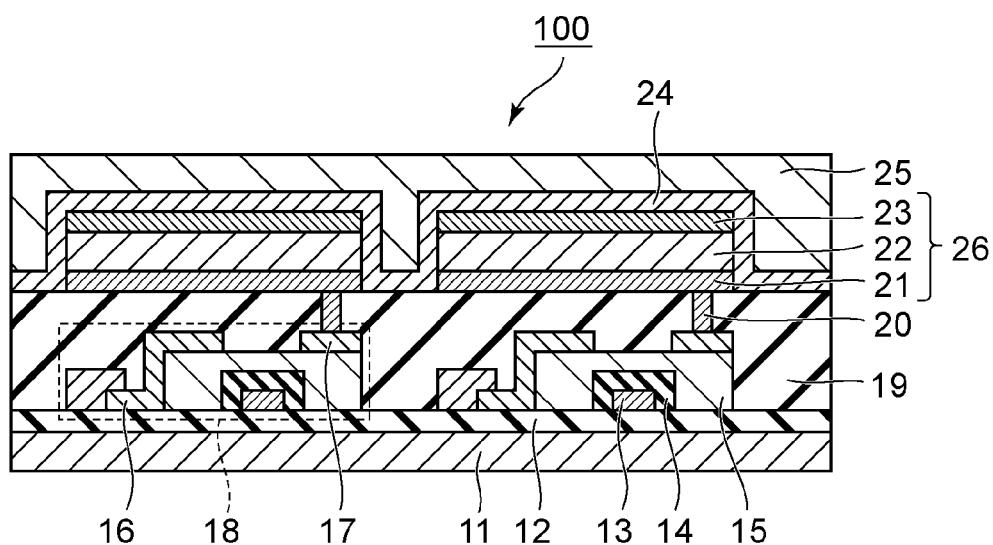
FIG. 1B is a schematic cross sectional view of one example of a display apparatus that uses an organic light emitting device according to one embodiment of the present disclosure.

FIG. 1B is a schematic cross-sectional view of an example of a display apparatus that has an organic light emitting device and a transistor connected to this organic light emitting device. The transistor is one example of an active element. The transistor may be a thin film transistor (TFT).

A display apparatus 100 illustrated in FIG. 1B includes a substrate 11 such as glass or silicon, and an insulating layer 12 on top of the substrate 11. An active element 18, such as a TFT, is disposed on the insulating layer, and a gate electrode 13, a gate insulating film 14, and a semiconductor layer 15 of an active element are disposed on the insulating layer. The TFT 18 is constituted by the semiconductor layer 15, a drain electrode 16, and a source electrode 17. An insulating film 19 is disposed on the TFT 18. A positive electrode 21 constituting the organic light emitting device and the source electrode 17 are connected to each other through a contact hole 20 formed in the insulating film.

The system of the electrical connection between the electrodes (positive and negative electrodes) included in the organic light emitting device and the electrodes (source and drain electrodes) included in the TFT is not limited to the type illustrated in FIG. 1B. In other words, it is sufficient if one of the positive and negative electrodes is electrically connected to one of the source and drain electrodes of the TFT. Here, the TFT indicates a thin film transistor.

Although the organic compound layer in the display apparatus 100 is illustrated as one layer in FIG. 1B, the organic compound layer 22 may be multilayered. A first protection layer 24 and a second protection layer 25 for reducing deterioration of the organic light emitting device are formed on the negative electrode 23.

Although a transistor is used as the switching element in the display apparatus 100 illustrated in FIG. 1B, a different switching element may be used instead.

Moreover, the transistor used in the display apparatus 100 illustrated in FIG. 1B is not limited to a transistor that uses a single-crystal silicon wafer and may be a thin film transistor that has an active layer on an insulating surface of a substrate. Examples of the active layer include layers of single-crystal silicon, non-single-crystal silicon such as amorphous silicon and microcrystalline silicon, and non-single-crystal oxide semiconductors such as indium zinc oxide and indium gallium zinc oxide. The thin film transistor is also referred to as a TFT element.

The transistor included in the display apparatus 100 illustrated in FIG. 1B may be formed inside a substrate such as a Si substrate. Here, "formed inside a substrate" means that a substrate, such as a Si substrate, itself is processed to form a transistor. In other words, having a transistor inside a substrate can also be considered as integrating a substrate and a transistor.

With the organic light emitting device of this embodiment, the emission luminance is controlled by a TFT, which is one example of the switching element, and an image formed of respective emission luminance levels can be displayed by providing the organic light emitting devices in multiple surfaces. The switching element according to this embodiment is not limited to a TFT, and may be a transistor formed of low-temperature polysilicon or an active matrix driver formed on a substrate such as a Si substrate. The phrase "on a substrate" can also be referred to as "in a substrate". Whether to form a transistor in a substrate or use a TFT is selected on the basis of the size of the display section, and, for example, when the size is about 0.5 inches, organic light emitting devices can be formed on a Si substrate.

Figure 2:
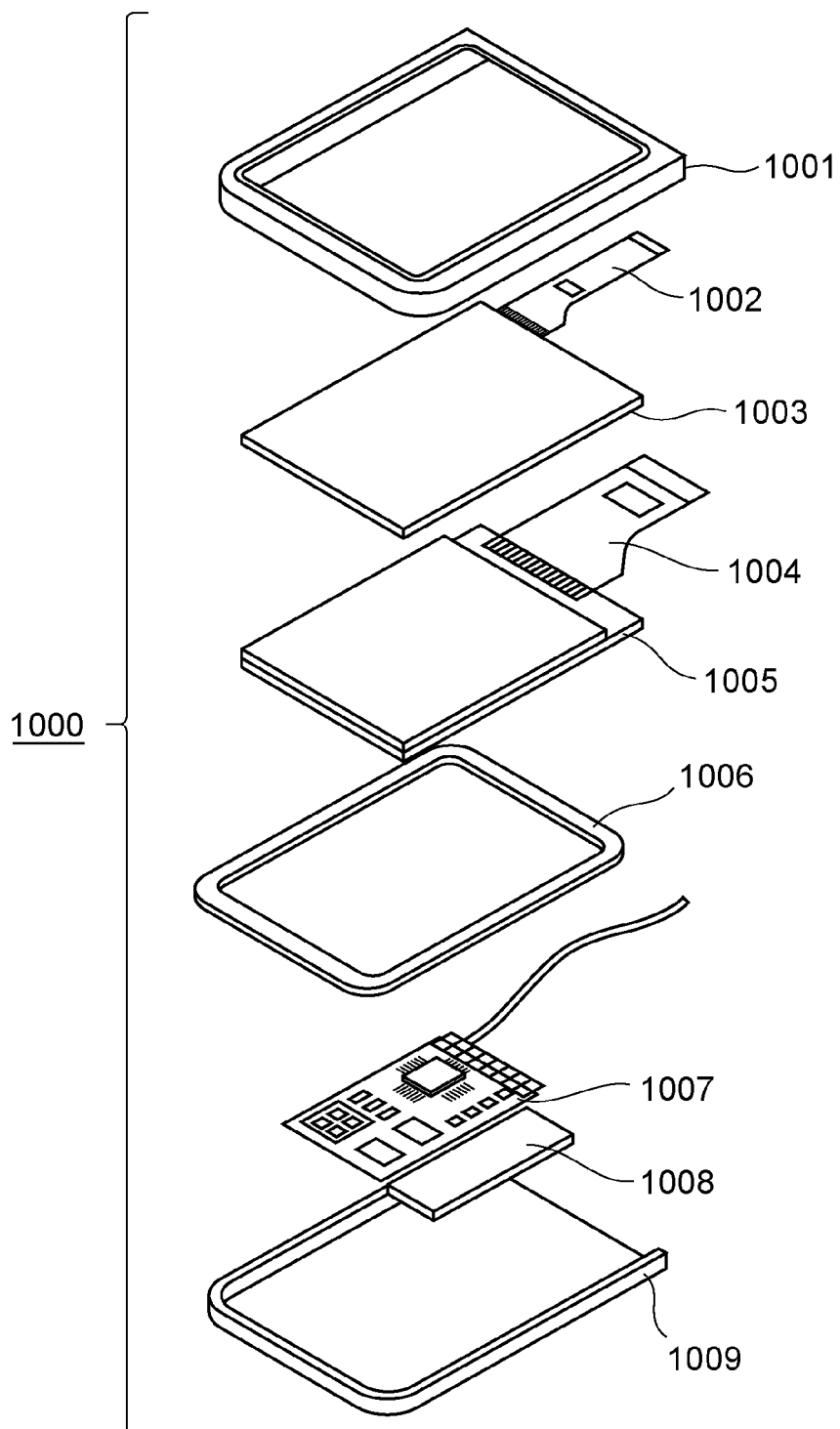
FIG. 2 is a schematic view of one example of a display apparatus that uses an organic light emitting device according to one embodiment of the present disclosure.

FIG. 2 is a schematic view of one example of a display apparatus according to this embodiment. A display apparatus 1000 may include an upper cover 1001, a lower cover 1009, a touch panel 1003 between these covers, a display panel 1005, a frame 1006, a circuit substrate 1007, and a battery 1008. The touch panel 1003 and the display panel 1005 are connected to a flexible print circuit FPC 1002 and 1004. Transistors are printed onto the circuit substrate 1007. The battery 1008 may be omitted if the display apparatus is not a portable appliance, or may be provided at a different position even if the display apparatus is a portable appliance.

The display apparatus of this embodiment may include color filters having red, green, and blue colors. The color filters may be arranged in a red, green, and blue delta array.

The display apparatus of this embodiment may be used in a display section of a portable terminal. Here, the display apparatus may have both a display function and an operation function. Examples of the portable terminal include mobile phones such as smart phones, tablets, and head mount displays.

The display apparatus of this embodiment may be used in a display section of an imaging apparatus that has an optical section having multiple lenses and an imaging device that receives light that has passed through the optical section. The imaging apparatus may have a display section that displays information acquired by the imaging device. Furthermore, the display section may be exposed outside the imaging apparatus or may be disposed inside a finder. The imaging apparatus may be a digital camera or a digital camcorder. The imaging apparatus can also be called a photoelectric conversion apparatus.

Figure 3A:
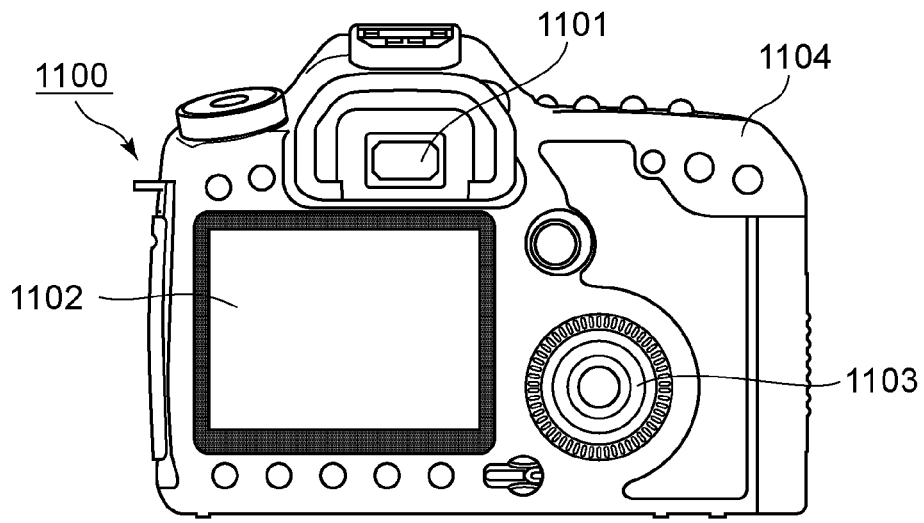
FIG. 3A is a schematic view of one example of an imaging apparatus according to one embodiment of the present disclosure.

FIG. 3A is a schematic view of one example of an imaging apparatus according to this embodiment. An imaging apparatus 1100 may include a view finder 1101, a rear surface display 1102, an operation section 1103, and a casing 1104. The view finder 1101 may have a display apparatus according to this embodiment. In such a case, the display apparatus may display not only the image taken but also environment information, imaging instructions, etc. The environment information may include the intensity and direction of external light, the moving speed of an object, and the possibility that the object is shielded by a shielding material.

Since the timing suitable for imaging is very short, it is better to display information as quickly as possible. Thus, a display apparatus that uses the organic light emitting device of the present disclosure can be used. This is because the organic light emitting device has high response speed. Compared to a liquid crystal display apparatus, the display apparatus that uses the organic light emitting device is suitable for use in those apparatuses which require speedy display.

The imaging apparatus 1100 includes an optical section not illustrated in the drawing. The optical section includes multiple lenses that perform focusing on the imaging device housed in the casing 1104. The lenses can adjust the focal point by adjusting their relative position. This operation can be performed automatically.

Figure 3B:
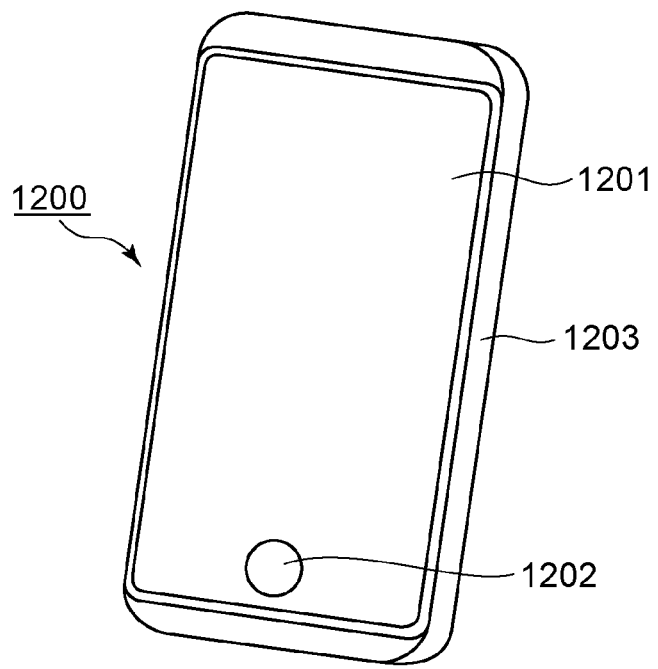
FIG. 3B is a schematic view of one example of a portable appliance according to one embodiment of the present disclosure.

FIG. 3B is a schematic view of one example of electronic equipment according to this embodiment. Electronic equipment 1200 includes a display section 1201, an operation section 1202, and a casing 1203. The casing 1203 may include a circuit, a print substrate having the circuit, a battery, and a communication section. The operation section 1202 may be a button or a touch panel-type responsive section. The operation section may be a biometric section that recognizes fingerprints to perform unlocking etc. The electronic equipment that includes a communication section can also be called communication equipment. The electronic equipment may further include lenses and an imaging device so as to further have a camera function. The image captured by the camera function is displayed in the display section. Examples of the electronic equipment include smart phones and laptop computers.

Figure 4A:
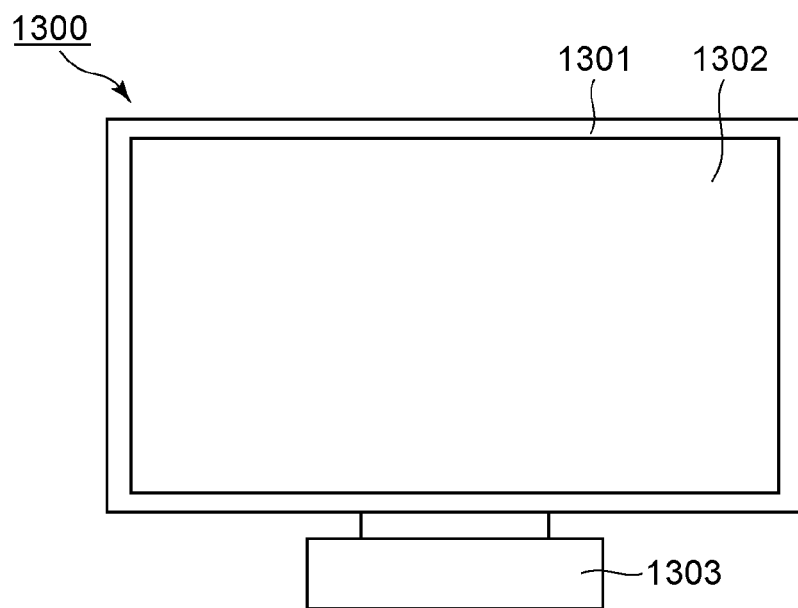
FIG. 4A is a schematic view of one example of a display apparatus according to one embodiment of the present disclosure.
Figure 4B:
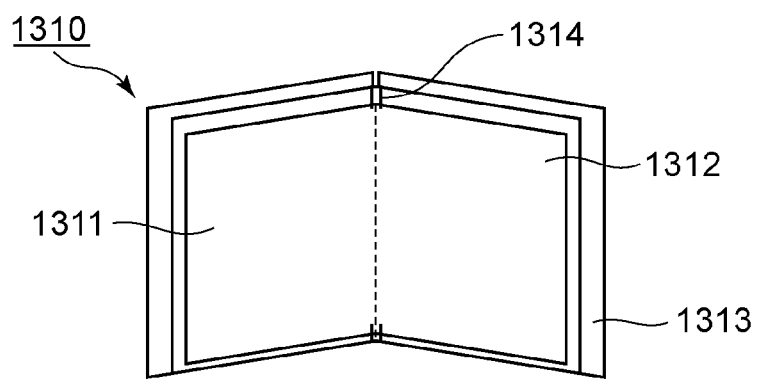
FIG. 4B is a schematic view of one example of a bendable display apparatus.

FIGS. 4A and 4B are schematic views of some examples of the display apparatus according to this embodiment. FIG. 4A is a display apparatus such as a television monitor and a PC monitor. A display apparatus 1300 includes a frame 1301 and a display section 1302. The light emitting device of the embodiment may be used in the display section 1302.

The display apparatus 1300 also includes a base 1303 that supports the frame 1301 and the display section 1302. The base 1303 is not limited to the form illustrated in FIG. 4A. The lower side of the frame 1301 may also serve as a base.

The frame 1301 and the display section 1302 may be curved. The radius of curvature thereof may be 5000 mm or more and 6000 mm or less.

FIG. 4B is a schematic view of another example of the display apparatus according to this embodiment. A display apparatus 1310 illustrated in FIG. 4B is bendable and is a foldable display apparatus. The display apparatus 1310 includes a first display section 1311, a second display section 1312, a casing 1313, and an inflection point 1314. The first display section 1311 and the second display section 1312 may each include a light emitting device of the embodiment. The first display section 1311 and the second display section 1312 may constitute a single seamless display apparatus. The first display section 1311 and the second display section 1312 can be separated at the inflection point. The first display section 1311 and the second display section 1312 may respectively display different images or may together display one image.

Figure 5A:
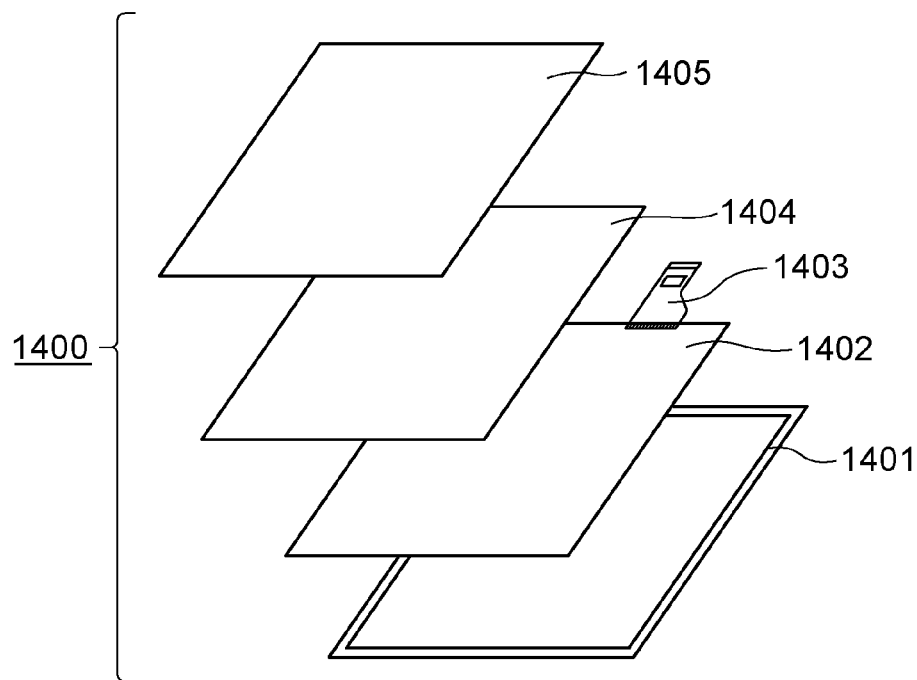
FIG. 5A is a schematic view of one example of a lighting apparatus according to one embodiment of the present disclosure.

FIG. 5A is a schematic view of one example of a lighting apparatus according to this embodiment. A lighting apparatus 1400 may include a casing 1401, a light source 1402, a circuit substrate 1403, an optical film 1404, and a light diffusing section 1405. The light source may include the organic light emitting device of the embodiment. The optical filter may be a filter that improves the color rendering properties of the light source. The light diffusing section can effectively diffuse the light from the light source, such as lighting up, and can deliver the light to a wide area. The optical filter and the light diffusing section may be disposed on the light emitting side of the lighting. If needed, a cover may be installed as the outermost section.

The lighting apparatus is, for example, an apparatus that illuminates a room. The lighting apparatus may emit light of a color such as white, natural white, or any color from blue to red. The lighting apparatus may additionally include a light modulating circuit that modulates light. The lighting apparatus may include the organic light emitting device of the present disclosure and a power supply circuit connected thereto. The power supply circuit is a circuit that convers AC voltage to DC voltage. Moreover, white is a color having a color temperature of 4200 K and the natural white is a color having a color temperature of 5000 K. The lighting apparatus may include a color filter.

The lighting apparatus of this embodiment may include a heat releasing section. The heat releasing section releases the heat inside the apparatus to the outside of the apparatus, and examples thereof include metals having high specific heat and liquid silicon.

Figure 5B:
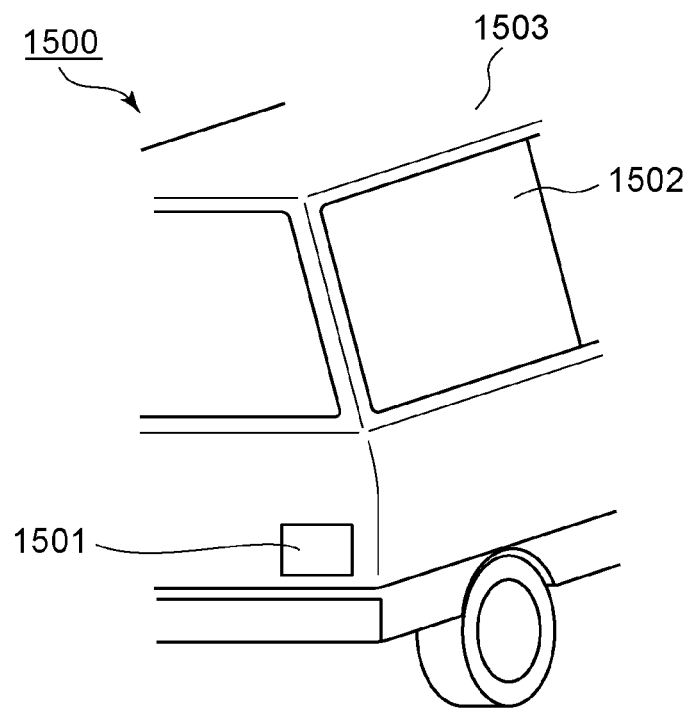
FIG. 5B is a schematic view of a vehicle, which is one example of a moving body according to one embodiment of the present disclosure.

FIG. 5B is a schematic view of a vehicle, which is one example of a moving body according to the embodiment. The vehicle has a tail lamp, which is an example of a lamp fixture. A vehicle 1500 includes a tail lamp 1501, and may be configured to turn on the tail lamp when breaking operation or the like is performed.

The tail lamp 1501 may include the organic light emitting device of the embodiment. The tail lamp may include a protection member that protects the organic light emitting device. The protection member may be formed of any material that has a sufficiently high strength and is transparent, and can be formed of a polycarbonate or the like. The polycarbonate may be mixed with a furandicarboxylic acid derivative, an acrylonitrile derivative, or the like.

The vehicle 1500 may include a vehicle body 1503 and a window 1502 installed thereto. The window may be a transparent display unless the window is for checking the front and back of the vehicle. This transparent display may include the organic light emitting device of the embodiment. In such a case, the constituent materials of the electrode of the organic light emitting device and the like are formed of transparent members.

The moving body of this embodiment may be a ship, an aircraft, a drone, or the like. The moving body may include a body and a lamp fixture installed to the body. The lamp fixture may emit light to indicate the position of the body. The lamp fixture includes the organic light emitting device of the embodiment.

As has been described heretofore, by using an apparatus that uses the organic light emitting device of this embodiment, a high quality image display that is stable over a long time is enabled.

EXAMPLES

The examples will now be described. Note that the present disclosure is not limited by the following examples.

Synthesis Example 1

Synthesis of Compound (16)

A compound (16) was synthesized through the following procedure. First, synthesis of ligands is described.

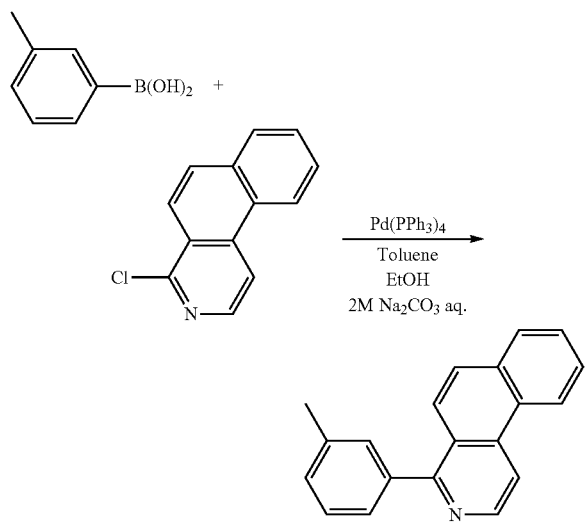

In a nitrogen atmosphere, 1.36 g of 3-methylphenylboronic acid, 2.14 g of 4-chlorobenzo[f]isoquinolin, 0.38 g of tetrakistriphenylphosphinepalladium, 15 ml of toluene, 7.5 ml of ethanol, and 15 ml of a 2 M aqueous sodium carbonate solution were added to a 100 ml round bottomed flask. The temperature was elevated from room temperature to 90° C., and stirring was performed for 16 hours and 30 minutes. To the resulting mixture, toluene and water was added, the organic layer was separated and dried over anhydrous magnesium sulfate. After filtration and concentration, the residue was purified by column chromatography using chloroform as eluent followed by recrystallization using heptane. 2.288 g of the desired ligand was obtained. The structure was identified by $^1$H NMR and GC-MS.

Next, synthesis of a chloro-bridged dimer is described.

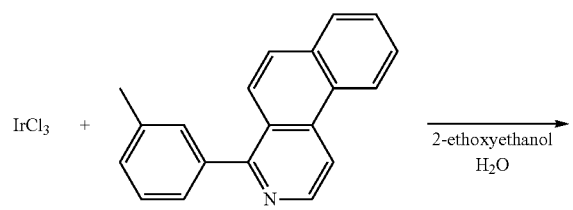

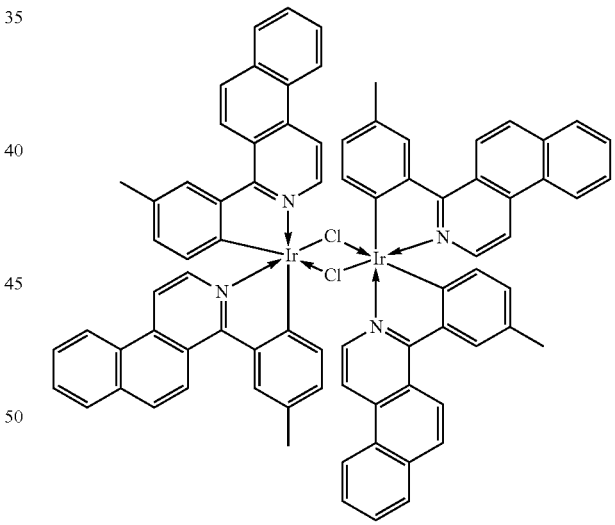

In a nitrogen atmosphere, 1.36 g of iridium chloride, 2.288 g of the ligands, 30 ml of 2-ethoxyethanol, and 15 ml of water were added to a 100 ml round bottomed flask. The temperature was elevated from room temperature to 120° C., and stirring was performed for 20 hours. Water was added to the resultant product, and suction filtration was performed. The resulting product was re-dispersed in ethanol and washed. To the resulting product, toluene was added, the temperature was elevated to 100° C., and after cooling, filtration was conducted to obtain 2.65 g of a chloro-bridged dimer. The structure was identified by $^1$H NMR.

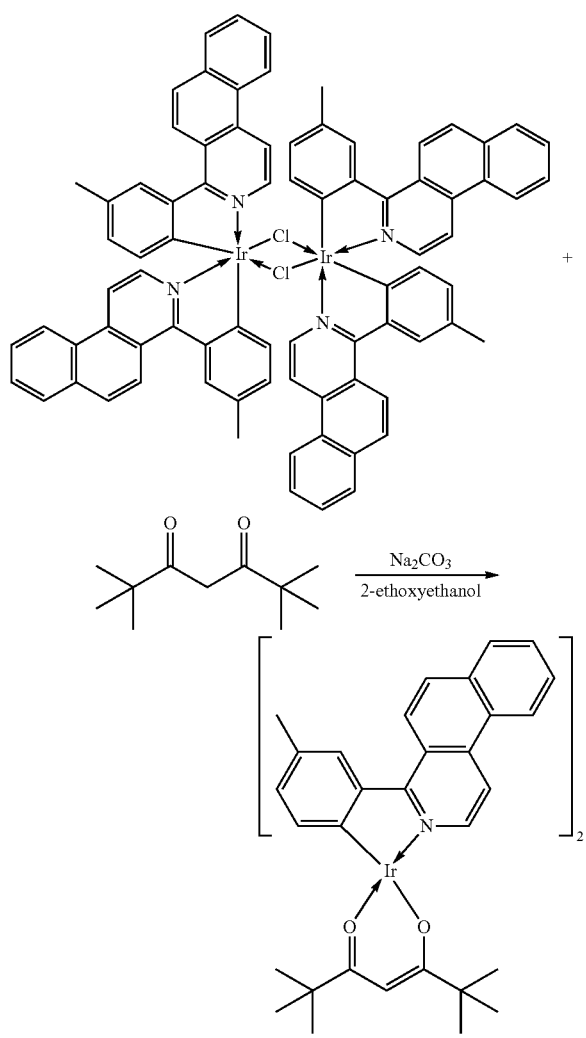

Compound (16)

In a nitrogen atmosphere, 1.3 g of the chloro-bridged dimer, 0.45 g of sodium carbonate, 1045 μl of 2,2,6,6-tetramethylheptane-3,5-dione, and 40 ml of 2-ethoxyethanol were added to a 100 ml round bottomed flask. The temperature was elevated from room temperature to 120° C., and stirring was performed for 13 hours. Water and ethanol were added to the resultant product, and suction filtration was performed. Thereto, the residue was dissolved in chlorobenzene, filtered on celite, and the filtrate was concentrated. After repeat dispersion-wash with methanol, 0.73 g of compound (16) was obtained as a red powder. The structure was identified by $^1$H NMR and MALDI-TOF-MS. Furthermore, obtained powder was suggested to be of the HNT type in X-ray crystal structure analysis.

The composition ratio of the composition containing the compound (16) obtained in Synthesis Example 1 was measured by the following procedure. In a 1 mL of dichloromethane, 1 mg of the red powder obtained in Synthesis Example 1 was dissolved, and the composition ratio was measured by HPLC, which found the following composition ratio. Since LC-MS confirmed that the two substances have the same molecular weight, that the contained substance is the isomer was confirmed.

Compound (16): 98.5%, isomer: 1.4%
Conditions of HPLC measurement
Column: ODS-SP 5 μm, 4.6*150 mm
Mobile phase: methanol
Flow rate: 1.0 mL/min The retention time of the compound (16) was 6.1 min, and the retention time of the isomer was 5.6 min. Since LC-MS confirmed that the two substances have the same molecular weight, the isomer was confirmed.

Synthesis Example 2

Synthesis of Compound (19)

The compound (19) was synthesized as in Synthesis Example 1 except that 3-tert-butylphenylboronic acid was used instead of 3-methylphenylboronic acid. The structure was identified by $^1$H NMR and MALDI-TOF-MS. Furthermore, the HNT type was suggested in X-ray crystal structure analysis.

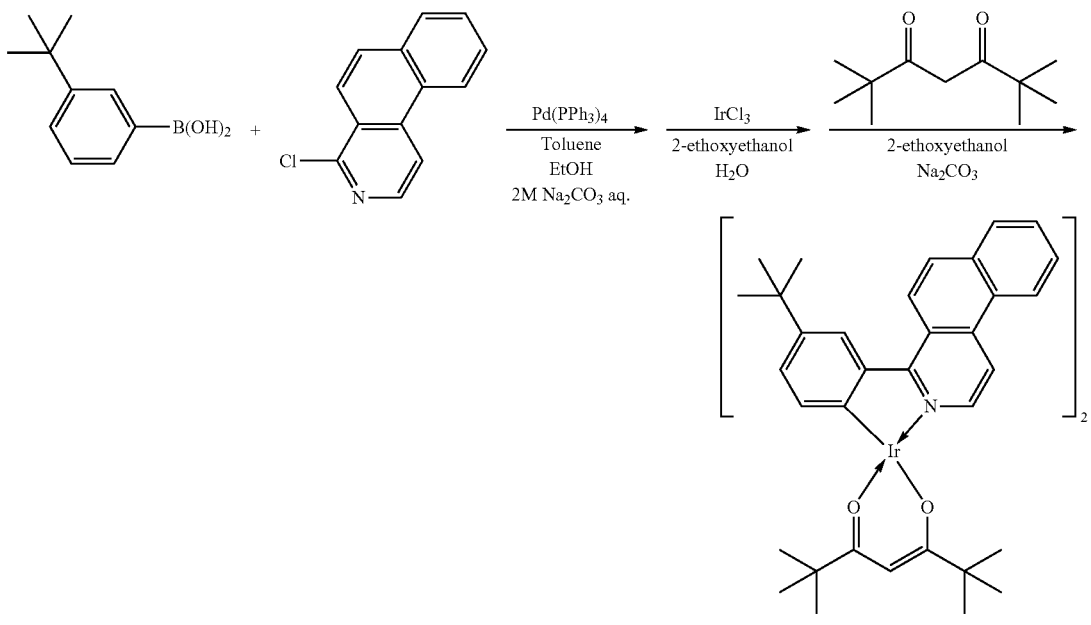

Compound 19

The composition ratio of the composition containing the compound (19) obtained in Synthesis Example 2 was measured as in Synthesis Example 1, which found the following composition ratio. Since LC-MS confirmed that the two substances have the same molecular weight, that the contained substance is the isomer was confirmed. Compound (19): 98.9%, isomer: 1.1%

Synthesis Example 3

Synthesis of Compound (24)

The compound (24) was synthesized as in Synthesis Example 1 except that 3-isopropylphenylboronic acid was used instead of 3-methylphenylboronic acid. The structure was identified by $^1$H NMR and MALDI-TOF-MS. Furthermore, the HNT type was suggested in X-ray crystal structure analysis.

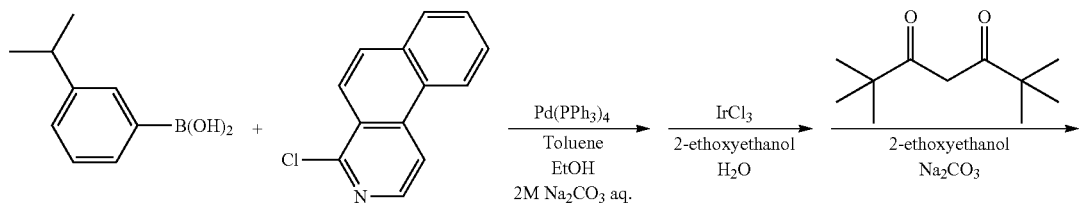

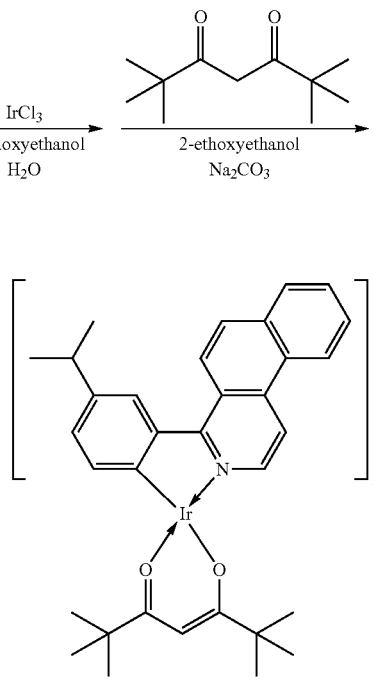

Compound (24)

The composition ratio of the composition containing the compound (24) obtained in Synthesis Example 3 was measured as in Synthesis Example 1, which found the following composition ratio. Since LC-MS confirmed that the two substances have the same molecular weight, that the contained substance is the isomer was confirmed. Compound (24): 98.5%, isomer: 1.3%

Synthesis Example 4

Synthesis of Compound (29)

The compound (29) was synthesized as in Synthesis Example 1 except that 4-biphenylboronic acid was used instead of 3-methylphenylboronic acid. The structure was identified by $^1$H NMR and MALDI-TOF-MS. Furthermore, the HNT type was suggested in X-ray crystal structure analysis.

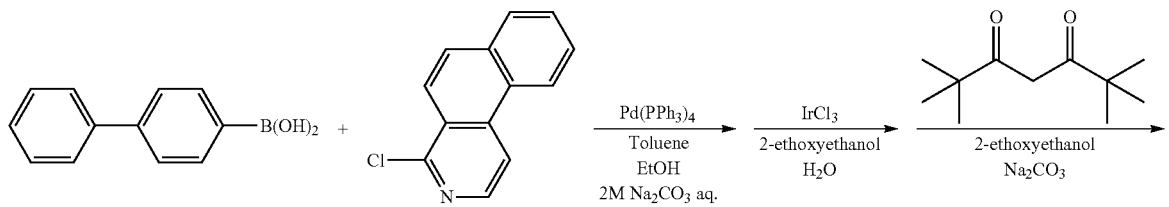

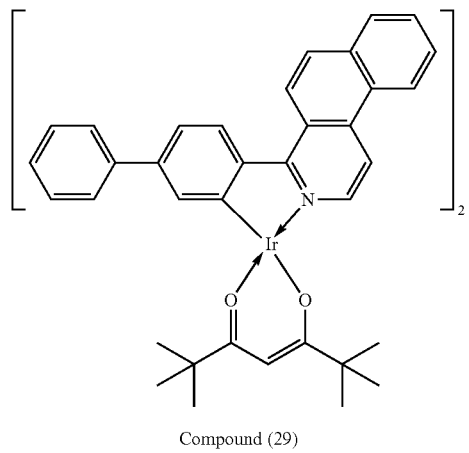

Compound (29)

The composition ratio of the composition containing the compound (29) obtained in Synthesis Example 4 was measured as in Synthesis Example 1, which found the following composition ratio. Since LC-MS confirmed that the two substances have the same molecular weight, that the contained substance is the isomer was confirmed. Compound (29): 98.9%, isomer: 1.0%

Synthesis Example 5

Synthesis of Compound (33)

The compound (33) was synthesized in the same manner except that 2-methyl[1,1'-biphenyl]-4-boronic acid was used instead of 3-methylphenylboronic acid. The structure was identified by $^1$H NMR and MALDI-TOF-MS. Furthermore, the HNT type was suggested in X-ray crystal structure analysis.

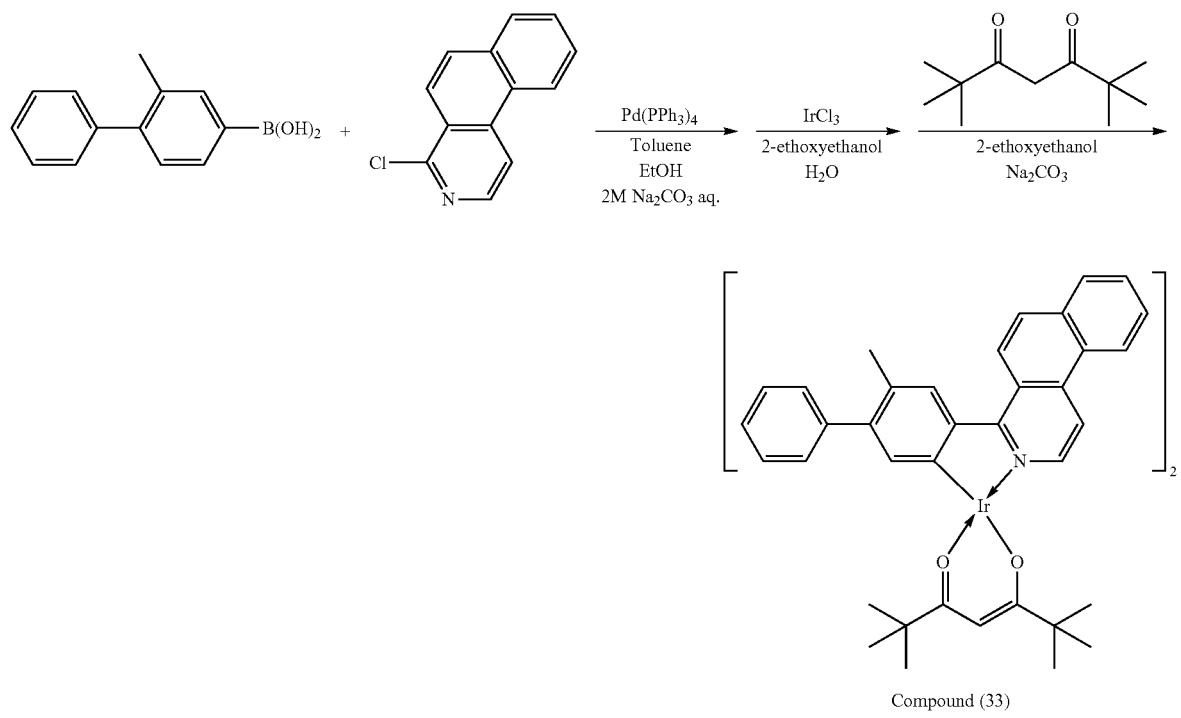

Compound (33)

The composition ratio of the composition containing the compound (33) obtained in Synthesis Example 5 was measured as in Synthesis Example 1, which found the following composition ratio. Since LC-MS confirmed that the two substances have the same molecular weight, that the contained substance is the isomer was confirmed. Compound (33): 98.8%, isomer: 1.1%

Synthesis Example 6

Synthesis of Compound (57)

The compound (57) was synthesized in the same manner except that 9,9-dimethylfluorene-3-boronic acid was used instead of 3-methylphenylboronic acid. The structure was identified by $^1$H NMR and MALDI-TOF-MS. Furthermore, the HNT type was suggested in X-ray crystal structure analysis.

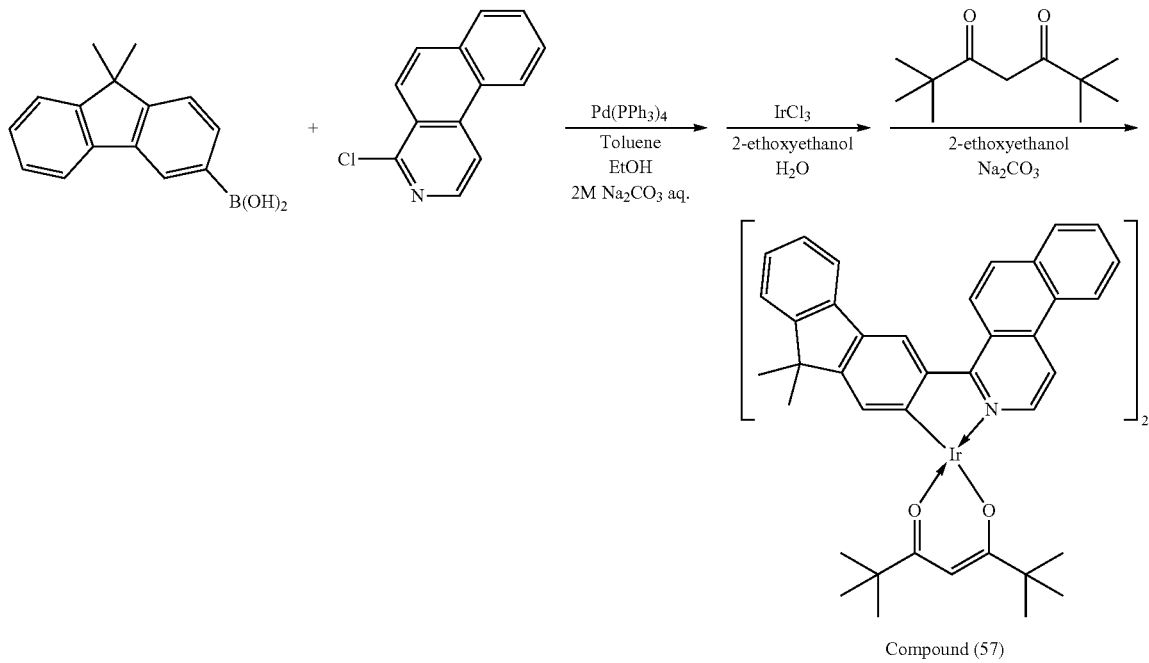

Compound (57)

The composition ratio of the composition containing the compound (57) obtained in Synthesis Example 5 was measured as in Synthesis Example 1, which found the following composition ratio. Since LC-MS confirmed that the two substances have the same molecular weight, that the contained substance is the isomer was confirmed. Compound (57): 98.6%, isomer: 1.2%

Purification Example 1

The composition obtained in Synthesis Example 1 was dissolved in chloroform, and the composition was isolated by GPC cleanup. A composition (hereinafter referred to as the compound $(16)_{GPC(A)}$) mainly composed of the compound (16) and a composition (hereinafter referred to as the compound $(16)_{GPC(B)}$) mainly composed of an isomer thereof were isolated. The composition ratios were respectively determined by the HPLC measurement described above, and were as follows.

Compound $(16)_{GPC(A)}$: compound (16): 99.3%, isomer: 0.6%

Compound $(16)_{GPC(B)}$: compound (16): 10.4%, isomer: 89.5%

GPC isolation conditions:
Column: JAIGEL-2H-40 40 mm×600 mm
Mobile phase: chloroform
Flow rate: 10.0 mL/min Purification Example 2

The composition obtained in Synthesis Example 1 was repeatedly recrystallized from chloroform/methanol to isolate compositions. A composition (hereinafter referred to as the compound $(16)_{crystallization(A)}$) mainly composed of the compound (16) and a composition (hereinafter referred to as the compound $(16)_{crystallization(B)}$) mainly composed of an isomer thereof were isolated. The composition ratios were respectively determined by the HPLC measurement described above, and were as follows.

Compound $(16)_{crystallization(A)}$: compound (16): 99.2%, isomer: 0.7%

Compound $(16)_{crystallization(B)}$: compound (16): 20.2%, isomer: 79.5%

Purification Example 3

Compositions were isolated as in Purification Example 1 except that the composition obtained in Synthesis Example 2 was used instead of the composition obtained in Synthesis Example 1. A fraction (hereinafter referred to as the compound $(19)_{GPC(A)}$) mainly composed of the compound (19) and a fraction (hereinafter referred to as the compound $(19)_{GPC(B)}$) mainly composed of an isomer thereof were isolated. The composition ratios were respectively determined by the HPLC measurement described above, and were as follows.

Compound $(19)_{GPC(A)}$: compound (19): 99.8%, isomer: 0.2%

Compound (19)$_{GPC(B)}$: compound (19): 24.4%, isomer: 75.5%

Purification Example 4

Compositions were isolated as in Purification Example 2 except that the composition obtained in Synthesis Example 3 was used instead of the composition obtained in Synthesis Example 1. A composition (hereinafter referred to as the compound (24)$_{crystallization(A)}$) mainly composed of the compound (24) and a composition (hereinafter referred to as the compound (24)$_{crystallization(B)}$) mainly composed of an isomer thereof were isolated. The composition ratios were respectively determined by the HPLC measurement described above, and were as follows.

Compound (24)$_{crystallization(A)}$: compound (24): 99.0%, isomer: 0.9%
Compound (24)$_{crystallization(B)}$: compound (24): 18.5%, isomer: 81.4%

Purification Example 5

Compositions were isolated as in Purification Example 2 except that the composition obtained in Synthesis Example 4 was used instead of the composition obtained in Synthesis Example 1. A composition (hereinafter referred to as the compound (29)$_{crystallization(A)}$) mainly composed of the compound (29) and a composition (hereinafter referred to as the compound) (29)$_{crystallization(B)}$) mainly composed of an isomer thereof were isolated. The composition ratios were respectively determined by the HPLC measurement described above, and were as follows.

Compound (29)$_{crystallization(A)}$: compound (29): 99.5%, isomer: 0.5%
Compound (29)$_{crystallization(B)}$: compound (29): 21.0%, isomer: 78.9%

Purification Example 6

Compositions were isolated as in Purification Example 2 except that the composition obtained in Synthesis Example 5 was used instead of the composition obtained in Synthesis Example 1. A composition (hereinafter referred to as the compound (33)$_{crystallization(A)}$) mainly composed of the compound (33) and a composition (hereinafter referred to as the compound (33)$_{crystallization(B)}$) mainly composed of an isomer thereof were isolated. The composition ratios were respectively determined by the HPLC measurement described above, and were as follows.

Compound (33)$_{crystallization(A)}$: compound (33): 99.1%, isomer: 0.9%
Compound (33)$_{crystallization(B)}$: compound (33): 35.3%, isomer: 64.5%

Purification Example 7

Compositions were isolated as in Purification Example 2 except that the composition obtained in Synthesis Example 3 was used instead of the composition obtained in Synthesis Example 1. A composition (hereinafter referred to as the compound (57)$_{crystallization(A)}$) mainly composed of the compound (57) and a composition (hereinafter referred to as the compound) (57)$_{crystallization(B)}$) mainly composed of an isomer thereof were isolated. The composition ratios were respectively determined by the HPLC measurement described above, and were as follows.

Compound (57)$_{crystallization(A)}$: compound (57): 99.1%, isomer: 0.8%
Compound (57)$_{crystallization(B)}$: compound (57): 12.9%, isomer: 87.0%

Example 1

The compound (16)$_{GPC(A)}$ and the compound (16)$_{GPC(B)}$ obtained in Purification Example 1 were mixed at a weight ratio of 98.8:1.2. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 98.4%, isomer: 1.5%

The sublimation product described above was used to form an organic light emitting device having a positive electrode/hole injection layer/hole transport layer/electron blocking layer/light emitting layer/hole blocking layer/electron transport layer/negative electrode structure on a substrate by sequentially forming these layers as follows.

A 100 nm-thick ITO film that served as a positive electrode was formed on a glass substrate by a sputtering method, and this glass substrate was used as a transparent conductive supporting substrate (ITO substrate). The following organic compound layers and electrode layers were continuously formed on this ITO substrate in a $1\times10^{-5}$ Pa vacuum chamber by resistive heating vacuum vapor deposition. Here, the area of the electrodes opposing each other was arranged to be 3 mm$^2$.

Hole injection layer (10 nm): HT16
Hole transport layer (30 nm): HT3
Electron blocking (EB) layer (10 nm): HT7
Light emitting layer (30 nm) host material: EM33, assist material: GD10, guest material:
composition (4 wt %)
Hole blocking (HB) layer (45 nm): ET12
Electron transport layer (20 nm): ET7
Metal electrode layer 1 (0.5 nm): LiF
Metal electrode layer 2 (100 nm): Al Next, the organic light emitting device was covered with a protective glass plate in a dry air atmosphere and sealed with an acrylic resin adhesive so that the organic light emitting device was prevented from deterioration caused by moisture adsorption.

For the obtained organic light emitting device, the external light emission quantum yield was measured by using the ITO electrode serving as the positive electrode and the Al electrode serving as the negative, and was 24.3%. The HNT compound content, the isomer content, and the external quantum efficiency of Examples and Comparative Examples are indicated in Table.

Example 2

The compound (16)$_{crystallization(A)}$ and the compound (16)$_{crystallization(B)}$ obtained in Purification Example 2 were mixed at a weight ratio of 98.2:1.8. The resulting mixture was subjected to sublimation purification at 360° C. and $3\times10^{-3}$ Pa, and the sublimation product was recovered. The composition ratio of the obtained sublimation product was determined by the HPLC measurement described above, and was found to be 98.0% of the compound (16) and 1.9% of the isomer.

An organic light emitting device was prepared as in Example 1 except that the sublimation product obtained in this example was used instead of the sublimation product used in Example 1.

For the obtained organic light emitting device, the external light emission quantum yield was measured by using the ITO electrode serving as the positive electrode and the Al electrode serving as the negative, and was 24.8%.

Example 3

The compound $(16)_{GPD(A)}$ and the compound $(16)_{GPC(B)}$ obtained in Purification Example 1 were mixed at a weight ratio of 98.0:2.0. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 97.9%, isomer: 2.0%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 25.7%.

Example 4

The compound $(16)_{crystallization(A)}$ and the compound $(16)_{crystallization(B)}$ obtained in Purification Example 2 were mixed at a weight ratio of 97.2:2.8. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 97.0%, isomer: 2.9%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 26.3%.

Example 5

The compound $(16)_{crystallization(A)}$ and the compound $(16)_{crystallization(B)}$ obtained in Purification Example 2 were mixed at a weight ratio of 94.8:5.2. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 95.3%, isomer: 4.6%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 26.7%.

Example 6

The compound $(16)_{crystallization(A)}$ and the compound $(16)_{crystallization(B)}$ obtained in Purification Example 2 were mixed at a weight ratio of 57.5:42.5. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 66.0%, isomer: 33.8%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 26.6%.

Example 7

The compound $(16)_{GPC(A)}$ and the compound $(16)_{GPC(B)}$ obtained in Purification Example 1 were mixed at a weight ratio of 32.0:68.0. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 34.9%, isomer: 65.0%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 27.0%.

Example 8

The compound $(16)_{GPC(B)}$ obtained in Synthesis Example 1 was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 10.6%, isomer: 89.3%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 27.3%.

Example 9

The compound $(19)_{GPC(A)}$ and the compound $(19)_{GPC(B)}$ obtained in Purification Example 3 were mixed at a weight ratio of 95.1:4.9. The resulting mixture was subjected to sublimation purification at 380° C. and $3\times10^{-3}$ Pa, and the sublimation product was recovered. The composition ratio of the obtained sublimation product was determined by the HPLC measurement described above, and was as follows.

Compound (19): 96.5%, isomer: 3.5%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 26.0%.

Example 10

The compound $(19)_{GPC(A)}$ and the compound $(19)_{GPC(B)}$ obtained in Purification Example 3 were mixed at a weight ratio of 50.0:50.0. The resulting mixture was subjected to sublimation purification at 380° C. and $3\times10^{-3}$ Pa, and the sublimation product was recovered. The composition ratio of the obtained sublimation product was determined by the HPLC measurement described above, and was as follows.

Compound (19): 66.3%, isomer: 33.7%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 24.4%.

Example 11

The compound $(24)_{crystallization(A)}$ and the compound $(24)_{crystallization(B)}$ obtained in Purification Example 4 were mixed at a weight ratio of 98.1:1.9. The resulting mixture was subjected to sublimation purification at 370° C. and $3\times10^{-3}$ Pa, and the sublimation product was recovered. The composition ratio of the obtained sublimation product was determined by the HPLC measurement described above, and was as follows.

Compound (24): 98.1%, isomer: 1.9%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 24.4%.

Example 12

The compound $(29)_{crystallization(A)}$ and the compound $(29)_{crystallization(B)}$ obtained in Purification Example 5 were mixed at a weight ratio of 98.2:1.8. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (29): 98.4%, isomer: 1.9%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 23.9%.

Example 13

The compound $(33)_{crystallization(A)}$ and the compound (33) obtained in Purification Example 6 were mixed at a weight ratio of 94.9:5.1. The resulting mixture was subjected to sublimation purification at 380° C. and $3\times10^{-3}$ Pa, and the sublimation product was recovered. The composition ratio of the obtained sublimation product was determined by the HPLC measurement described above, and was as follows.

Compound (33): 96.8%, isomer: 3.1%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 25.0%.

Example 14

The compound $(57)_{crystallization(A)}$ and the compound $(57)_{crystallization(B)}$ obtained in Purification Example 7 were mixed at a weight ratio of 95.0:5.0. The resulting mixture was subjected to sublimation purification at 380° C. and $3\times10^{-3}$ Pa, and the sublimation product was recovered. The composition ratio of the obtained sublimation product was determined by the HPLC measurement described above, and was as follows.

Compound (57): 97.1%, isomer: 2.9%

An organic light emitting device was prepared as in Example 1 except that the sublimation product obtained in this example was used instead of the sublimation product obtained in Example 1.

For the obtained organic light emitting device, the external light emission quantum yield was measured by using the ITO electrode serving as the positive electrode and the Al electrode serving as the negative, and was 26.0%.

Comparative Example 1

The compound (16) obtained in Synthesis Example 1 was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 98.9%, isomer: 1.1%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 24.0%.

Comparative Example 2

The compound $(16)_{GPC(A)}$ and the compound $(16)_{GPC(B)}$ obtained in Purification Example 1 were mixed at a weight ratio of 99.0:1.0. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 98.8%, isomer: 1.2%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 23.9%.

Comparative Example 3

The compound $(16)_{crystallization(A)}$ and the compound $(16)_{crystallization(B)}$ obtained in Purification Example 2 were mixed at a weight ratio of 98.7:1.3. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (16): 98.6%, isomer: 1.3%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 23.8%.

Comparative Example 4

The compound $(19)_{GPC(A)}$ obtained in Purification Example 3 was subjected to sublimation purification at 380° C. and $3\times10^{-3}$ Pa, and the sublimation product was recovered. The composition ratio of the obtained sublimation product was determined by the HPLC measurement described above, and was as follows.

Compound (19): 99.8%, isomer: 0.1%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 23.1%.

Comparative Example 5

The compound $(19)_{GPC(A)}$ and the compound $(19)_{GPC(B)}$ obtained in Purification Example 3 were mixed at a weight ratio of 98.0:2.0. The resulting mixture was subjected to sublimation purification at 380° C. and $3\times10^{-3}$ Pa, and the sublimation product was recovered. The composition ratio of the obtained sublimation product was determined by the HPLC measurement described above, and was as follows.

Compound (19): 98.5%, isomer: 1.1%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 22.5%.

Comparative Example 6

The compound $(24)_{crystallization(A)}$ obtained in Purification Example 4 was subjected to sublimation purification at 370° C. and $3\times10^{-3}$ Pa, and the sublimation product was recovered. The composition ratio of the obtained sublimation product was determined by the HPLC measurement described above, and was as follows.

Compound (19): 99.8%, isomer: 0.1%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 23.6%.

Comparative Example 7

The compound (24) obtained in Synthesis Example 3 was subjected to sublimation purification at 370° C. and $3\times10^{-3}$ Pa, and the sublimation product was recovered. The composition ratio of the obtained sublimation product was determined by the HPLC measurement described above, and was as follows.

Compound (24): 98.9%, isomer: 1.1%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 23.2%.

Comparative Example 8

The compound $(29)_{crystallization(A)}$ obtained in Purification Example 5 was subjected to sublimation purification at 360° C. and $3\times10^{-3}$ Pa, and the sublimation product was recovered. The composition ratio of the obtained sublimation product was determined by the HPLC measurement described above, and was as follows.

Compound (29): 99.5%, isomer: 0.5%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 22.5%.

Comparative Example 9

The compound $(29)_{crystallization(A)}$ and the compound $(29)_{crystallization(B)}$ obtained in Purification Example 5 were mixed at a weight ratio of 99.0:1.0. The resulting mixture was subjected to sublimation purification at 360° C. and $3\times10^{-3}$ Pa, and the sublimation product was recovered. The composition ratio of the obtained sublimation product was determined by the HPLC measurement described above, and was as follows.

Compound (29): 98.8%, isomer: 1.2%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 21.9%.

Comparative Example 10

The compound $(33)_{crystallization(A)}$ obtained in Purification Example 6 was subjected to sublimation purification at 380° C. and 3×10⁻³ Pa, and the sublimation product was recovered. The composition ratio of the obtained sublimation product was determined by the HPLC measurement described above, and was as follows.

Compound (33): 99.6%, isomer: 0.3%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 24.1%.

Comparative Example 11

The compound $(33)_{crystallization(A)}$ and the compound (33) obtained in Purification Example 6 were mixed at a weight ratio of 99.0:1.0. The resulting mixture was subjected to sublimation purification at 380° C. and 3×10⁻³ Pa, and the sublimation product was recovered. The composition ratio of the obtained sublimation product was determined by the HPLC measurement described above, and was as follows.

Compound (33): 99.0%, isomer: 1.0%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 23.0%.

Comparative Example 12

The compound $(57)_{crystallization(A)}$ obtained in Purification Example 7 was subjected to sublimation purification at 380° C. and 3×10⁻³ Pa, and the sublimation product was recovered. The composition ratio of the obtained sublimation product was determined by the HPLC measurement described above, and was as follows.

Compound (57): 99.2%, isomer: 0.8%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 24.4%.

Comparative Example 13

The compound $(57)_{crystallization(A)}$ and the compound $(57)_{crystallization(B)}$ obtained in Purification Example 7 were mixed at a weight ratio of 99.0:1.0. The resulting mixture was subjected to sublimation purification at 380° C. and 3×10⁻³ Pa, and the sublimation product was recovered. The composition ratio of the obtained sublimation product was determined by the HPLC measurement described above, and was as follows.

Compound (57): 98.6%, isomer: 1.3%

An organic light emitting device was prepared as in Example 1 except that the sublimation product obtained in this comparative example was used instead of the sublimation product obtained in Example 1.

For the obtained organic light emitting device, the external light emission quantum yield was measured by using the ITO electrode serving as the positive electrode and the Al electrode serving as the negative, and was 23.6%.

The results of Examples 1 to 14 and Comparative Examples 1 to 13 are summarized in Table.

TABLE

| Example/ Comparative Example | Sample before sublimation | | | | Sample after sublimation | | Organic light emitting device |
|---|---|---|---|---|---|---|---|
| | Name | Mixing ratio (wt %) | Name | Mixing ratio (wt %) | Content (%) HNT | Isomer | EQE (%) |
| Example 1 | Compound (16) GPC(A) | 98.8 | Compound (16) GPC(B) | 1.2 | 98.4 | 1.5 | 24.3 |
| Example 2 | Compound (16) crystallization (A) | 98.2 | Compound (16) crystallization (B) | 1.8 | 98.0 | 1.9 | 24.8 |
| Example 3 | Compound (16) GPC(A) | 98.0 | Compound (16) GPC(B) | 2.0 | 97.9 | 2.0 | 25.7 |
| Example 4 | Compound (16) crystallization (A) | 97.2 | Compound (16) crystallization (B) | 2.8 | 97.0 | 2.9 | 26.3 |
| Example 5 | Compound (16) crystallization (A) | 94.8 | Compound (16) crystallization (B) | 5.2 | 95.3 | 4.6 | 26.7 |
| Example 6 | Compound (16) crystallization (A) | 57.5 | Compound (16) crystallization (B) | 42.5 | 66.0 | 33.8 | 26.6 |
| Example 7 | Compound (16) GPC(A) | 32.0 | Compound (16) GPC(B) | 68.0 | 34.9 | 65.0 | 27.0 |
| Example 8 | — | 0.0 | Compound (16) GPC(B) | 100.0 | 10.6 | 89.3 | 27.3 |
| Example 9 | Compound (19) GPC(A) | 95.1 | Compound (19) GPC(B) | 4.9 | 96.5 | 3.5 | 26.0 |
| Example 10 | Compound (19) GPC(A) | 50.0 | Compound (19) GPC(B) | 50.0 | 66.3 | 33.7 | 24.4 |
| Example 11 | Compound (24) crystallization (A) | 98.1 | Compound (24) crystallization (B) | 1.9 | 98.1 | 1.9 | 24.4 |
| Example 12 | Compound (29) crystallization (A) | 98.2 | Compound (29) crystallization (B) | 1.8 | 98.4 | 1.6 | 23.9 |
| Example 13 | Compound (33) crystallization (A) | 94.9 | Compound (33) crystallization (B) | 5.1 | 96.8 | 3.1 | 25.0 |
| Example 14 | Compound (57) crystallization (A) | 95.0 | Compound (57) crystallization (B) | 5.0 | 97.1 | 2.9 | 26.0 |

TABLE-continued

| Example/Comparative Example | Sample before sublimation | | | | Sample after sublimation | | Organic light emitting device |
| --- | --- | --- | --- | --- | --- | --- | --- |
| | | Mixing ratio | | Mixing ratio | Content (%) | | EQE (%) |
| | Name | (wt %) | Name | (wt %) | HNT | Isomer | |
| Comparative Example 1 | Compound (16) | 100.0 | — | 0.0 | 98.9 | 1.1 | 24.0 |
| Comparative Example 2 | Compound (16) GPC(A) | 99.0 | Compound (16) GPC(B) | 1.0 | 98.8 | 1.2 | 23.9 |
| Comparative Example 3 | Compound (16) crystallization (A) | 98.7 | Compound (16) crystallization (B) | 1.3 | 98.6 | 1.3 | 23.8 |
| Comparative Example 4 | Compound (19) GPC(A) | 100.0 | — | 0.0 | 99.8 | 0.1 | 23.1 |
| Comparative Example 5 | Compound (19) GPC(A) | 98.0 | Compound (19) GPC(B) | 2.0 | 98.5 | 1.4 | 22.5 |
| Comparative Example 6 | Compound (24) crystallization (A) | 100.0 | — | 0.0 | 99.2 | 0.8 | 23.6 |
| Comparative Example 7 | Compound (24) | 100.0 | — | 0.0 | 98.9 | 1.1 | 23.2 |
| Comparative Example 8 | Compound (29) crystallization (A) | 100.0 | — | 0.0 | 99.5 | 0.5 | 22.5 |
| Comparative Example 9 | Compound (29) crystallization (A) | 99.0 | Compound (29) crystallization (B) | 1.0 | 98.8 | 1.2 | 21.9 |
| Comparative Example 10 | Compound (33) crystallization (A) | 100.0 | — | 0.0 | 99.6 | 0.3 | 24.1 |
| Comparative Example 11 | Compound (33) crystallization (A) | 99.0 | Compound (33) crystallization (B) | 1.0 | 99.0 | 1.0 | 23.0 |
| Comparative Example 12 | Compound (57) crystallization (A) | 100.0 | — | 0.0 | 99.2 | 0.8 | 24.4 |
| Comparative Example 13 | Compound (57) crystallization (A) | 99.0 | Compound (57) crystallization (B) | 1.0 | 98.6 | 1.3 | 23.6 |

As described above, the composition according to one embodiment of the present disclosure exhibits high light emission efficiency when used in an organic light emitting device.

The present disclosure can provide a composition having a high light emission efficiency and containing an iridium complex and an isomer thereof.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-085564, filed May 15, 2020 which is hereby incorporated by reference herein in its entirety.

What is claimed is:

1. A composition comprising:
   a homo-N-trans (HNT) iridium complex having an iridium atom, and a first ligand, a second ligand, and a third ligand that are bonded to the iridium atom, the second ligand having the same structure as the first ligand, the third ligand having a different structure from the first and second ligands; and
   an isomer of the iridium complex, the isomer having an iridium atom, a fourth ligand, a fifth ligand, and the third ligand,
   the fourth ligand being a ligand represented by the same condensed formula as that of the first ligand, and
   the fifth ligand being a ligand represented by the same condensed formula as that of the second ligand,
   wherein a composition ratio of the isomer relative to a total of the iridium complex and the isomer is 1.5% or more, and
   wherein the iridium complex is an iridium complex represented by formula [1] or [2] below:

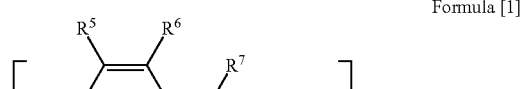

Formula [1]

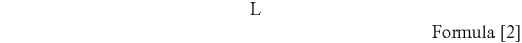

Formula [2]

where, in formula [1] and formula [2], L represents a bidentate ligand, $R^1$ to $R^{18}$ are each independently selected from a hydrogen atom, a halogen atom, a substituted or unsubstituted alkyl group, a substituted or unsubstituted alkoxy group, a cyano group, a substituted or unsubstituted aromatic hydrocarbon group, and a substituted or unsubstituted heteroaromatic group;

ring A represents a ring structure that may have a substituent and that is selected from a benzene ring, a naphthalene ring, a fluorene ring, a phenanthrene ring, a 9,9-spirobifluorene ring, a chrysene ring, and a substituted or unsubstituted heteroaromatic group; and IrL is represented by one of formulae [3] to [5] below:

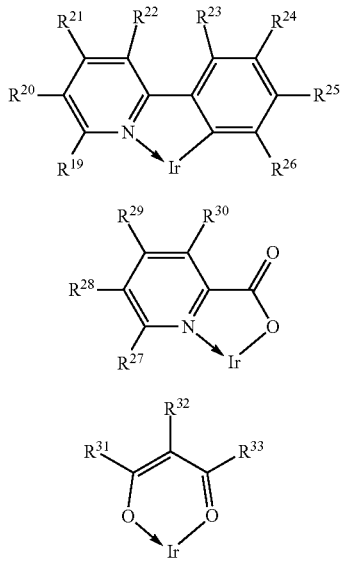

Formula [3]

Formula [4]

Formula [5]

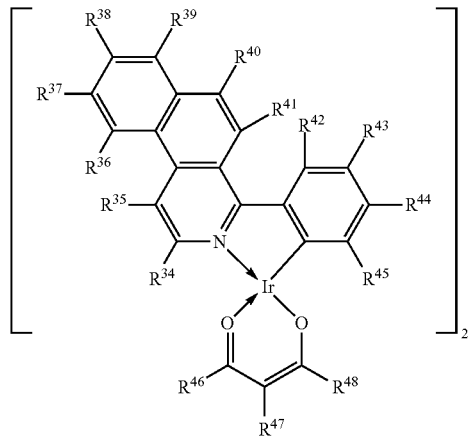

Formula [6]

where, in formulae [3] to [5], $R^{19}$ to $R^{33}$ are each independently selected from a hydrogen atom, a substituted or unsubstituted alkyl group, a substituted or unsubstituted aromatic hydrocarbon group, and a substituted or unsubstituted heteroaromatic group.

2. The composition according to claim 1, wherein the composition ratio of the isomer is 2.0% or more.

3. The composition according to claim 1, wherein the isomer is a structural isomer of the iridium complex and satisfies at least one of (1) and (2) below:
(1) the first ligand has a structure different from the fourth ligand, and
(2) the second ligand has a structure different from the fifth ligand.

4. The composition according to claim 3, wherein each of the first and second ligands has a structure having a substituent, and the fourth or fifth ligand has a structure having a substituent at a different substitution position from that in the first or second ligand.

5. The composition according to claim 3, wherein (1) and (2) are both satisfied.

6. The composition according to claim 1, wherein the isomer is a stereoisomer of the iridium complex and satisfies at least one of (3) and (4) below:
(3) the first ligand and the fourth ligand have different steric configurations with respect to the iridium atom, and
(4) the second ligand and the fifth ligand have different steric configurations with respect to the iridium atom.

7. The composition according to claim 6, wherein (3) and (4) are both satisfied.

8. The composition according to claim 1, wherein the iridium complex is represented by formula [6] below:

where, in formula [6], $R^{34}$ to $R^{48}$ are each independently selected from a hydrogen atom and a substituted or unsubstituted alkyl group.

9. The composition according to claim 8, wherein, in the iridium complex represented by formula [6], $R^{45}$ represents a hydrogen atom and $R^{43}$ represents an alkyl group, and
in the isomer of the iridium complex represented by formula [6], $R^{45}$ represents an alkyl group and $R^{43}$ represents a hydrogen atom.

10. The composition according to claim 8, wherein, in formula [6], $R^{37}$ represents a cyano group.

11. An organic light emitting device comprising:
a first electrode;
a second electrode; and
an organic compound layer disposed between the first electrode and the second electrode,
wherein the organic compound layer includes the composition according to claim 1.

12. The organic light emitting device according to claim 11, wherein the organic compound layer is a light emitting layer, and the light emitting layer further includes a first organic compound, and
the first organic compound is a compound having a lowest excited triplet energy larger than that of the iridium complex contained in the composition.

13. The organic light emitting device according to claim 12, wherein the light emitting layer further includes a second organic compound, and
the second organic compound has a lowest excited triplet energy larger than or equal to the lowest excited triplet energy of the iridium complex contained in the composition but smaller than or equal to the lowest excited triplet energy of the first organic compound.

14. The organic light emitting device according to claim 12, wherein the organic compound layer includes a first charge transport layer disposed between the first electrode and the light emitting layer and a second charge transport layer disposed between the second electrode and the light emitting layer, and
the first electrode is in contact with the first charge transport layer, and the second electrode is in contact with the second charge transport layer.

15. A display apparatus comprising:
a plurality of pixels, at least one of which is the organic light emitting device according to claim 11; and
a transistor connected to the organic light emitting device.

16. The display apparatus according to claim 15, further comprising:
a color filter on a light emitting side of the organic light emitting device.

17. An imaging apparatus comprising:
an optical section that includes a plurality of lenses;
an imaging device that receives light that has passed through the optical section; and
a display section that displays an image captured by the imaging device,
wherein the display section includes the organic light emitting device according to claim 11.

18. Electronic equipment comprising:
a display section that includes the organic light emitting device according to claim 11;
a casing in which the display section is disposed; and
a communication section that is disposed in the casing and communicates with external.

19. A lighting apparatus comprising:
a light source that includes the organic light emitting device according to claim 11; and
a light diffusing section or optical film that transmits light emitted from the light source.

20. A moving body comprising:
a lamp fixture that includes the organic light emitting device according to claim 11; and
a body on which the lamp fixture is disposed,
the moving body being a ship, an aircraft, a drone.

* * * * *